United States Patent
Nishimura

(10) Patent No.: US 10,930,574 B2
(45) Date of Patent: Feb. 23, 2021

(54) SEMICONDUCTOR DEVICE AND METHOD FOR MANUFACTURING THE SAME

(71) Applicant: Rohm Co., Ltd., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/394,505

(22) Filed: Apr. 25, 2019

(65) Prior Publication Data

US 2019/0341323 A1 Nov. 7, 2019

(30) Foreign Application Priority Data

May 1, 2018 (JP) .............................. JP2018-088111
Mar. 1, 2019 (JP) .............................. JP2019-037390

(51) Int. Cl.
| | |
|---|---|
| *H01L 23/31* | (2006.01) |
| *H01L 23/367* | (2006.01) |
| *H01L 23/495* | (2006.01) |
| *H01L 21/56* | (2006.01) |

(52) U.S. Cl.
CPC ........ *H01L 23/3142* (2013.01); *H01L 21/563* (2013.01); *H01L 23/367* (2013.01); *H01L 23/49541* (2013.01)

(58) Field of Classification Search
CPC . H01L 23/3142; H01L 21/563; H01L 23/367; H01L 23/49541
See application file for complete search history.

(56) References Cited

U.S. PATENT DOCUMENTS

| | | | |
|---|---|---|---|
| 8,749,046 B2* | 6/2014 | Kodani | H01L 23/49811 257/690 |
| 2014/0264792 A1* | 9/2014 | Yang | H01L 21/4825 257/666 |
| 2016/0066423 A1* | 3/2016 | Sakamoto | H01L 23/49822 174/261 |
| 2016/0126206 A1* | 5/2016 | Viswanathan | H01L 23/3735 257/76 |
| 2016/0163622 A1* | 6/2016 | Liang | H01L 21/4828 257/676 |
| 2016/0225687 A1* | 8/2016 | Kim | H01L 23/3107 |

(Continued)

FOREIGN PATENT DOCUMENTS

JP 2001-257304 A 9/2001

*Primary Examiner* — Nathan W Ha
(74) *Attorney, Agent, or Firm* — Hamre, Schumann, Mueller & Larson, P.C.

(57) ABSTRACT

A semiconductor device includes a semiconductor element, a first substrate, a first electrode, a second electrode and a sealing resin. The first substrate has a first front surface and a first back surface that are spaced apart from each other in a thickness direction. The semiconductor element is mounted on the first main surface. The first electrode includes a first conductive portion and a second conductive portion. The first conductive portion is formed on a portion of the first front surface. The second conductive portion is connected to the first conductive portion and overlaps with the first substrate as viewed in a first direction perpendicular to the thickness direction. The sealing resin covers the semiconductor element. The second electrode is exposed from the sealing resin and electrically connected to the first electrode. The second electrode is in contact with the second conductive portion.

27 Claims, 56 Drawing Sheets

(56) References Cited

U.S. PATENT DOCUMENTS

2016/0315067 A1* 10/2016 Chou ................... H01L 23/3142
2018/0174954 A1*  6/2018 Lu ....................... H01L 21/4857
2018/0174994 A1*  6/2018 Choi ...................... H01L 24/20
2018/0237934 A1*  8/2018 Furutani .............. H05K 3/4617

* cited by examiner

FIG.1
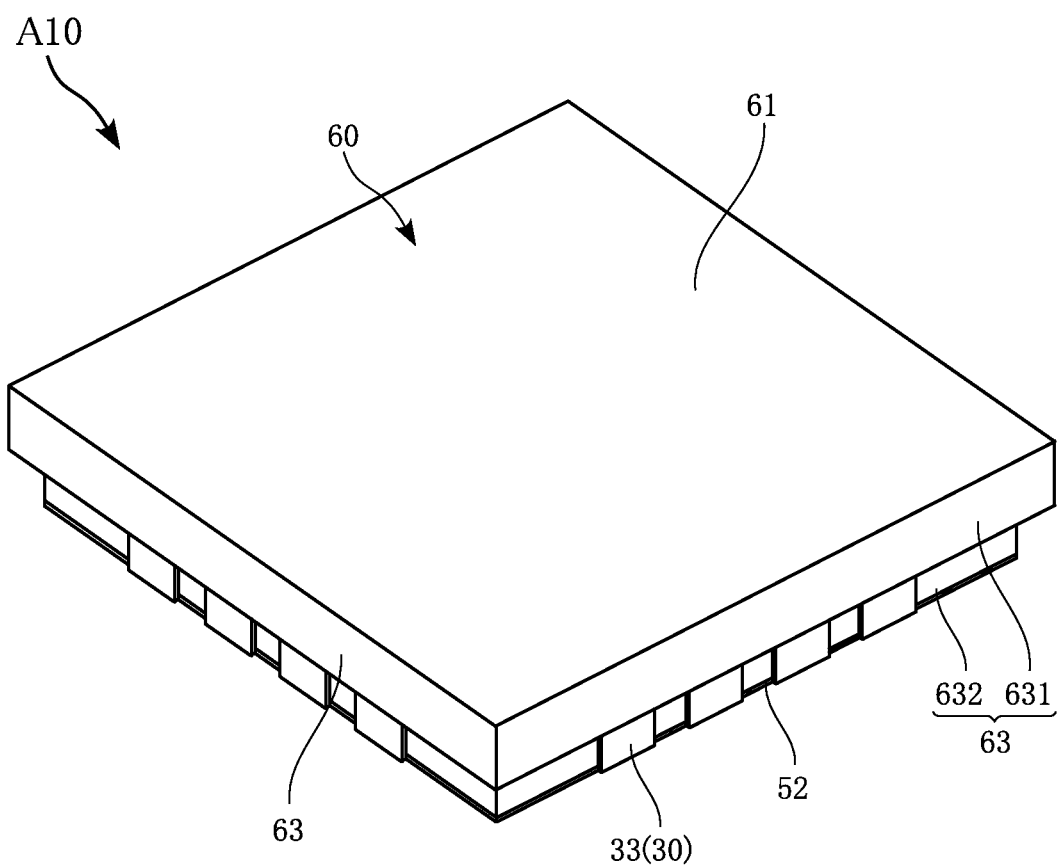
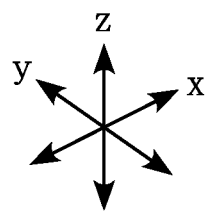

A10  FIG.2

FIG.5
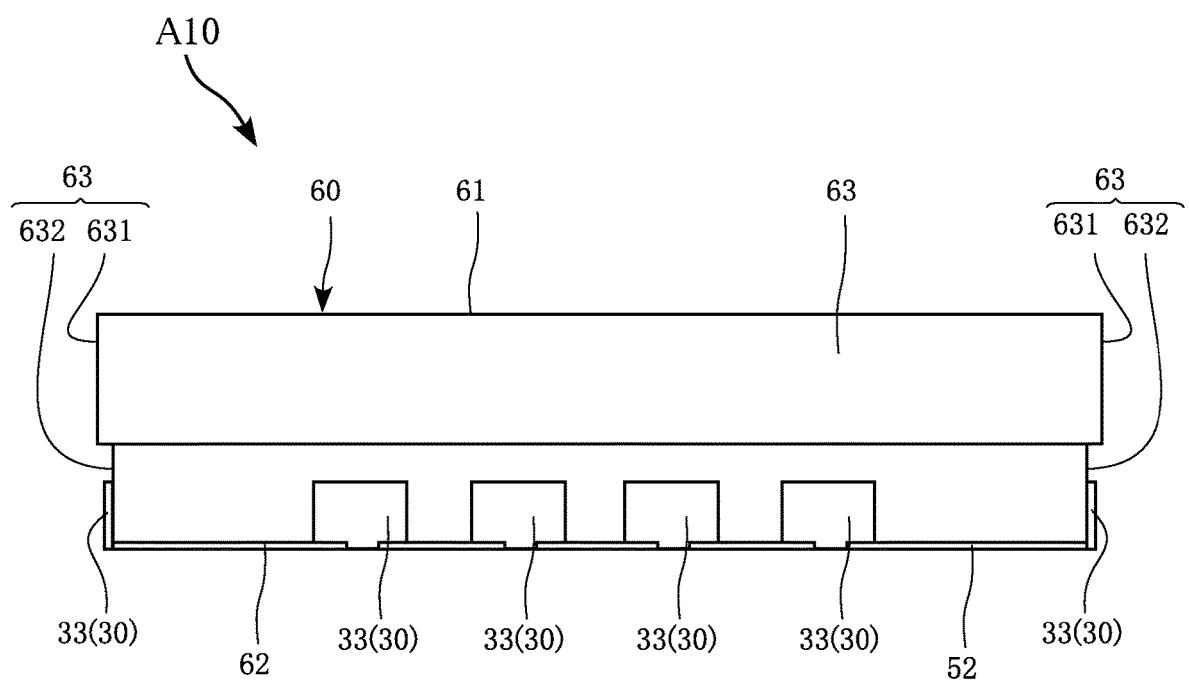
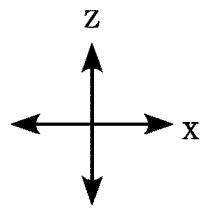

FIG.6
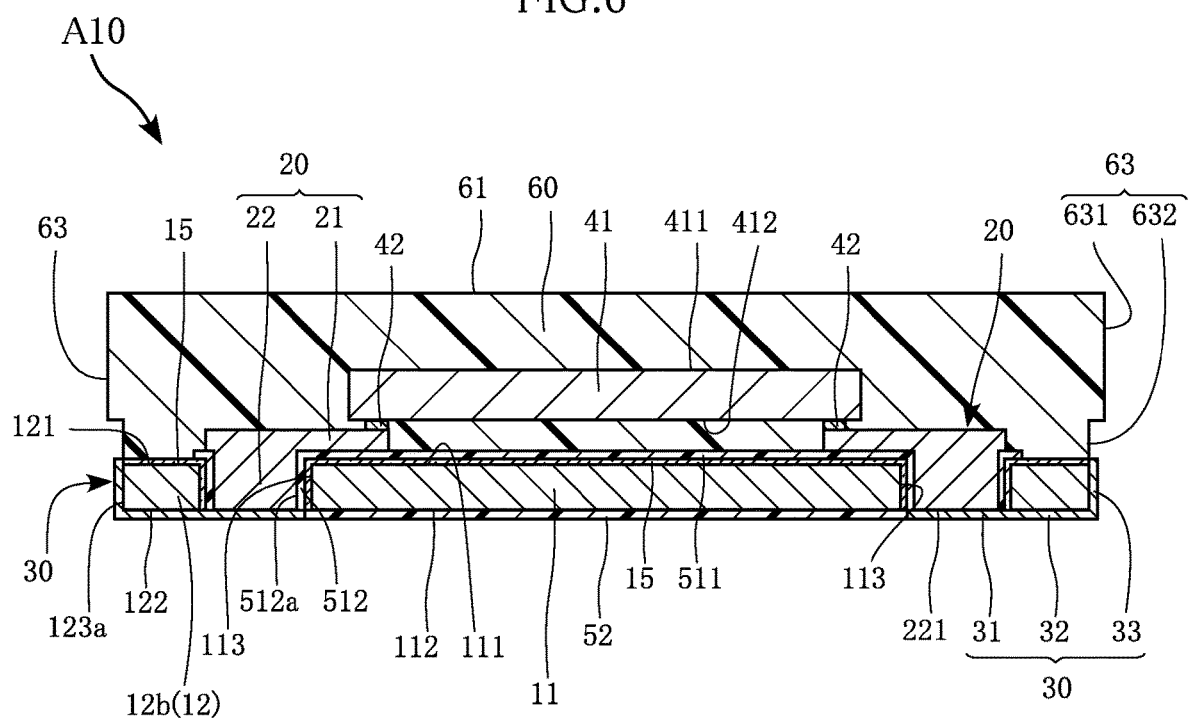
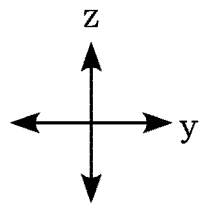

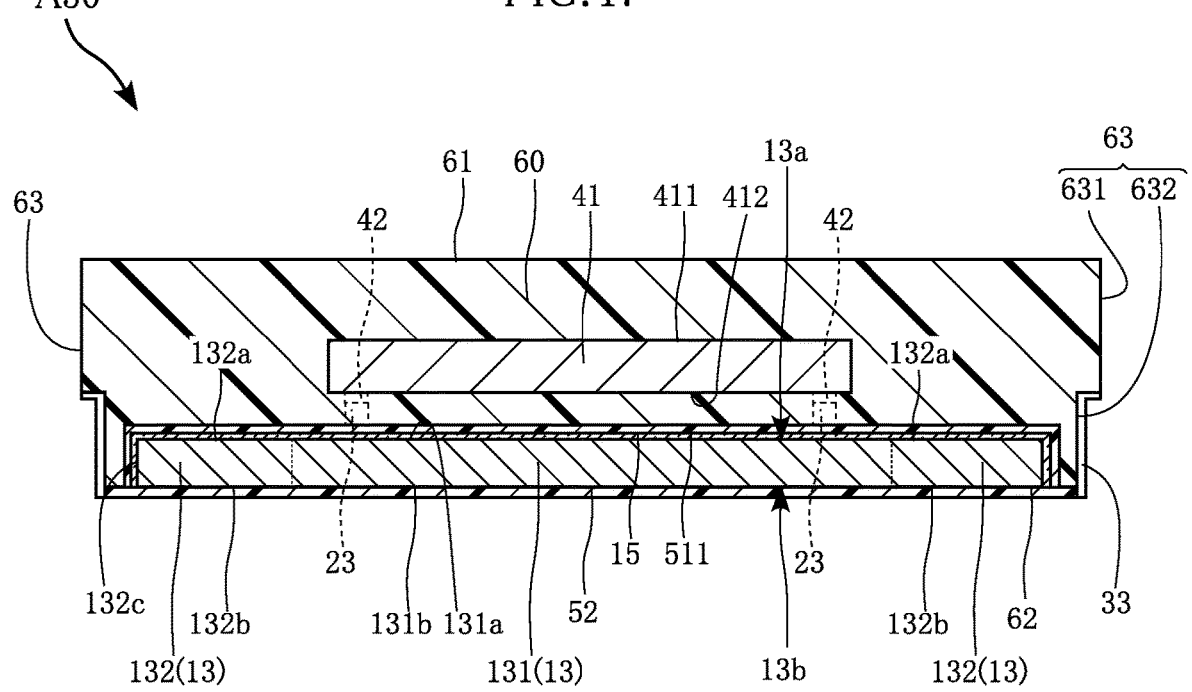
FIG.47
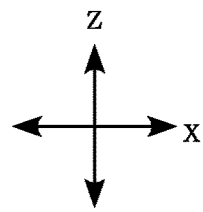

FIG.51
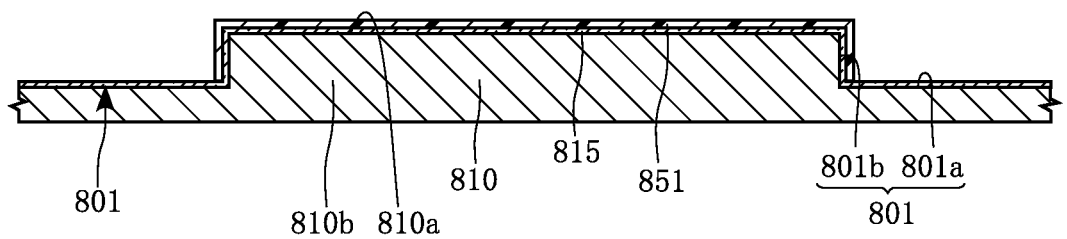
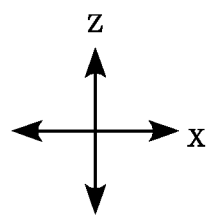
FIG.52
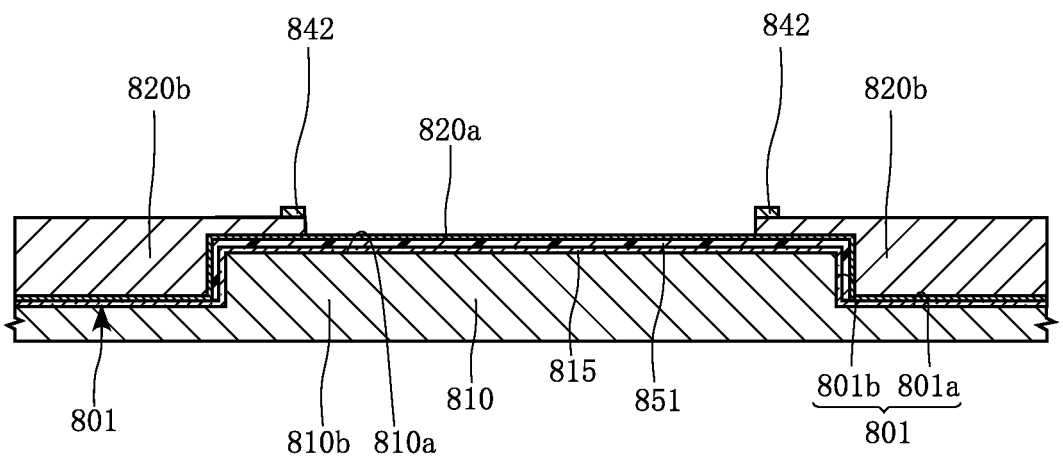
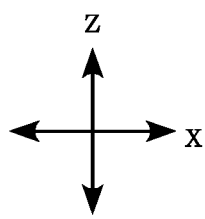

SEMICONDUCTOR DEVICE AND METHOD FOR MANUFACTURING THE SAME

FIELD

The present disclosure relates to semiconductor devices and methods for manufacturing the same.

BACKGROUND

In recent years, semiconductor devices in leadless packages, such as SON (Small Outline Non-leaded) and QFN (Quad Flat Non-leaded) packages, have been known. A semiconductor device in a leadless package has no terminals protruding from the sealing resin. Leadless packages are therefore advantageous for reducing the size of semiconductor devices. One example of a leadless package semiconductor device is disclosed, for example, in JP-A-2001-257304.

The conventional semiconductor device disclosed in the publication includes a semiconductor element, a lead frame and a sealing resin. The lead frame includes a die pad portion and a plurality of leads. The die pad portion supports the semiconductor element. The leads are electrically connected to the semiconductor element by wires. The sealing resin covers the semiconductor element and the wires.

With the conventional semiconductor device described above, it has been difficult to reduce the thickness of the sealing resin because portions of the wires are located on the semiconductor element. In addition, the lead frame is formed by processing, for example, a metal plate. To avoid warping of the metal plate, how thin the lead frame can be is limited. In view of the above circumstances, there is room for improving conventional semiconductor devices to reduce the device thickness.

SUMMARY

The present disclosure has been proposed in view of the issues noted above. The present disclosure aims to provide semiconductor devices configured to be thinner and methods for manufacturing such semiconductor devices.

A first aspect of the present disclosure provides a semiconductor device that includes: a semiconductor element; a first substrate having a first front surface and a first back surface that are spaced apart from each other in a thickness direction, where the semiconductor element is disposed on the first front surface; a first electrode that includes a first conductive portion and a second conductive portion, where the first conductive portion is formed on a portion of the first front surface, and the second conductive portion is connected to the first conductive portion and overlaps with the first substrate as viewed in a first direction perpendicular to the thickness direction; a sealing resin covering the semiconductor element; and a second electrode exposed from the sealing resin and electrically connected to the first electrode. The second electrode is in contact with the second conductive portion.

A second aspect of the present disclosure provides a method for manufacturing a semiconductor device. The method includes: a base preparing step of preparing a base having a front surface and a back surface that are spaced apart from each other in a thickness direction; a recessed portion forming step of forming in the base a recessed portion that is recessed from the front surface toward the back surface; a first electrode forming step of forming a first electrode provided with a first conductive portion that covers a portion of the front surface and a second conductive portion contained in the recessed portion; a semiconductor element mounting step of mounting a semiconductor element that electrically connects to the first electrode; a sealing resin forming step of forming a sealing resin to cover the semiconductor element; a grinding step of grinding the base from the back surface toward the front surface in the thickness direction to expose the second conductive portion; and a second electrode forming step of forming a second electrode in contact with the exposed second conductive portion.

DRAWINGS

FIG. 1 is a perspective view of a semiconductor device according to a first embodiment.

FIG. 5 is a side view of the semiconductor device according to the first embodiment.

FIG. 6 is a sectional view taken along line VI-VI of FIG. 3.

FIG. 47 is a sectional view taken along line XLVII-XLVII of FIG. 42.

FIG. 51 is a sectional view showing a manufacturing step of the semiconductor device shown in FIG. 42.

FIG. 52 is a sectional view showing a manufacturing step of the semiconductor device shown in FIG. 42.

EMBODIMENTS

Figure 2:
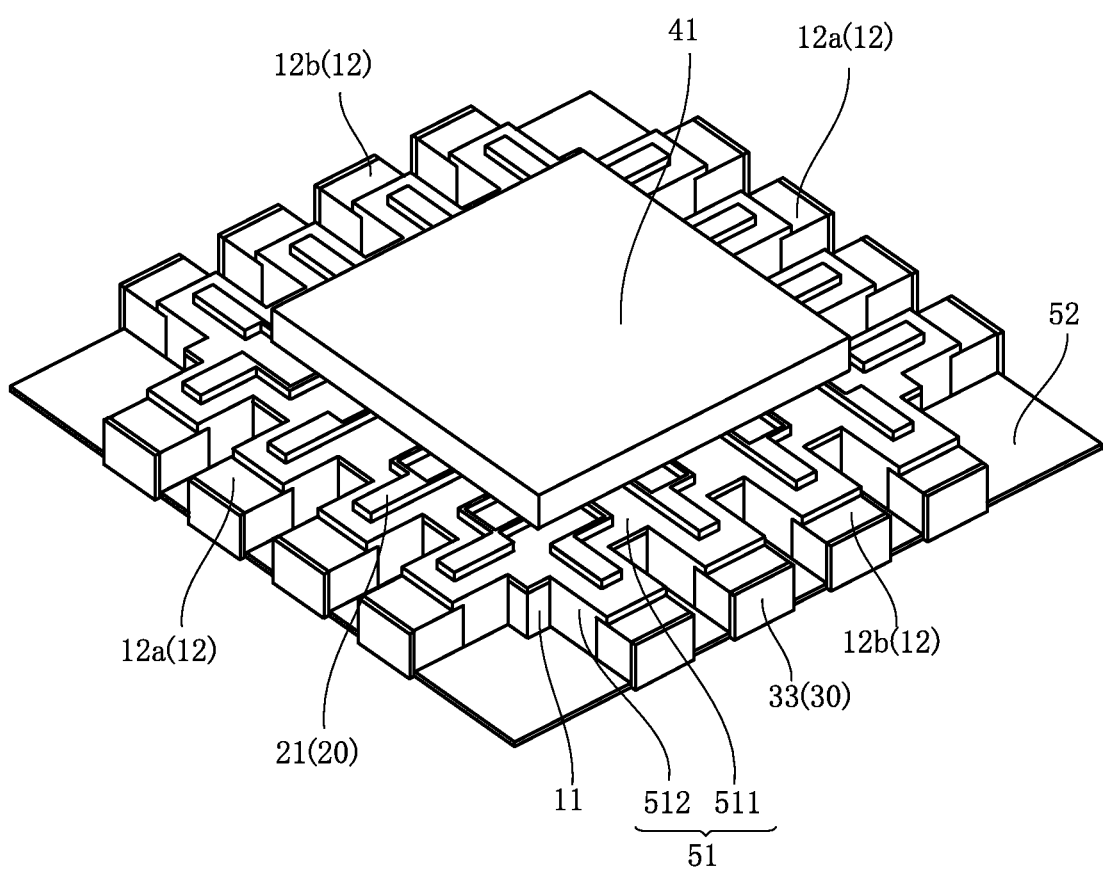
FIG. 2 is a perspective view similar to FIG. 1, with a sealing resin and an insulating layer omitted.

With reference to the drawings, the following specifically describes embodiments of semiconductor devices according to the present disclosure and methods for manufacturing the semiconductor devices according to the present disclosure.

FIGS. 1 to 7 show a semiconductor device according to a first embodiment. The semiconductor device A10 of the present embodiment includes a substrate 11, substrates 12, an insulating layer 15, first electrodes 20, second electrodes 30, a semiconductor element 41, bonding layers 42, an internal resin layer 51, an external resin layer 52 and a sealing resin 60.

Figure 3:
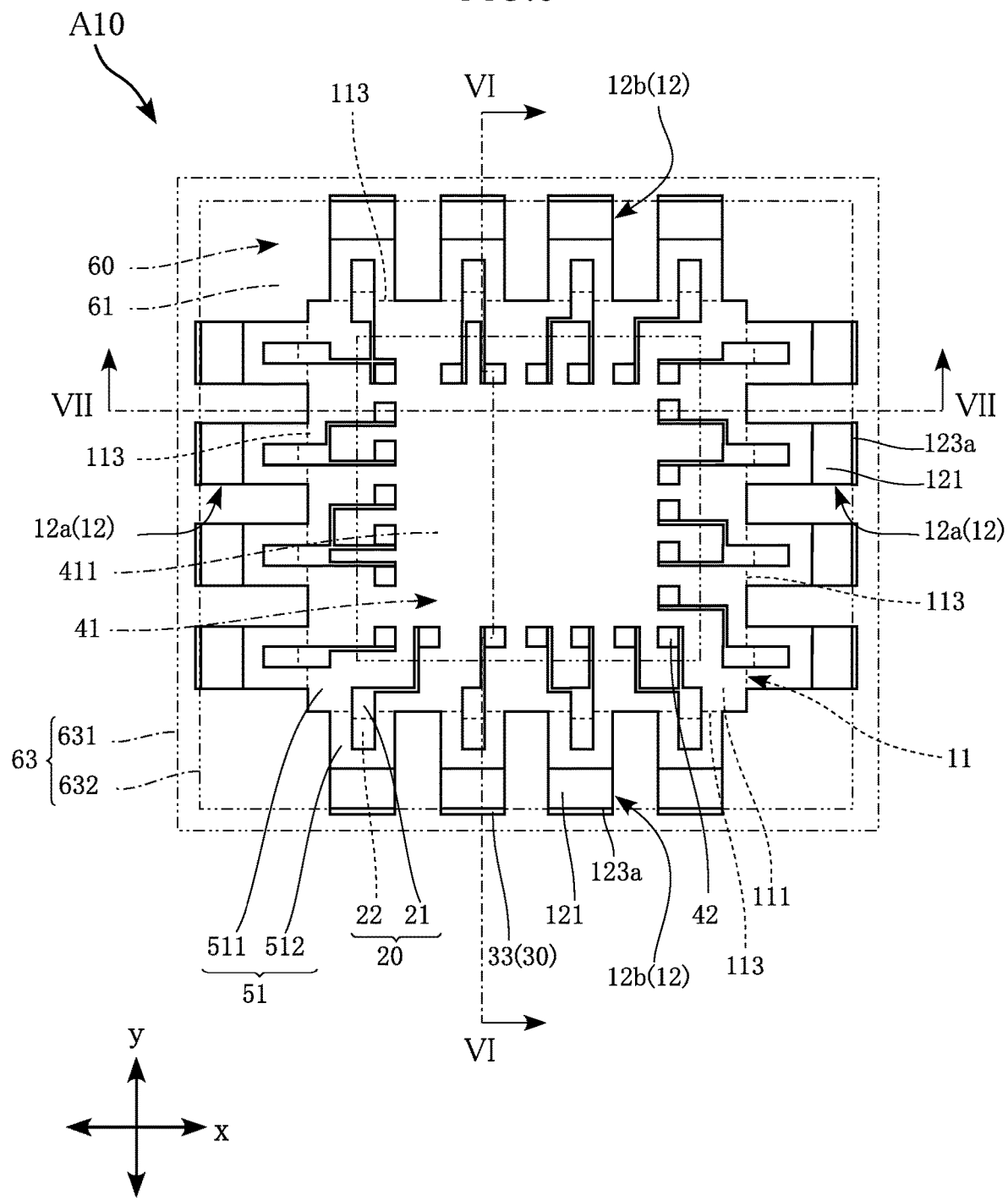
FIG. 3 is a plan view of the semiconductor device according to the first embodiment.
Figure 4:
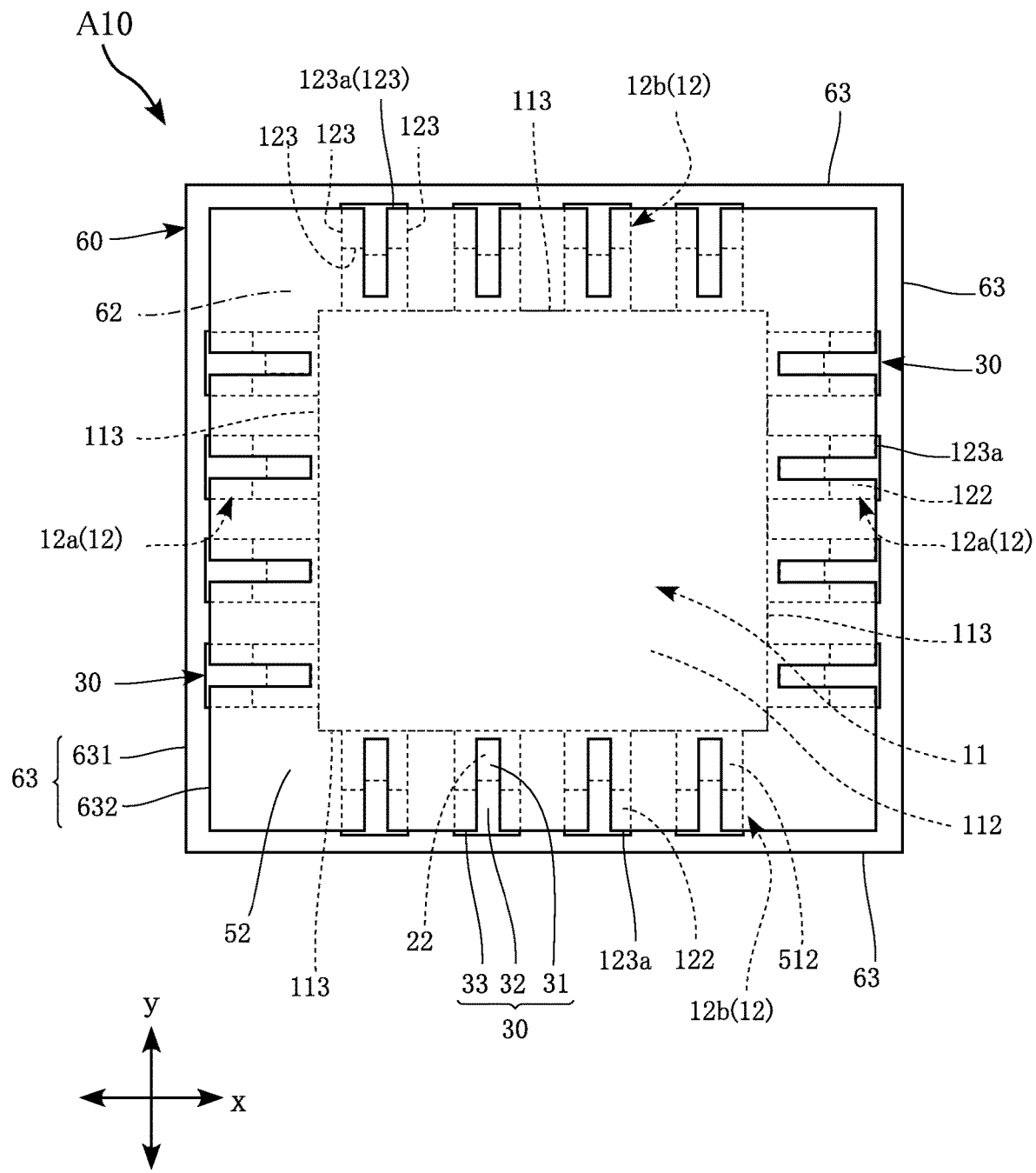
FIG. 4 is a bottom view of the semiconductor device according to the first embodiment.
Figure 7:
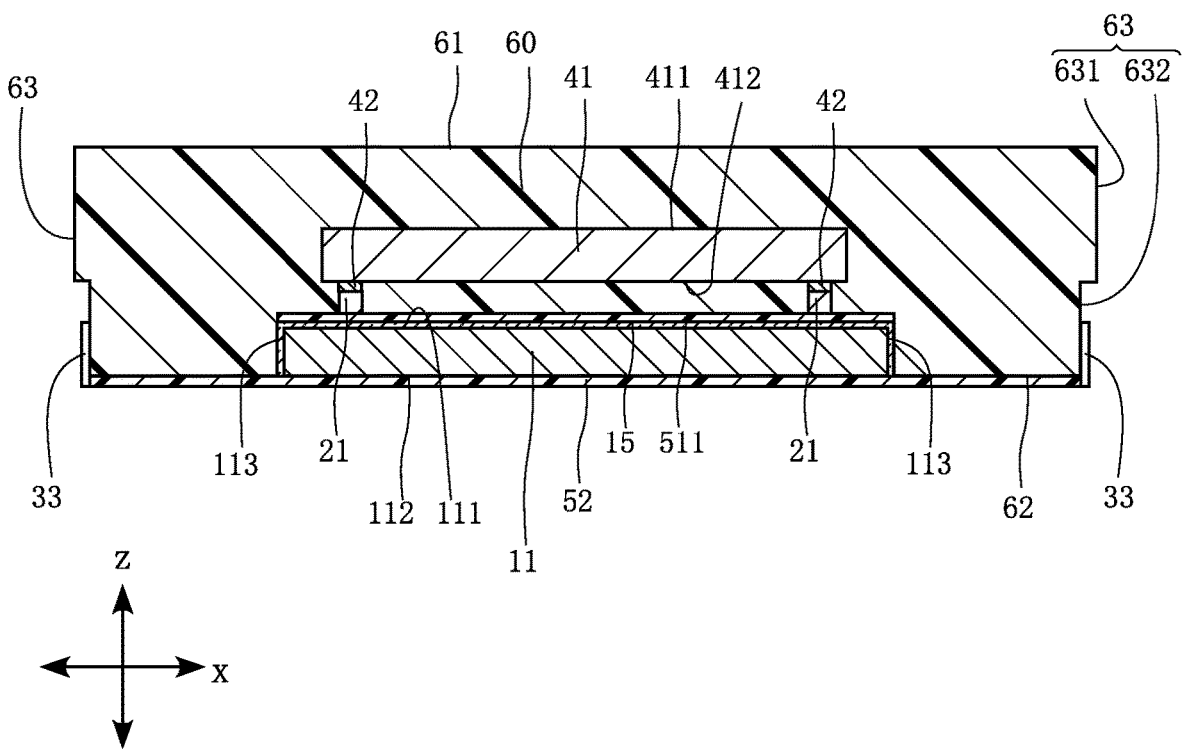
FIG. 7 is a sectional view taken along line VII-VII of FIG. 3.

FIG. 1 is a perspective view of the semiconductor device A10. FIG. 2 is a perspective view shown in FIG. 1, but omitting the insulating layer 15 and the sealing resin 60. FIG. 3 is a plan view of the semiconductor device A10. For convenience, this figure omits the insulating layer 15, and shows the semiconductor element 41 and the sealing resin 60 in phantom lines. FIG. 4 is a bottom view of the semiconductor device A10. FIG. 5 is a side view of the semiconductor device A10. FIG. 6 is a sectional view taken along line VI-VI of FIG. 3. FIG. 7 is a sectional view taken along line VII-VII of FIG. 3. For the purpose of description, three directions x, y and z perpendicular to each other are defined as shown in the figures. These directions may be referred to as a first direction x, a second direction y and a thickness direction z. However, these directions do not limit the present disclosure. In addition, although one side in the thickness direction x is referred to as "upper" and the other as "lower", such wording does not limit the semiconductor device A10 to any specific orientation.

The semiconductor device A10 is provided in a resin package to be mounted on the surface of a wiring board of a various electronic devices. As shown in FIGS. 3 and 4, the semiconductor device A10 is rectangular as viewed in the thickness direction z (in plan view). The semiconductor device A10 is packaged in a QFN package.

The substrate 11 is made of a single-crystal intrinsic semiconductor material. The intrinsic semiconductor material may be Si (silicon), for example. As shown in FIGS. 6 and 7, the substrate 11 is rectangular as viewed in the thickness direction z. The substrate 11 measures, for example, about 50 to 150 µm in the dimension in the thickness direction z (thickness). The substrate 11 has a first front surface 111, a first back surface 112 and a plurality of first side surfaces 113.

As shown in FIGS. 6 and 7, the first front surface 111 and the first back surface 112 are opposite surfaces spaced apart from each other in the thickness direction z. The first front surface 111 is the top surface of the substrate 11 as seen in FIGS. 6 and 7. The first back surface 112, which faces in the thickness direction z, is the lower surface of the substrate 11 as seen in FIGS. 6 and 7. When the semiconductor device A10 is mounted on a circuit board, the first back surface 112 will face the circuit board. As shown in FIGS. 6 and 7, each first side surface 113 extends between the first front surface 111 and the first back surface 112. The first side surface 113 is flat and perpendicular to each of the first front surface 111 and the first back surface 112. As shown in FIGS. 3 and 4, the substrate 11 has four first side surfaces 113 each facing a different side in the first direction x and the second direction y.

The substrates 12 are made of the same material as the substrate 11. That is, the substrates 12 are made of an intrinsic Si semiconductor material. In the present embodiment, the size and shape of the substrates 12 are substantially the same. As shown in FIG. 4, the substrates 12 are rectangular in plan view. As shown in FIG. 4, all of the substrates 12 are spaced apart from the substrate 11 and also from each other. The substrates 12 have the same thickness as the substrate 11. Note, however, that the shape, size and number of the substrates 12 are not limited. Each substrate 12 has a second front surface 121, a second back surface 122 and a plurality of second side surfaces 123.

As shown in FIG. 6, the second front surface 121 faces in the same direction as the first front surface 111 faces. The second front surface 121 is a flat surface. The second back surface 122 faces in the same direction as the first back surface 112 faces as shown in FIG. 6. The second back surface 122 is a flat surface. The second front surface 121 and the second back surface 122 face away from each other in the thickness direction z. As shown in FIG. 6, each second side surface 123 extends between the second front surface 121 and the second back surface 122. The second side surface 123 is flat and perpendicular to each of the second front surface 121 and the second back surface 122. In the present embodiment, each substrate 12 has four second side surfaces 123 each of which faces a different side in the first direction x and the second direction y as shown in FIG. 4. Among the four second side surfaces 123 of the substrate 12, the second side surface 123 facing toward the substrate 11 is in contact with the internal resin layer 51. In addition, the second side surface 123 that is opposite to the second side surface 123 facing toward the substrate 11 is exposed from the sealing resin 60. This second side surface 123 exposed from the sealing resin 60 may be specifically referred to as the "exposed side surface 123a".

The substrate 11 and the substrates 12 are spaced apart from each other. The substrate 11 and the substrates 12 are located at the same position in the thickness direction z. The first front surface 111 and the second front surfaces 121 are located at the same position in the thickness direction z. Also, the first back surface 112 and the second back surfaces 122 are located at the same position in the thickness direction z. As shown in FIGS. 3 and 4, the substrates 12 include a plurality of substrates 12a located opposite to either of the two first side surfaces 113 facing in the first direction x, and a plurality of substrates 12b located opposite to either of the two first side surfaces 113 facing in the second direction y. The substrates 12a overlap with the substrate 11 as viewed in the second direction y, whereas the substrates 12b overlap the substrate 11 as viewed in the first direction x. In the present embodiment, four substrates 12 are disposed for each of the four first side surface 113 of the substrate 11. The four substrates 12 are spaced at regular intervals along the corresponding first side surface 113.

As shown in FIGS. 6 and 7, the insulating layer 15 covers the first front surface 111 and the first side surfaces 113 of the substrate 11. As shown in FIG. 6, the insulating layer 15 also covers the substrates 12, excluding the second back surfaces 122 and the exposed side surfaces 123a. The insulating layer 15 is an electrically insulating coating and electrically insulates the substrate 11, the substrates 12 and the first electrodes 20. The insulating layer 15 is a $SiO_2$ layer formed by thermally oxidizing the substrate 11 and the substrates 12. In the present embodiment, the insulating layer 15 has a thickness of about 0.7 to 1.0 µm, for example. However, the material, thickness, and formation method of the insulating layer 15 are not limited.

The first electrodes 20 are electrical conductors disposed internally of the semiconductor device A10. The first electrodes 20 are electrically connected to the semiconductor element 41. Each first electrode 20 is composed of a base layer and a plating layer laminated on each other. The base layer is composed of a Ti layer and a Cu layer laminated on each other to a thickness of about 200 to 800 nm. The plating layer is the outer layer formed in contact with the base layer. The plating layer is made of Cu and has a thickness of about 3 to 10 µm, which is greater than the thickness of the base layer. Since the base layer and the plating layer are integral, FIGS. 6 and 7 shows the first electrodes 20 without showing the respective layers. The material and thickness of the first electrodes 20 are not limited. In the present embodiment, each first electrode 20 includes a first conductive portion 21 and a second conductive portion 22 as shown in FIG. 6.

The first conductive portion 21 and the second conductive portion 22 are connected to each other and integrally formed. The first conductive portion 21 is a portion of the first electrode 20 located on a portion of the first front surface 111 of the substrate 11. The second conductive portion 22 is a portion of the first electrode 20 located between the substrate 11 and a substrate 12. In the present embodiment, the second conductive portion 22 is a pillar that is rectangular in plan view. However, the shape of a second conductive portion 22 is not specifically limited and may be a pillar that is circular in plan view. As shown in FIG. 6, the second conductive portion 22 has a connecting surface 221 that is in contact with a second electrode 30. The connecting surface 221 is a flat surface facing one side in the thickness direction z (downward in FIG. 6). In the present embodiment, the connecting surface 221 is flush with the first back surface 112 and the second back surface 122.

The second electrodes 30 are electrical conductors electrically connected to the first electrodes 20 and exposed to the outside. The second electrodes 30 are terminals used for mounting the semiconductor device A10 to a circuit board. As shown in FIG. 6, each second electrode 30 is in contact with a substrate 12 and a first electrode 20. The second electrodes are formed by electroless plating. In the present embodiment, each second electrode 30 is composed of a Ni layer, a Pd layer and a Au layer laminated on each other. The Ni layer is in contact with the substrate 12 and the first electrode 20, and the Au layer is exposed to the outside. The Pd layer is interposed between the Ni layer and the Au layer. The entire second electrode 30 overlaps with the sealing resin 60 in plan view. In the present embodiment, the second electrodes 30 have a thickness of about 3 to 15 μm. The number, thickness, material and formation method of the second electrodes 30 are not limited. As shown in FIG. 6, each second electrode 30 includes a first-electrode covering portion 31, a second-back-surface covering portion 32 and an exposed-side-surface covering portion 33.

The first-electrode covering portion 31 is a portion of the second electrode 30 that covers the connecting surface 221 of a second conductive portion 22. The second-back-surface covering portion 32 is a portion of the second electrode 30 that covers the second back surface 122 of a substrate 12. The exposed-side-surface covering portion 33 is a portion of the second electrode 30 that covers the exposed side surface 123a of the substrate 12. In the present embodiment, the exposed-side-surface covering portion 33 covers the entire exposed side surface 123a. The exposed-side-surface covering portion 33 overlaps with the sealing resin 60 in plan view. The first-electrode covering portion 31, the second-back-surface covering portion 32 and the exposed-side-surface covering portion 33 are integrally formed.

The semiconductor element 41 is an essential component of the semiconductor device A10. The semiconductor element 41 may be an integrated circuit, such as a large scale integration (LSI) circuit. Alternatively, the semiconductor element 41 may be a voltage controller, such as a low drop out (LDO) controller, an amplifier, such as an operational amplifier, or a discrete semiconductor element, such as a diode. The semiconductor element 41 is rectangular in plan view. The semiconductor element 41 is mounted on the substrate 11. The semiconductor element 41 overlaps with the substrate 11 in plan view. The semiconductor element 41 has an element front surface 411 and an element back surface 412.

The element front surface 411 faces in the thickness direction z and faces the same side as the first front surface 111 of the substrate 11 faces. The element back surface 412 faces in the thickness direction z and faces away from the element front surface 411. The element back surface 412 is located opposite to the first front surface 111.

The semiconductor element 41 is provided with a plurality of electrode pads. The electrode pads are formed on the element back surface 412. The electrode pads are made of aluminum (Al), for example. The semiconductor element 41 is attached to the substrate 11 by flip chip bonding.

A bonding layer 42 is an electrically conductive member located between the first conductive portion 21 of a first electrode 20 and the semiconductor element 41 (electrode pad 413) as shown in FIGS. 6 and 7. In the present embodiment, each bonding layer 42 connects an electrode pad 413 and a first conductive portion 21. The bonding layers 42 are made of an alloy containing Sn (tin). Examples of such an alloy include lead-free solders, such as an Sn—Sb alloy and an Sn—Ag alloy, and Pb (lead) containing solders. The bonding layers 42 are formed by electroplating, for example. In the present embodiment, the semiconductor element 41 is fixed to the first conductive portions 21 (first electrodes 20) by the bonding layers 42.

The internal resin layer 51 is disposed internally of the semiconductor device A10. The internal resin layer 51 is made of polyimide, for example. The internal resin layer 51 insulates the substrate 11, the substrates 12 and the first electrodes 20. This reduces the risk of a short circuit between first electrodes 20 via the substrate 11. The semiconductor device A10 insulates the first electrodes 20, the substrate 11 and the substrates 12 also by the insulating layer 15. Additionally, the substrate 11 and the substrates 12 are made of an intrinsic Si semiconductor material, which is insulating. Therefore, the risk of a short circuit between first electrodes 20 is already reduced without the internal resin layer 51. Yet, to further reduce the risk of a short circuit, it is preferable to have the internal resin layer 51. As shown in FIG. 6, the internal resin layer 51 includes a first portion 511 and second portions 512.

The first portion 511 is located on the first front surface 111 of the substrate 11. In the present embodiment, the first portion 511 covers the entire first front surface 111. Each second portion 512 is located between the substrate 11 and a substrate 12. The second portion 512 has a through hole 512a extending in the thickness direction z. The through hole 512a is rectangular in plan view. The second portion 512 and the through hole 512a define a rectangular ring shape in a section taken along an x-y plane. The through hole 512a is filled with the second conductive portion 22.

The external resin layer 52 is exposed to the outside of the semiconductor device A10. The external resin layer 52 is made of polyimide or epoxy, for example. The external resin layer 52 covers at least the entire first back surface 112. The external resin layer 52 insulates the second electrodes 30 from each other. The external resin layer 52 can prevent a short circuit between second electrodes 30, which may be caused by solder used to attach the semiconductor device A10 to a circuit board, for example. In the present embodiment, in addition, the external resin layer 52 covers portions of each second back surface 122 as shown FIG. 4, thereby increasing the distance between each two second electrodes 30. This further reduces occurrence of a short circuit between second electrodes 30. However, the external resin layer 52 may be omitted.

The sealing resin 60 is a synthetic resin made primarily of a black epoxy resin, for example. As shown in FIG. 6, the sealing resin 60 covers the semiconductor element 41. The sealing resin 60 partly located between adjacent substrates 12a and partly between adjacent substrates 12b. The sealing resin 60 has a resin front surface 61, a resin back surface 62 and a plurality of resin side surfaces 63.

The resin front surface 61 faces in the same direction as the element front surface 411 faces. As shown in FIG. 7, the resin back surface 62 faces in the same direction as the element back surface 412 faces. As shown in FIG. 7, the resin back surface 62 is covered by the external resin layer 52. Each resin side surface 63 has a flat portion 631 and a recessed portion 632. The flat portion 631 is a portion of a resin side surface 63 that is flat. The recessed portion 632 is a portion of the resin side surface 63 that is recessed from the flat portion 631. In the present embodiment, each recessed portion 632 is located on an edge where the substrate 11 and the substrates 12 are located.

Next, with reference to FIGS. 8 to 28, a method for manufacturing a semiconductor device A10 is described. Among FIGS. 8 to 28, FIGS. 9, 12, 15 and 19 are plan views showing steps of the method for manufacturing the semiconductor device A10, and FIGS. 22, 24, 26 and 28 are bottom views showing steps of the method for manufacturing the semiconductor device A10. The other figures are sectional views showing steps of the method for manufacturing the semiconductor device A10. The sections in the figures correspond to the section shown in FIG. 6.

Figure 8:
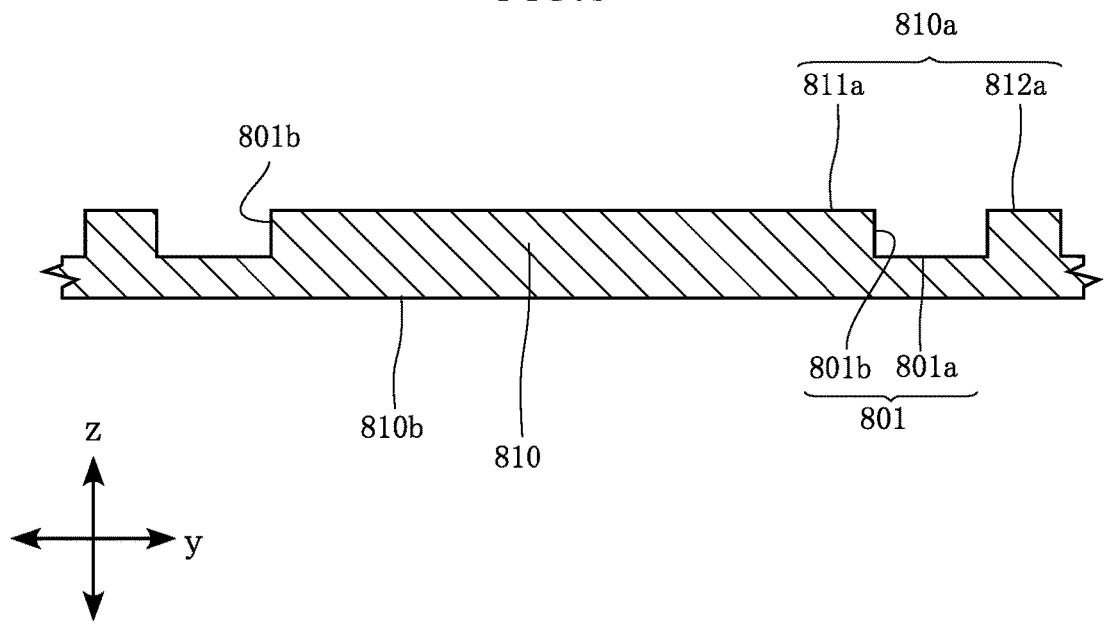
FIG. 8 is a sectional view showing a manufacturing step (recess forming step) of the semiconductor device shown in FIG. 1.
Figure 9:
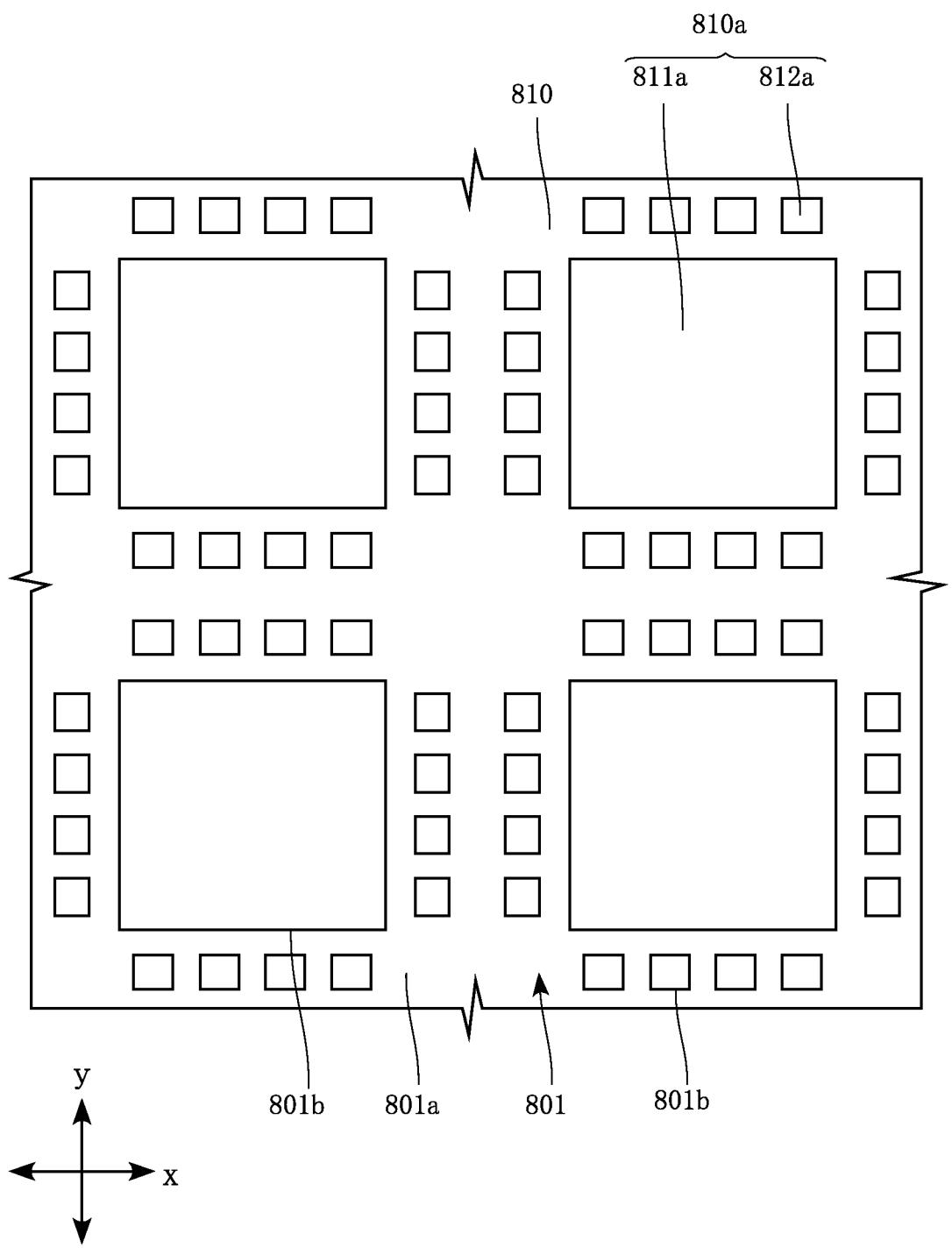
FIG. 9 is a plan view showing a manufacturing step (recess forming step) of the semiconductor device shown in FIG. 1.

First, as shown in FIGS. 8 and 9, a base 810 having a front surface 810a and a back surface 810b facing in the thickness direction z is prepared. The base 810 is then processed to form a recessed portion 801 that is recessed from the front surface 810a in the thickness direction z. The base 810 is an aggregate corresponding to the substrates 11 and the substrates 12 of a plurality of semiconductor devices A10. In the present embodiment, the base 810 is made of an intrinsic Si semiconductor material. In the step of preparing the base 810 (base preparation step), a silicon wafer may be prepared as the base 810. The step of forming the recessed portion 801 in the base 810 (recess forming step) is performed by dry etching, for example. By the recess forming step of forming recessed portion 801 in the base 810, a bottom surface 801a and standing surfaces 801b are formed. As shown in FIG. 8, each standing surface 801b has an upper edge on the front surface 810a and a lower edge on the bottom surface 801a. The standing surface 801b stands on the bottom surface 801a and is perpendicular to the bottom surface 801a. Forming the recessed portion 801 divides the front surface 810a into separate regions, including a first front surface 811a and a plurality of second front surfaces 812a. The recess forming step is not limited to dry etching. In one example, the front surface 810a may be a (110) plane having the crystal orientation (110). Then, the recessed portion 801 can be formed by anisotropic etching with potassium hydroxide (KOH). In this example, each standing surface 801b is formed by a (111) plane having the crystal orientation (111).

Figure 10:
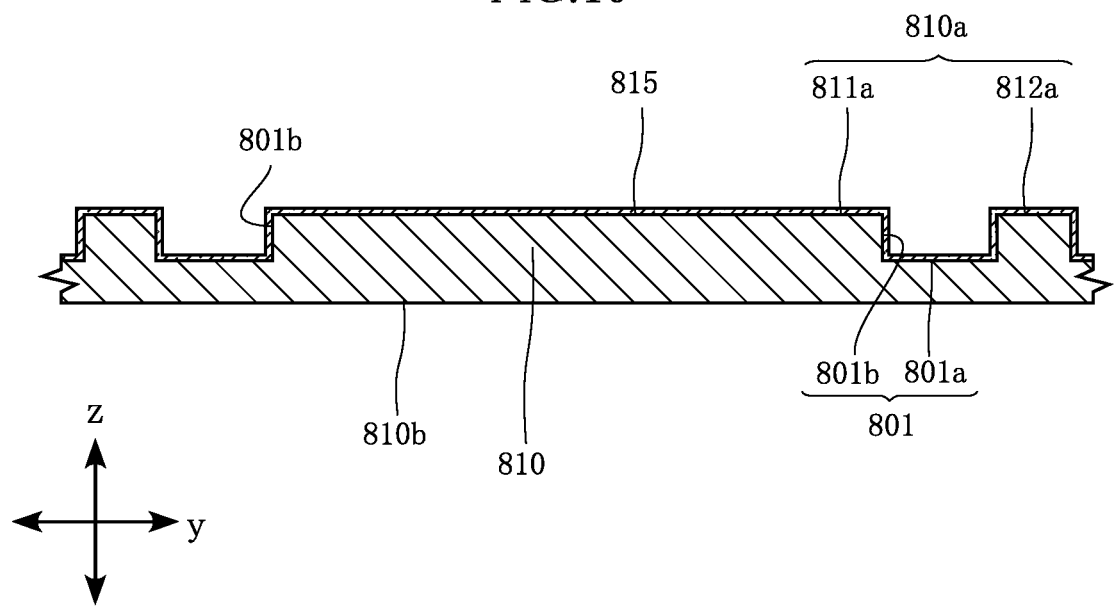
FIG. 10 is a sectional view showing a manufacturing step (insulating layer forming step) of the semiconductor device shown in FIG. 1.

Subsequently, an insulating layer 815 is formed as shown in FIG. 10. The insulating layer 815 corresponds to the insulating layer 15 of the semiconductor device A10. In the step of forming the insulating layer 815 (insulating layer forming step), the base 810 is thermally oxidized to form an insulating layer 815 on the entire area of the front surface 810a, the bottom surfaces 801a and the standing surfaces 801b. The insulating layer 815 is formed to a thickness of about 0.7 to 1.0 µm, for example.

Figure 11:
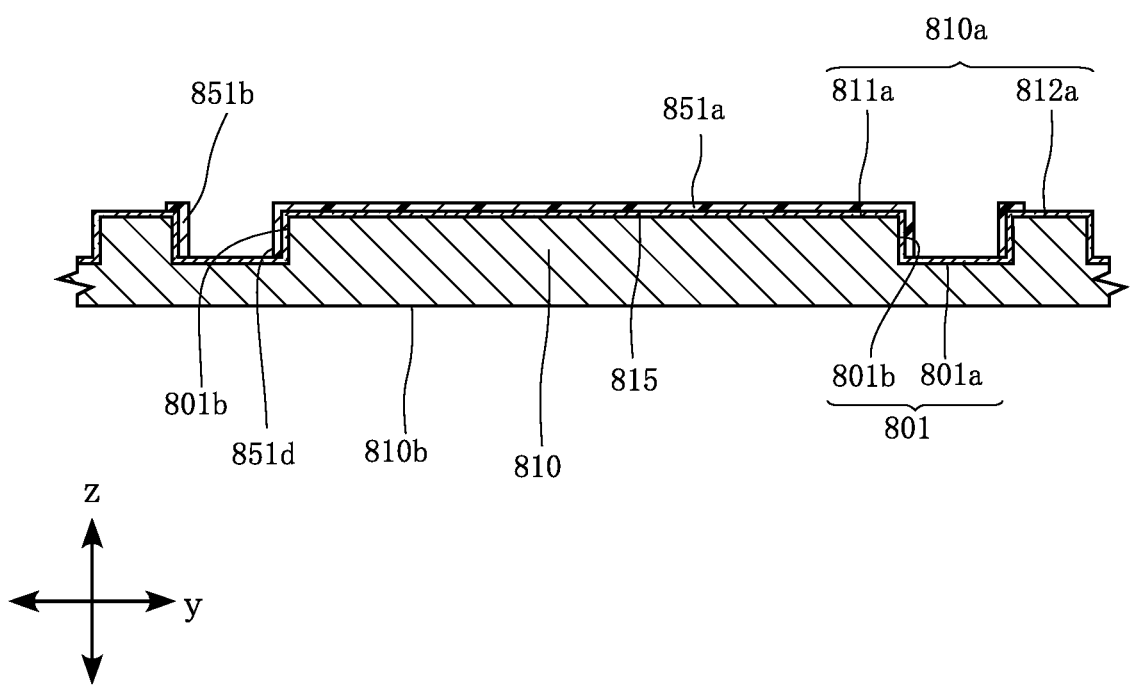
FIG. 11 is a sectional view showing a manufacturing step (internal resin layer forming step) of the semiconductor device shown in FIG. 1.
Figure 12:
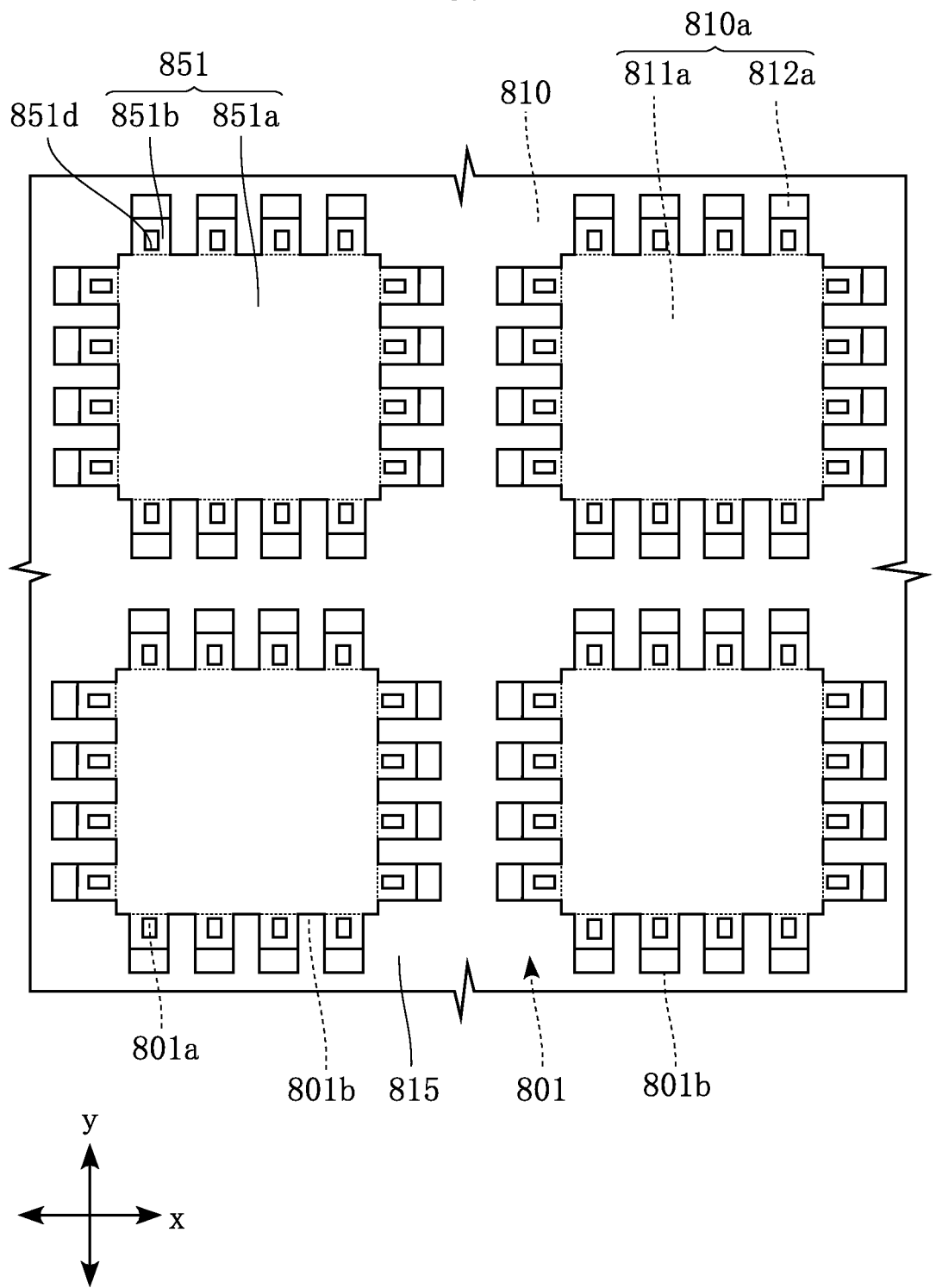
FIG. 12 is a plan view showing a manufacturing step (internal resin layer forming step) of the semiconductor device shown in FIG. 1.

Subsequently, a resin layer 851 is formed as shown in FIGS. 11 and 12. The resin layer 851 corresponds to the internal resin layer 51 of the semiconductor device A10. The step of forming the resin layer 851 (internal resin layer forming step) involves applying a photosensitive polyimide resin to the base 810, specifically to the whole area of the front surface 810a and the recessed portion 801 by using, for example, a spin coater (a rotary coating machine). Alternatively, a film of photosensitive polyimide resin may be applied. Then, the photosensitive polyimide resin is exposed to light and developed for patterning. This forms a resin layer 851 shown in FIGS. 11 and 12. The resin layer 851 has a first portion 851a and second portions 851b. The first portion 851a is formed on a portion of the front surface 810a of the base 810. Each second portion 851b is formed between the first front surface 811a and a second front surface 812a in plan view. The second portion 851b has a through hole 851d extending in the thickness direction. From the through hole 851d, the insulating layer 815 is exposed.

Figure 13:
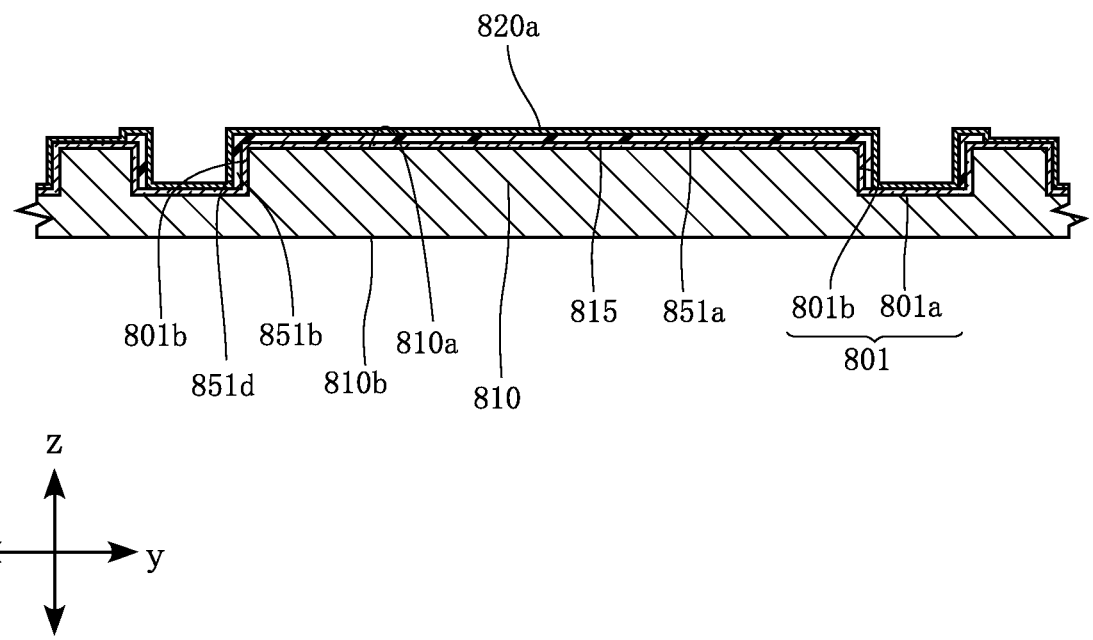
FIG. 13 is a sectional view showing a manufacturing step (base layer forming step) of the semiconductor device shown in FIG. 1.

Subsequently, abase layer 820a is formed as shown in FIG. 13. Portions of the base layer 820a correspond to portions of the first electrodes 20 (the base layers of the first electrodes 20 described above) of the semiconductor device A10. The base layer 820a is formed by sputtering. The base layer 820a of the present embodiment is composed of a Ti layer and a Cu layer laminated on each other. In the step of forming the base layer 820a (base layer forming step), the Ti layer is formed in contact with the insulating layer 815 and the base 810, and then the Cu layer is formed in contact with the Ti layer.

Figure 14:
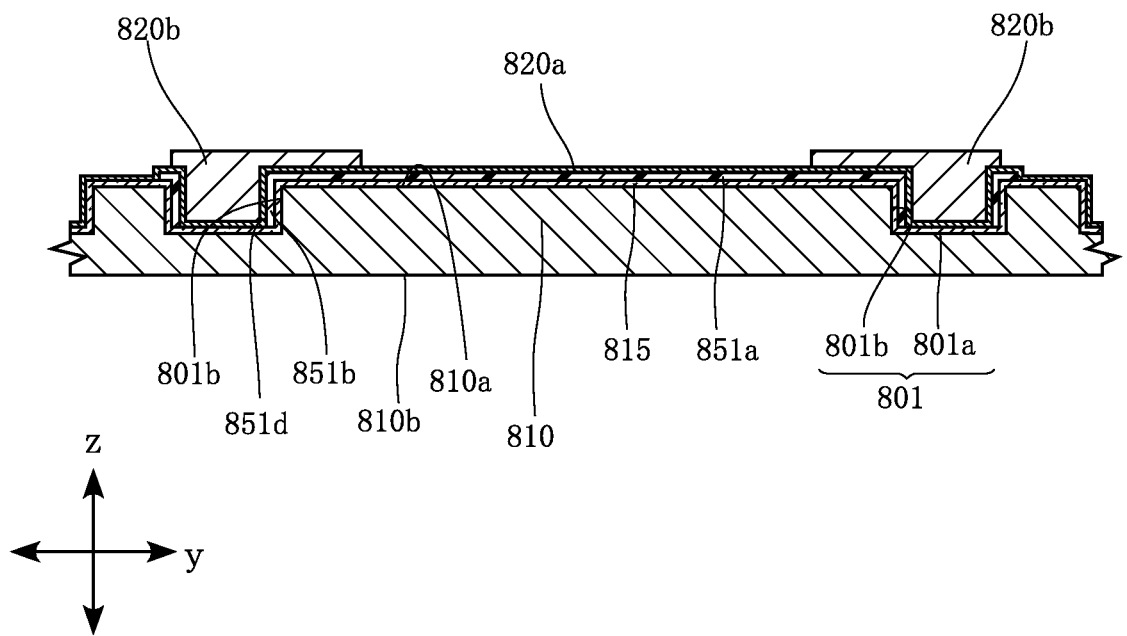
FIG. 14 is a sectional view showing a manufacturing step (plating layer forming step) of the semiconductor device shown in FIG. 1.
Figure 15:
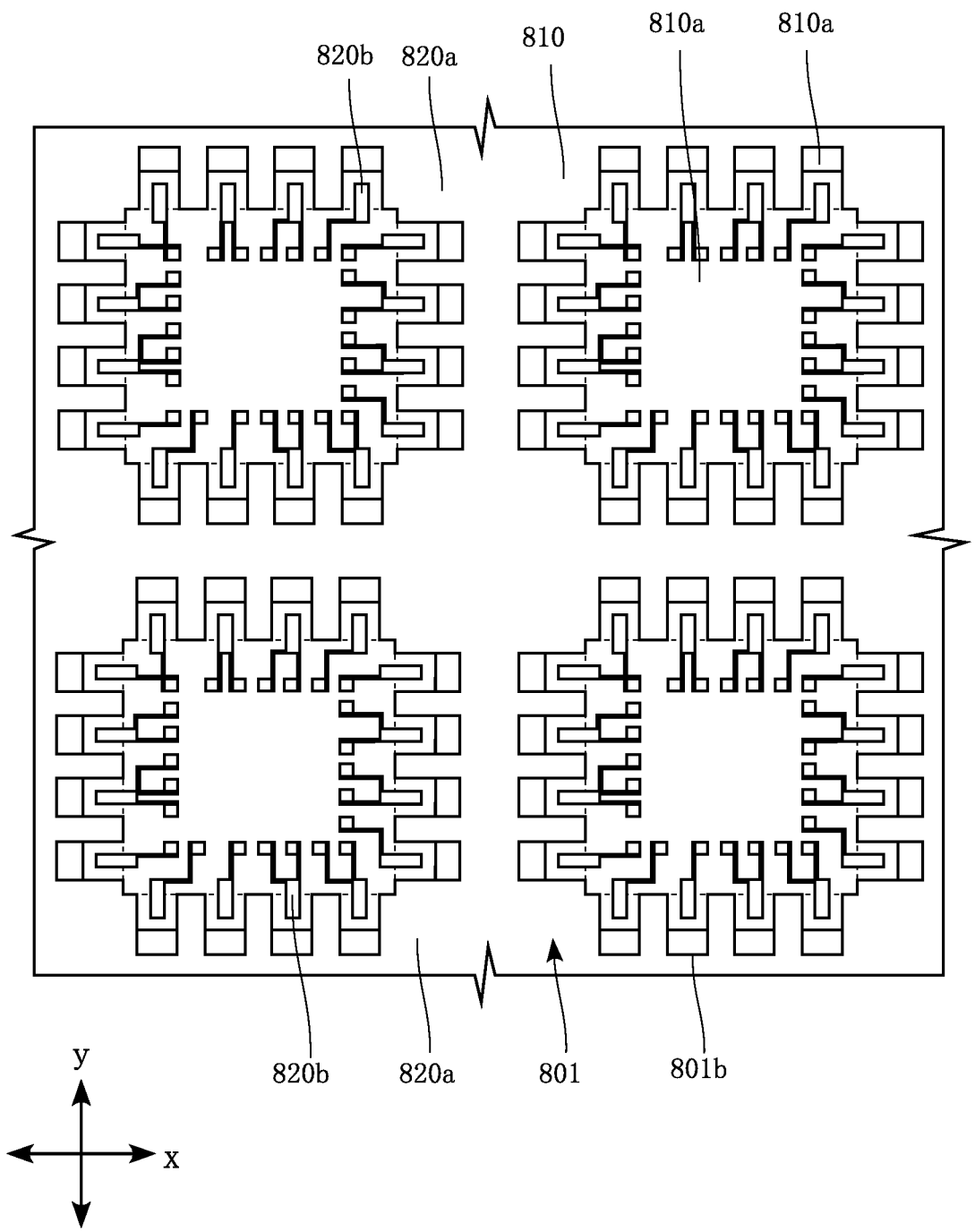
FIG. 15 is a plan view showing a manufacturing step (plating layer forming step) of the semiconductor device shown in FIG. 1.

Subsequently, plating layers 820b are formed as shown in FIGS. 14 and 15. The plating layers 820b correspond to portions of the first electrodes 20 (plating layers of the first electrodes 20 described above) of the semiconductor device A10. Forming the plating layers 820b involves patterning by photolithography and electroplating. The step of forming the plating layer 820b (plating layer forming step) begins with forming, by photolithography, a resist layer (not shown) for forming the plating layers 820b. To form the resist layer, a photosensitive resist is applied to the entire area of the base layer 820a. Then, the photoresist is exposed to light and developed to form a pattern exposing portions of the base layer 820a (portions where the plating layers 820b are to be formed). Then, electroplating is performed through conductive paths provided by the base layer 820a, forming the plating layers 820b on the exposed portions of the base layers 820a. In the present embodiment, a plating solution for the electroplating contains an inhibitor and an accelerator so that precipitation forms and grows more favorably on portions of the base layer 820a located on the bottom surface 801a of the recessed portion 801 than those on the front surface 810a. As a result, the plating layers 820b are formed to fill the through holes 851d of the second portions 851b of the resin layer 851. Then, the resist layer is removed, leaving the plating layers 820b as shown in FIGS. 14 and 15.

Figure 16:
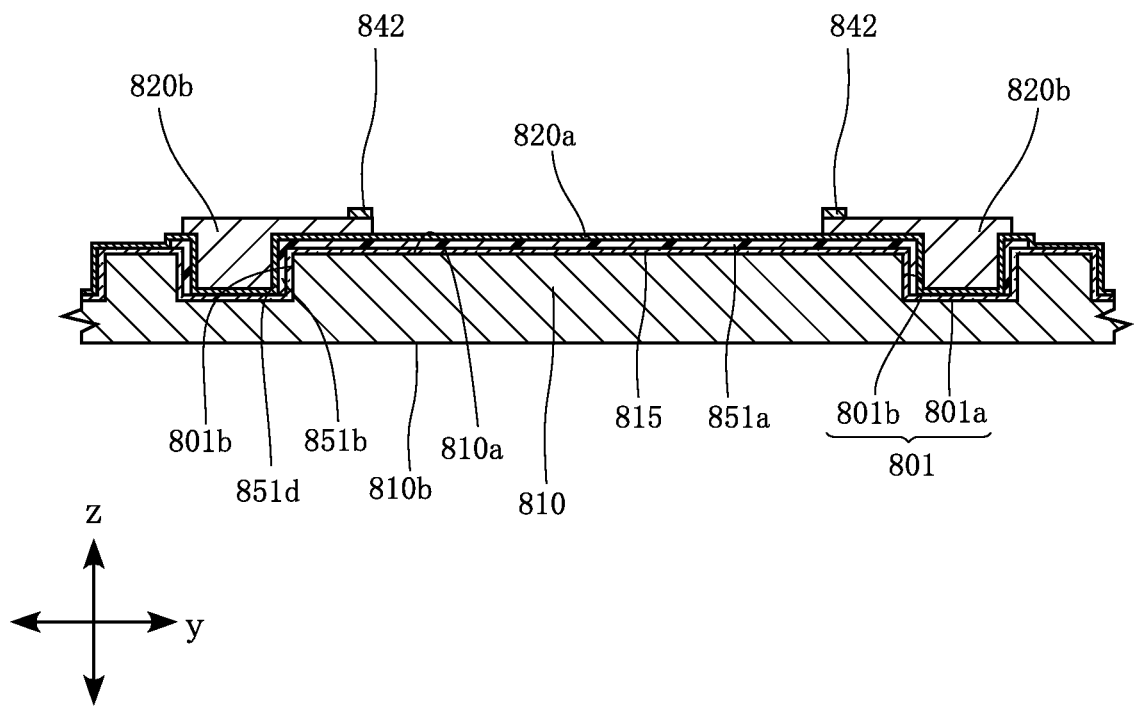
FIG. 16 is a sectional view showing a manufacturing step (bonding layer forming step) of the semiconductor device shown in FIG. 1.

Subsequently, bonding layers 842 are formed as shown in FIG. 16. The bonding layers 842 correspond to the bonding layers 42 of the semiconductor device A10. Forming the bonding layers 842 involves patterning by photolithography and electroplating. In the step of forming the bonding layers 842 (bonding layer forming step), a resist layer (not shown) is formed on the plating layer 820b and patterned for forming the bonding layers 842. The resist layer is patterned to expose portions of the plating layer 820b (portions where the bonding layers 842 are to be formed). Then, electroplating is performed through conduction paths provided by the base layer 820a and the plating layers 820b. This forms the bonding layers 842 that are in contact with the portions of the plating layer 820b exposed from the resist layer. Then, the resist layer is removed. In the present embodiment, the bonding layers 842 are made of lead-free solder, such as Sn—Ag based alloy or Sn—Sb based alloy.

Figure 17:
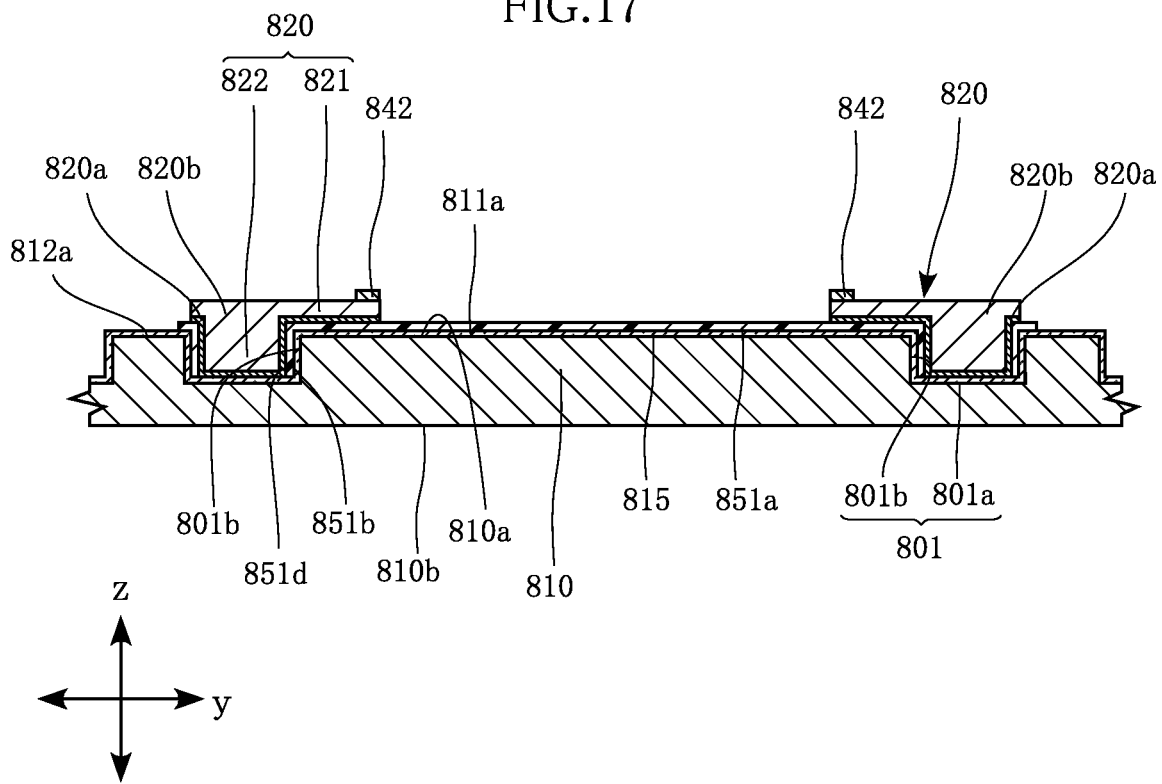
FIG. 17 is a sectional view showing a manufacturing step (base layer removal step) of the semiconductor device shown in FIG. 1.

Next, as shown in FIG. 17, unnecessary portions of the base layer 820a, which are not covered by the plating layers 820b, are completely removed from the base 810. The unnecessary portions of the base layer 820a are removed by wet etching. The wet etching uses a mixture solution of, for example, $H_2SO_4$ (sulfuric acid) and $H_2O_2$ (hydrogen peroxide). By the step of removing unnecessary portions of the base layer 820a (base layer removal step), the resin layer 851 is exposed where the base layer 820a is no longer present as shown in FIG. 17. Also, by removing the base layer 820a, the first electrodes 820 are formed. Each first electrode 820 includes a first conductive portion 821 formed on the first front surface 811a and a second conductive portion 822 contained in the through hole 851d in a second portion 851b of the resin layer 851. The first electrodes 820 correspond to the first electrodes 20 of the semiconductor device A10.

Figure 18:
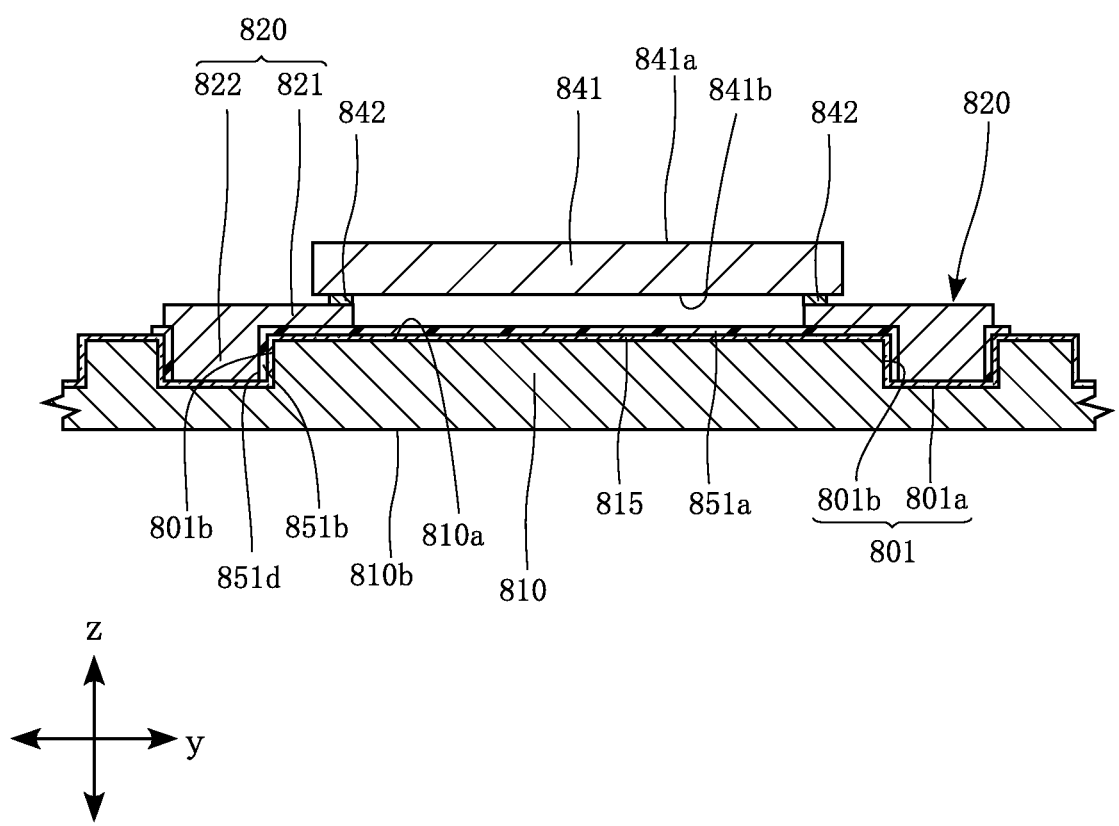
FIG. 18 is a sectional view showing a manufacturing step (semiconductor element mounting step) of the semiconductor device shown in FIG. 1.
Figure 19:
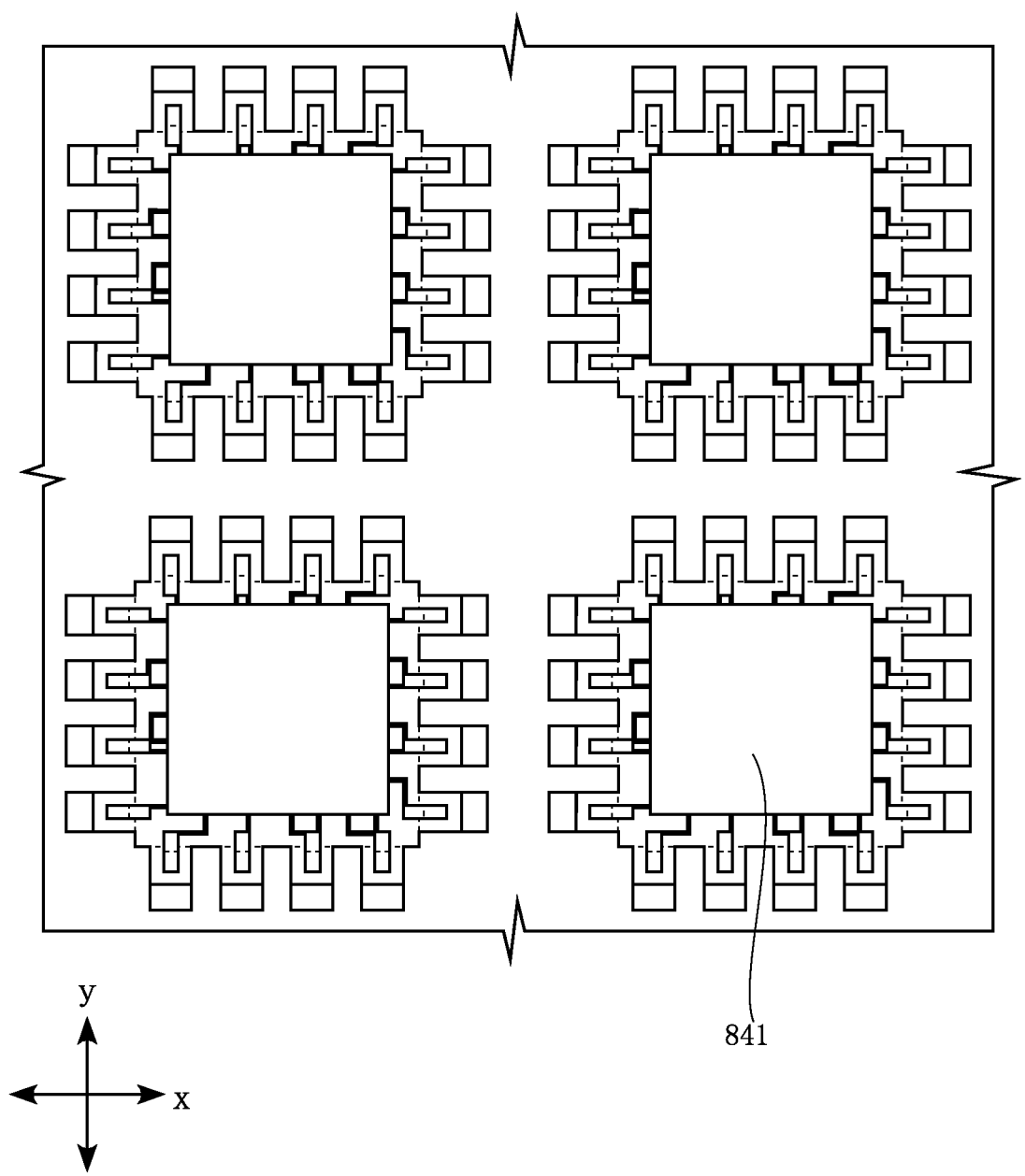
FIG. 19 is a plan view showing a manufacturing step (semiconductor element mounting step) of the semiconductor device shown in FIG. 1.

Subsequently, a semiconductor element 841 is mounted on the base 810 as shown in FIGS. 18 and 19. The semiconductor element 841 corresponds to the semiconductor element 41 of the semiconductor device A10. The step of mounting the semiconductor element 841 (semiconductor element mounting step) employs FCB (Flip Chip Bonding). First, flux is applied to the electrode bumps (not shown) of the semiconductor element 841. Then, by using a flip chip bonder, the semiconductor element 841 is placed to have the element front surface 841a facing the base 810 and temporarily attached to the bonding layers 842. At this stage, each bonding layer 842 is sandwiched between a first electrode 820 and the semiconductor element 841. Then, the bonding layers 842 are melted by reflowing, followed by cooled to solidify the bonding layers 842. This completes mounting of the semiconductor element 841. In FIG. 18 (as well as in FIGS. 20, 21, 23, 25 and 27), the base layer 820a and the plating layer 820b are not separately shown but simply as the first electrode 820.

Figure 20:
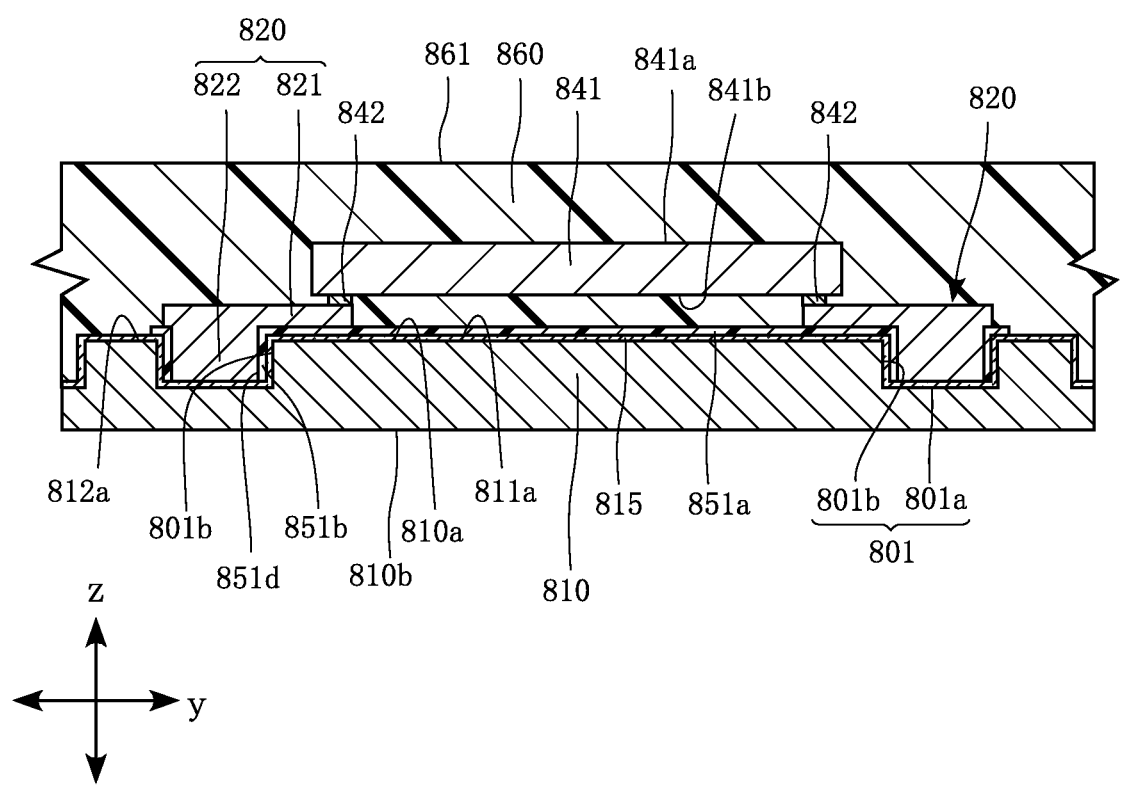
FIG. 20 is a sectional view showing a manufacturing step (sealing resin forming step) of the semiconductor device shown in FIG. 1.

Subsequently, a sealing resin 860 is formed to cover the semiconductor element 841 as shown in FIG. 20. The sealing resin 860 corresponds to the sealing resin 60 of the semiconductor device A10. The sealing resin 860 according to the present embodiment is an electrically insulating resin, such as a synthetic resin made primarily of a black epoxy resin. In the step of forming the sealing resin 860 (sealing resin forming step), the sealing resin 860 is formed on the base 810 so as to cover the semiconductor element 841 without leaving any portions exposed.

Figure 21:
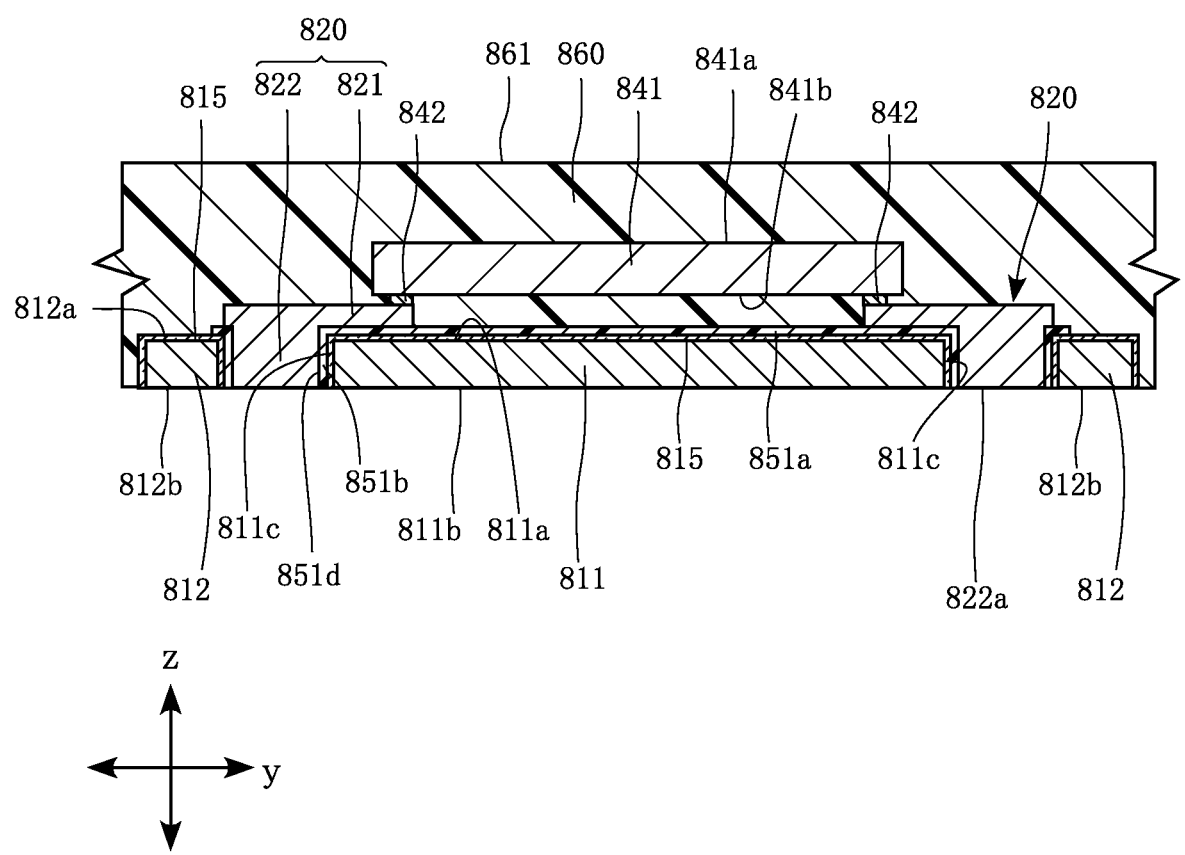
FIG. 21 is a sectional view showing a manufacturing step (grinding step) of the semiconductor device shown in FIG. 1.
Figure 22:
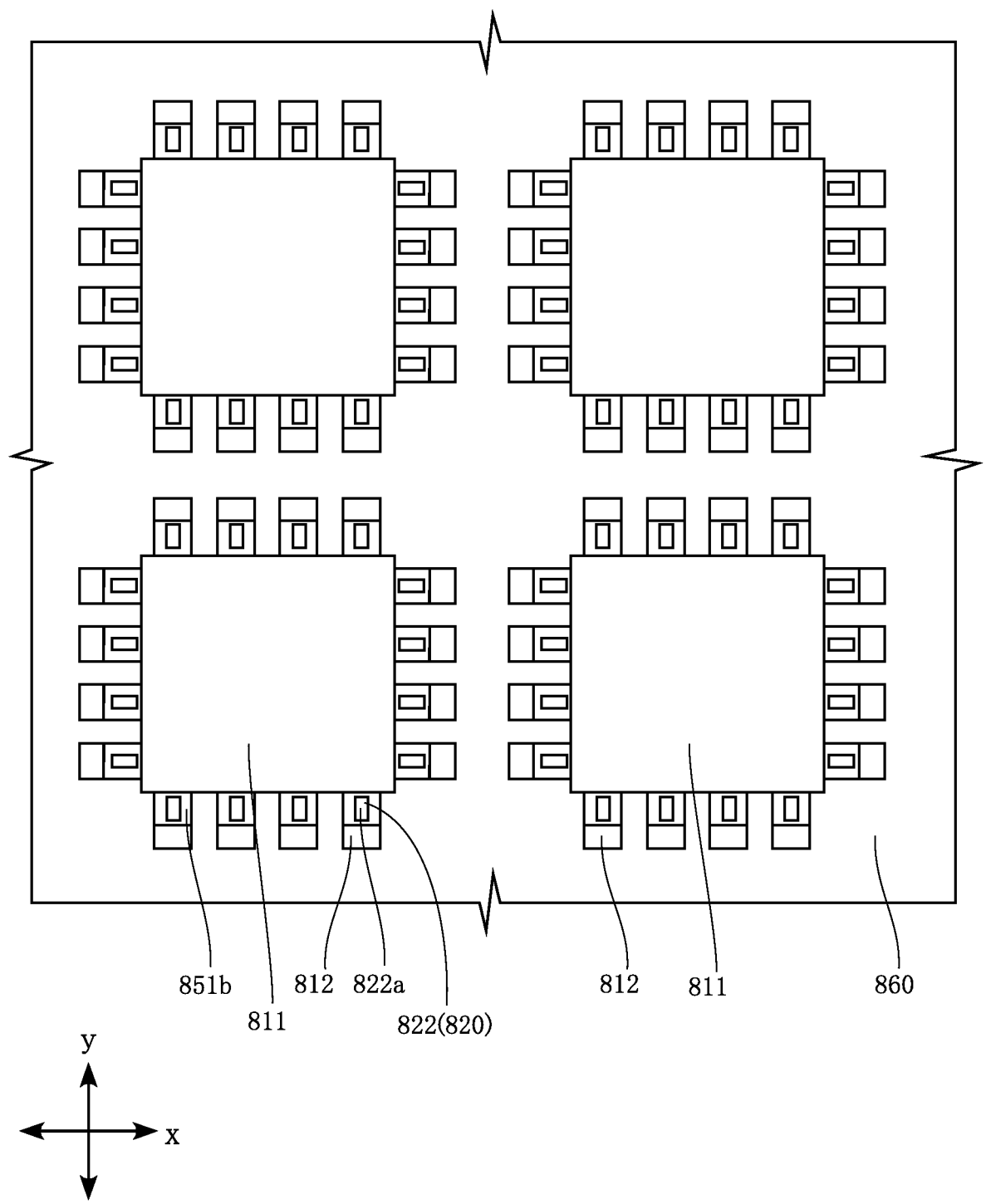
FIG. 22 is a bottom view showing a manufacturing step (grinding step) of the semiconductor device shown in FIG. 1.

Subsequently, the base 810 is ground from the back surface 810b as shown in FIGS. 21 and 22. In the step of grinding the base 810 (grinding step), the base is ground until the first electrodes 820 (second conductive portions 822) is exposed. The grinding step removes any portion of the base 810 located below the recessed portion 801 in the thickness direction z. The grinding step also removes the portion of the insulating layer 815 covering the bottom surface 801a of the recessed portion 801, so that a region of each second conductive portion 822 is exposed to form an exposed surface 822a. The exposed surfaces 822a correspond to the connecting surfaces 221 of the second conductive portion 22 of the semiconductor device A10. Also, the grinding step divides the base 810 into a substrate 811 and a plurality of substrates 812. The substrate 811 corresponds to the substrate 11 of the semiconductor device A10, and the substrates 812 to the substrates 12. The substrate 811 is where the semiconductor element 841 is mounted. The substrates 812 are spaced apart from the substrate 811. The substrate 811 and the substrates 812 are relatively fixed by the sealing resin 860. Between the substrate 811 and each substrate 812, the second conductive portion 822 of a first electrode 820 and a second portion 851b of the resin layer 851 are disposed.

Figure 23:
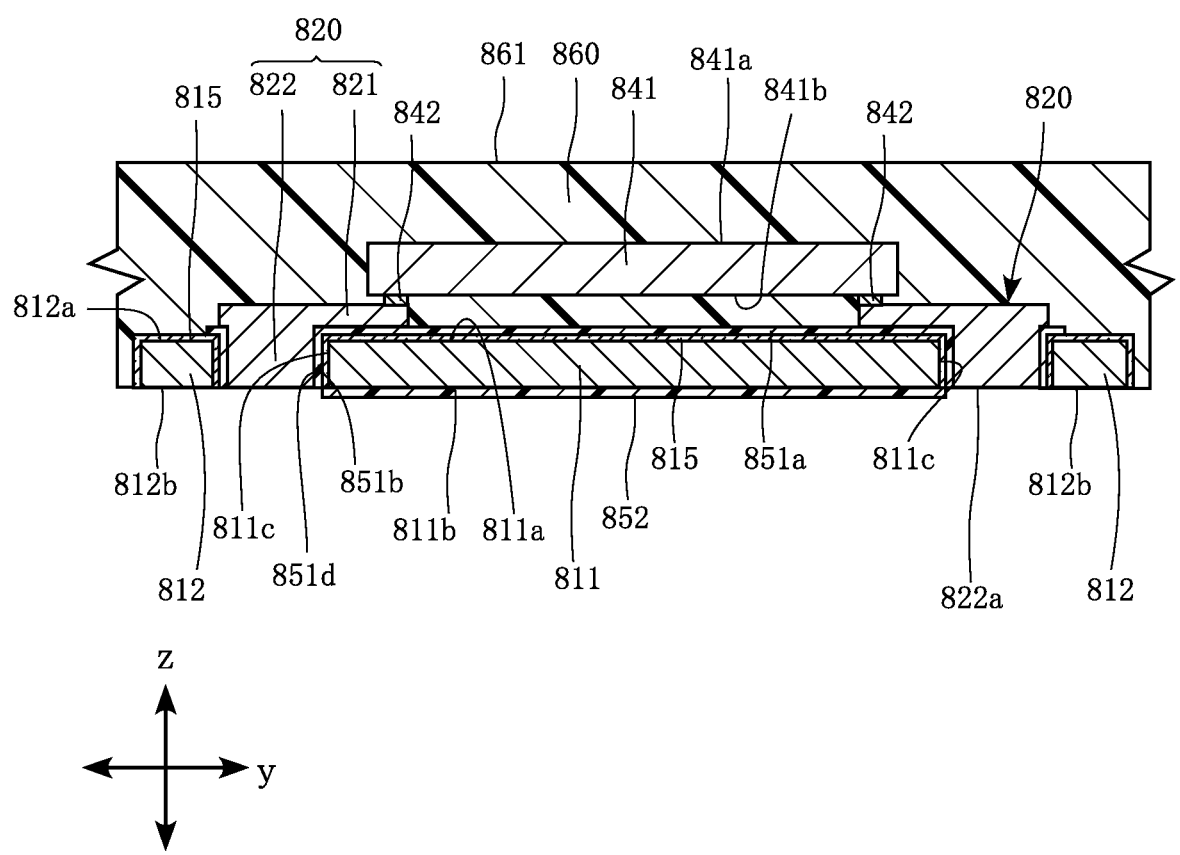
FIG. 23 is a sectional view showing a manufacturing step (external resin layer forming step) of the semiconductor device shown in FIG. 1.
Figure 24:
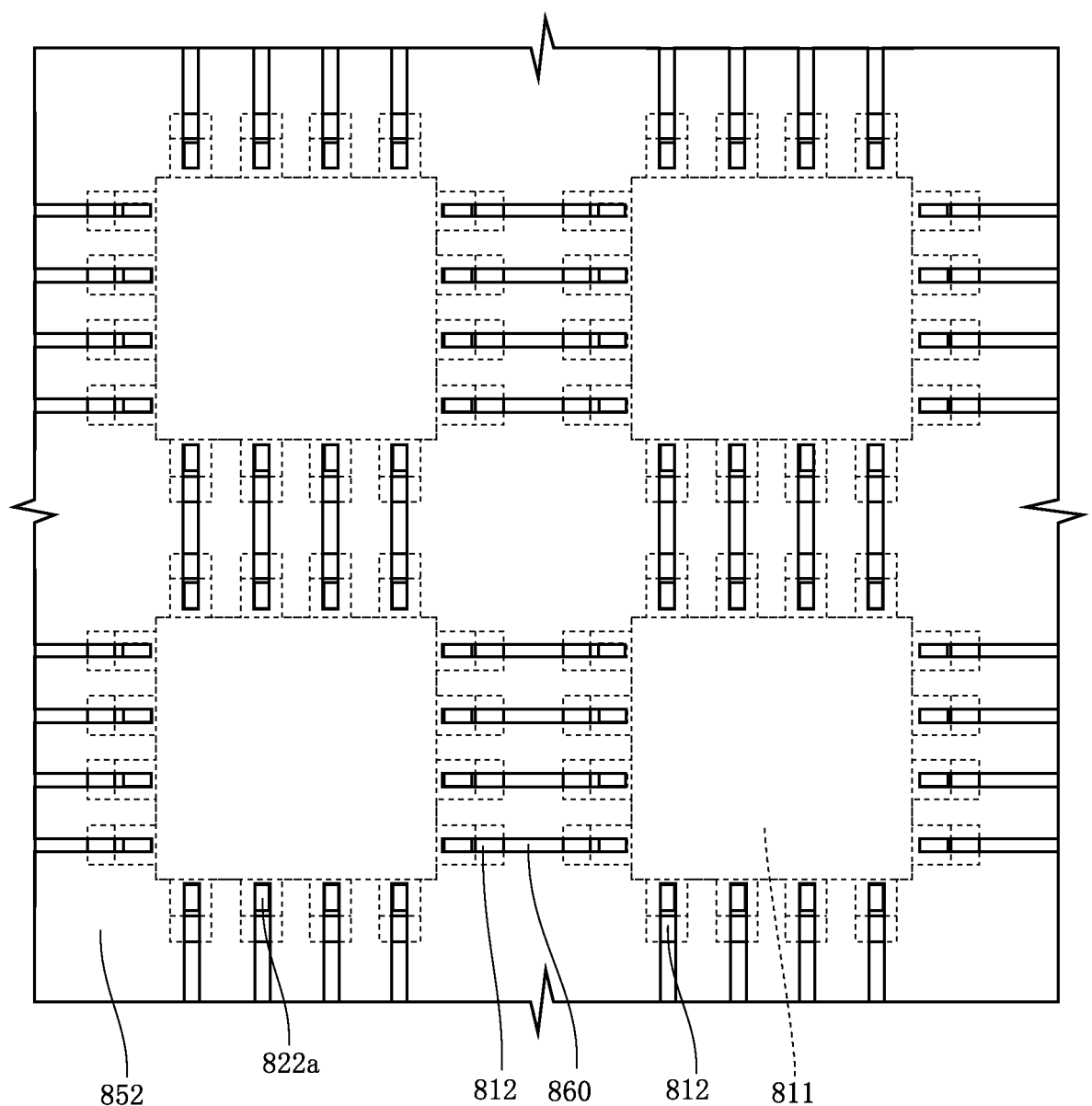
FIG. 24 is a bottom view showing a manufacturing step (external resin layer forming step) of the semiconductor device shown in FIG. 1.

Subsequently, a resin layer 852 is formed as shown in FIGS. 23 and 24. The resin layer 852 corresponds to the external resin layer 52 of the semiconductor device A10. The step of forming the resin layer 852 (external resin layer forming step) is performed by screen printing. The resin layer 852 has openings through which portions of the back surfaces of the substrates 812, portions of the second portions 851b of the resin layer 851 and the exposed surfaces 822a are exposed. In this way, the resin layer 852 is formed as shown in FIGS. 23 and 24.

Figure 25:
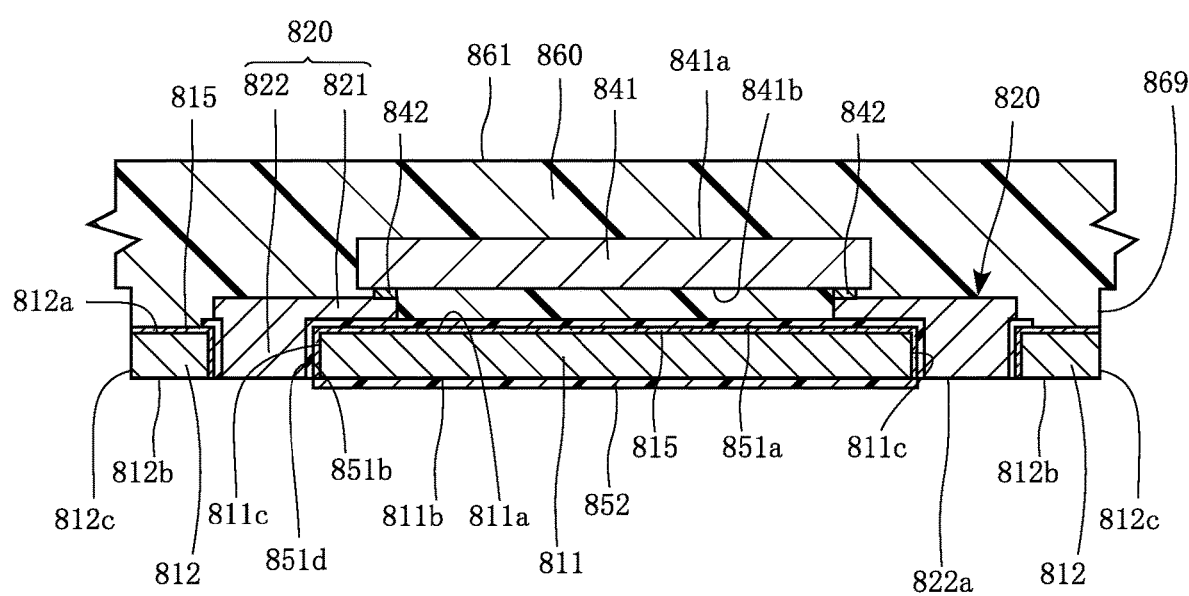
FIG. 25 is a sectional view showing a manufacturing step (side surface exposing step) of the semiconductor device shown in FIG. 1.
Figure 26:
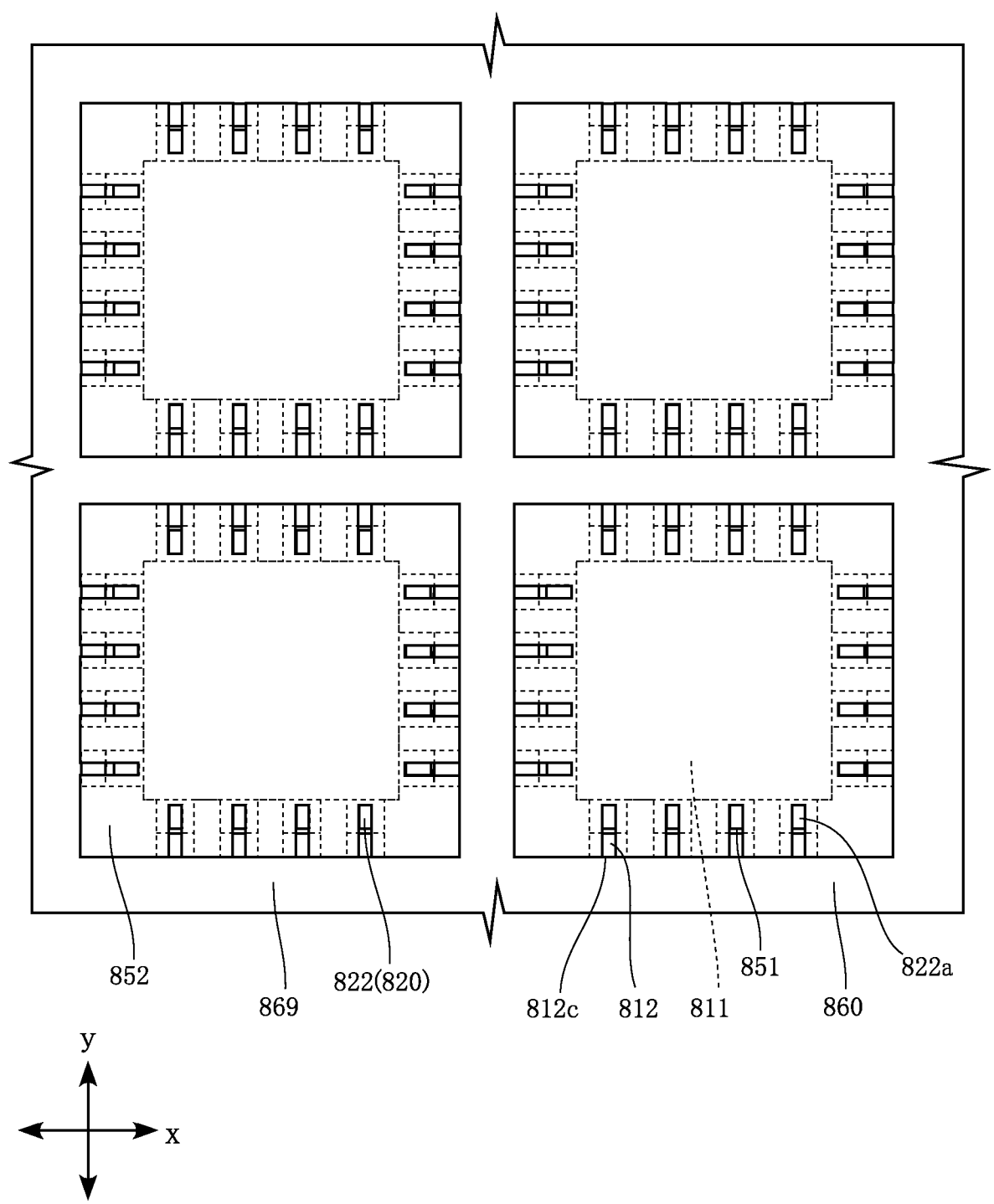
FIG. 26 is a bottom view showing a manufacturing step (side surface exposing step) of the semiconductor device shown in FIG. 1.

Subsequently, as shown in FIGS. 25 and 26, a step is performed to expose the surface (second side surface 812c) of each substrate 812 opposite to the surface facing toward the substrate 811. The second side surface 812c corresponds to the exposed side surface 123a of a substrate 12 of the semiconductor device A10. The step of exposing the second side surface 812c (side surface exposing step) involves forming grooves 869 in the back surface of the sealing resin 860 by half-cut dicing with blade dicing. In the present embodiment, the grooves 869 include those extending in the first direction x and those extending in the second direction y crossing each other to define a grid pattern. By forming the grooves 869, the second side surfaces 812c of the substrates 812 are exposed.

Figure 27:
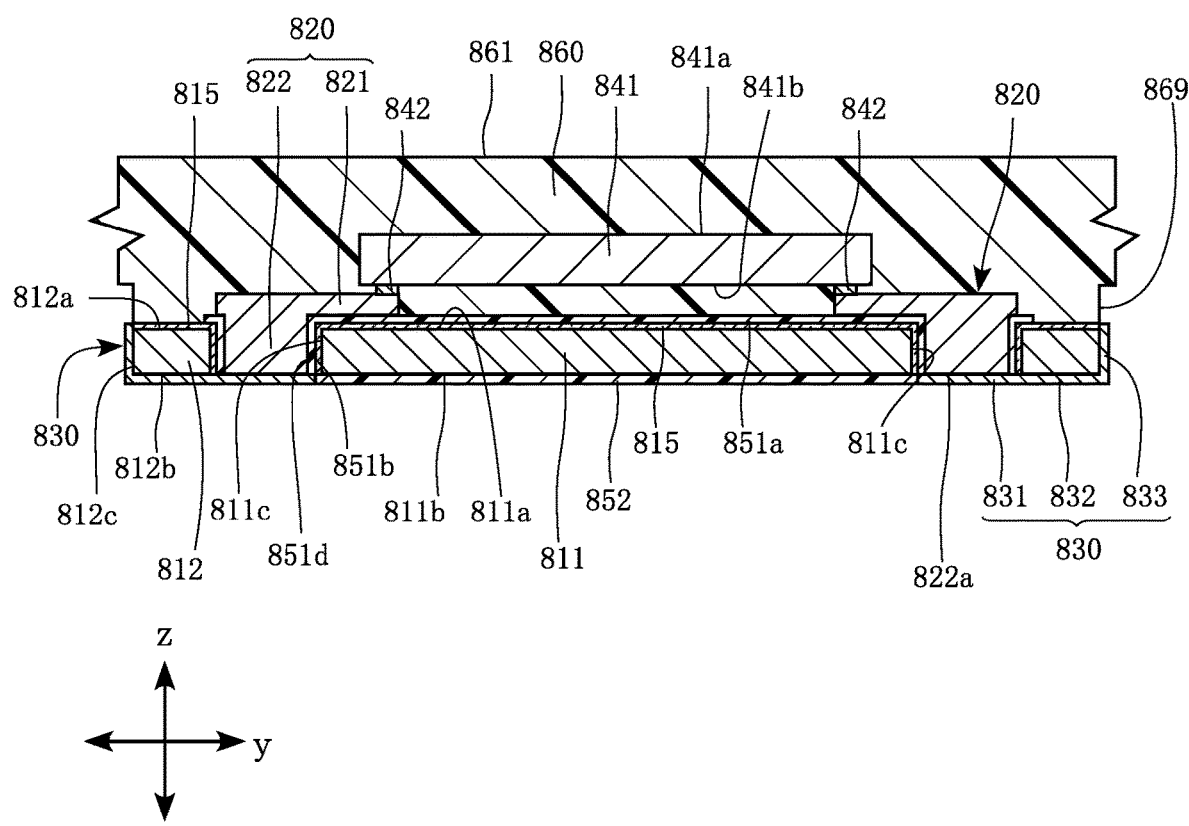
FIG. 27 is a sectional view showing a manufacturing step (second electrode forming step) of the semiconductor device shown in FIG. 1.
Figure 28:
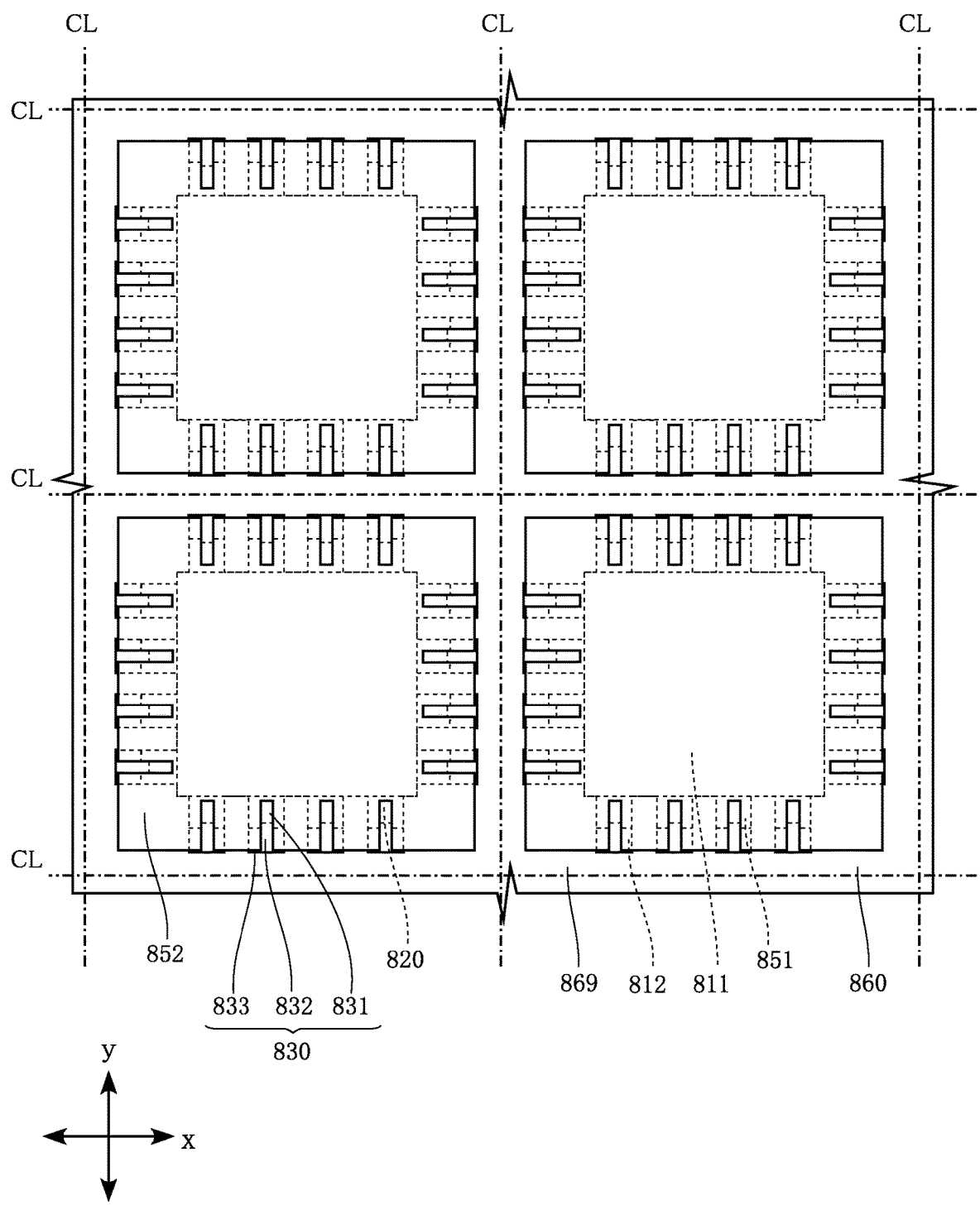
FIG. 28 is a bottom view showing a manufacturing step (second electrode forming step) of the semiconductor device shown in FIG. 1.

Subsequently, second electrodes 830 are formed as shown in FIGS. 27 and 28. The second electrodes 830 correspond to the second electrodes 30 of the semiconductor device A10. The step of forming the second electrodes 830 (second electrode forming step) is performed by electroless plating. In the present embodiment, the electroless plating is performed to sequentially deposit a Ni layer, a Pd layer and a Au layer. The Ni layer thus formed contacts and covers the exposed surface 822a of the first electrode 820, exposed from the resin layer 852, while also covering and a portion of the back surface of the substrate 812 and the second side surface 812c of the substrate 812. Then, the Pd layer is formed on the Ni layer, and the AU layer is formed on the Pd layer. This forms the second electrodes 830 as shown in FIGS. 27 and 28. In this way, the resin layer 852 is used as a mask layer defining the regions for forming the second electrodes 830. Each second electrode 830 has a first-electrode covering portion 831 covering the exposed surface 822a of a first electrode 820, a second-back-surface covering portion 832 covering a portion of the back surface of a substrate 812, and an exposed-side-surface covering portion 833 covering the second side surface 812c of the substrate 812. The exposed-side-surface covering portion 833 is formed on an inner surface of a groove 869. Although electroless plating is performed in the second electrode forming step, no second electrode 830 forms on the surfaces of the sealing resin 860 and the resin layer 852.

Then, the sealing resin 860 is cut in the first direction x and the second direction y, separating the plurality of semiconductor elements 841 into individual pieces. The step of cutting the sealing resin 860 (cutting step) is performed by blade dicing. The blade dicing uses a dicing blade that is thinner than the dicing blade used in the side surface exposing step. The cutting step may be performed by using a dicing technique other than the blade dicing, such as a laser dicing or plasma dicing. In the present embodiment, the sealing resin is cut along the cut lines CL shown in FIG. 28 to be separated into individual pieces each having one semiconductor element 841. Each piece obtained by the cutting step comprises a semiconductor device A10. As shown in FIG. 28, each cut line CL in the first direction x passes through the width center of a groove 869 extending in the first direction x in plan view. Also as shown in FIG. 28, each cut line CL in the second direction y passes through the width center of a groove 869 in the second direction y in plan view. In the present embodiment, the width of the cut formed in the cutting step is narrower than the width of the grooves 869. Thus, each side surface of a cut piece of the sealing resin 860 has a portion of a groove 869 as a recessed portion. The recessed portions thus formed correspond to the recessed portions 632 of the resin side surfaces 63 of the semiconductor device A10. The semiconductor device A10 is fabricated through the steps described above.

The following describes advantages achieved by the semiconductor device A10 and the manufacturing method according to the first embodiment.

In the semiconductor device A10, the first electrodes 20 are formed by electroplating, and the second electrodes 30 are formed by electroless plating. In other words, the wiring of the semiconductor device A10 is formed by plating and without using a lead frame formed from a metal plate. With the wiring by plating, the resulting device can be thinner than a device with a lead frame structure. The semiconductor device A10 can therefore be thinner.

The semiconductor device A10 includes the first electrodes 20 and the second electrodes 30. Each first electrode 20 is electrically connected to the semiconductor element 41 and connected to a second electrode 30 by passing between the substrate 11 and a substrate 12 that are spaced apart from each other. Each second electrode 30 formed by electroless plating is exposed to the outside of the semiconductor device A10 and in contact with a first electrode 20 and a substrate 12. The second electrodes 30 are used as terminals when the semiconductor device A10 is mounted to a circuit board. Unlike the semiconductor device A10, a semiconductor device with a lead frame structure requires a manufacturing step of simultaneously cutting the lead frame and the sealing resin by, for example, blade dicing. During the dicing, the metal of the lead frame may be elongated to form burrs (metal burrs) on cut faces. Such metal burrs may cause a defective connection between the leads and a mounting circuit board, which may result in improper mounting. Additionally, such metal burrs can cause a short circuit between adjacent leads, which may lead to malfunction. In contrast, the semiconductor device A10 includes the second electrodes 30 formed by electroless plating, and the method for manufacturing the semiconductor device A10 does not require cutting the second electrodes 30 (second electrodes 830). Consequently, the generation metal burrs at the external connection terminals (second electrodes 30) is reduced or eliminated. In this way, the semiconductor device A10 is configured to prevent improper mounting and malfunction caused by metal burrs.

As shown in FIG. 6, the semiconductor device A10 has a connecting surface 221 that is flush with a second back surface 122. This configuration ensures that the externally exposed surface of the first-electrode covering portion 31 covering the connecting surface 221 is flush with the externally exposed surface of the second-back-surface covering portion 32 covering the second back surface 122. Hence, the second electrode 30 has a flat bottom surface.

The semiconductor device A10 includes the second electrodes 30 each having an exposed-side-surface covering portion 33. When the semiconductor device A10 is mounted to, e.g., a circuit board, solder is used for bonding and electrical conduction. Without the exposed-side-surface covering portion 33, it would be necessary to check the first-electrode covering portion 31 and the second-back-surface covering portion 32 to see whether proper solder connection is made to the circuit board, which may require the use of an x-ray inspection device, for example. In contrast, the semiconductor device A10 of the present embodiment can be bonded and electrically connected to a circuit board by forming solder that covers the exposed-side-surface covering portion 33. Such solder connections can be visually inspected from the side of the semiconductor device A10.

The semiconductor device A10 includes the second electrodes 30 each of which has a first-electrode covering portion 31, a second-back-surface covering portion 32 and an exposed-side-surface covering portion 33. As shown in FIGS. 3 and 4, all of these portions of the second electrodes overlap with the sealing resin 60 in plan view. In other words, no portions of the second electrodes protrude out of the sealing resin 60 in plan view. This configuration can provide the semiconductor device A10 in a leadless package. It is especially noted that the semiconductor device A10 includes a plurality of substrates 12 spaced apart from each other, and each substrate 12 is covered by a second electrode 30. The present embodiment can therefore provide the semiconductor device A10 in a QFN package.

The semiconductor device A10 includes the substrates 12 that are made of silicon. In electroless plating, metal deposits on silicon, as well as on a metal such as Cu contained in the first electrodes 20. Thus, by the electroless plating in the second electrode forming step, the second electrodes 830 (second electrodes 30 of the semiconductor device A10) are formed simultaneously on the substrates 812 (substrates 12 of the semiconductor device A10) and the first electrodes 820 (first electrodes 20 of the semiconductor device A10). It means that the first-electrode covering portion 831, the second-back-surface covering portion 832 and the exposed-side-surface covering portion 833 (respectively corresponding to the first-electrode covering portion 31, the second-back-surface covering portion 32 and the exposed-side-surface covering portion 33 of the semiconductor device A10) are simultaneously formed in the second electrode forming step.

Figure 29:
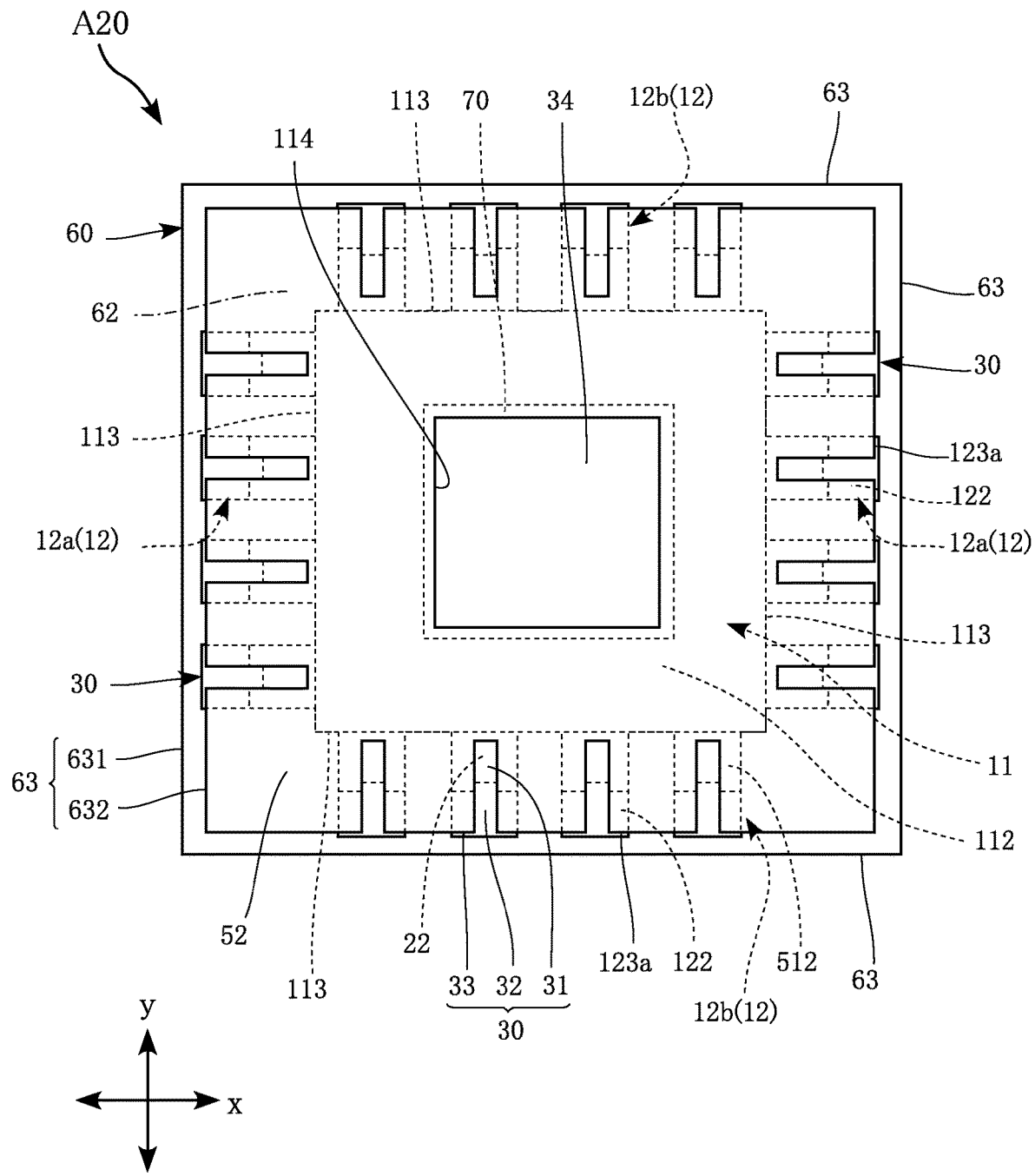
FIG. 29 is a bottom view of a semiconductor device according to a second embodiment.
Figure 30:
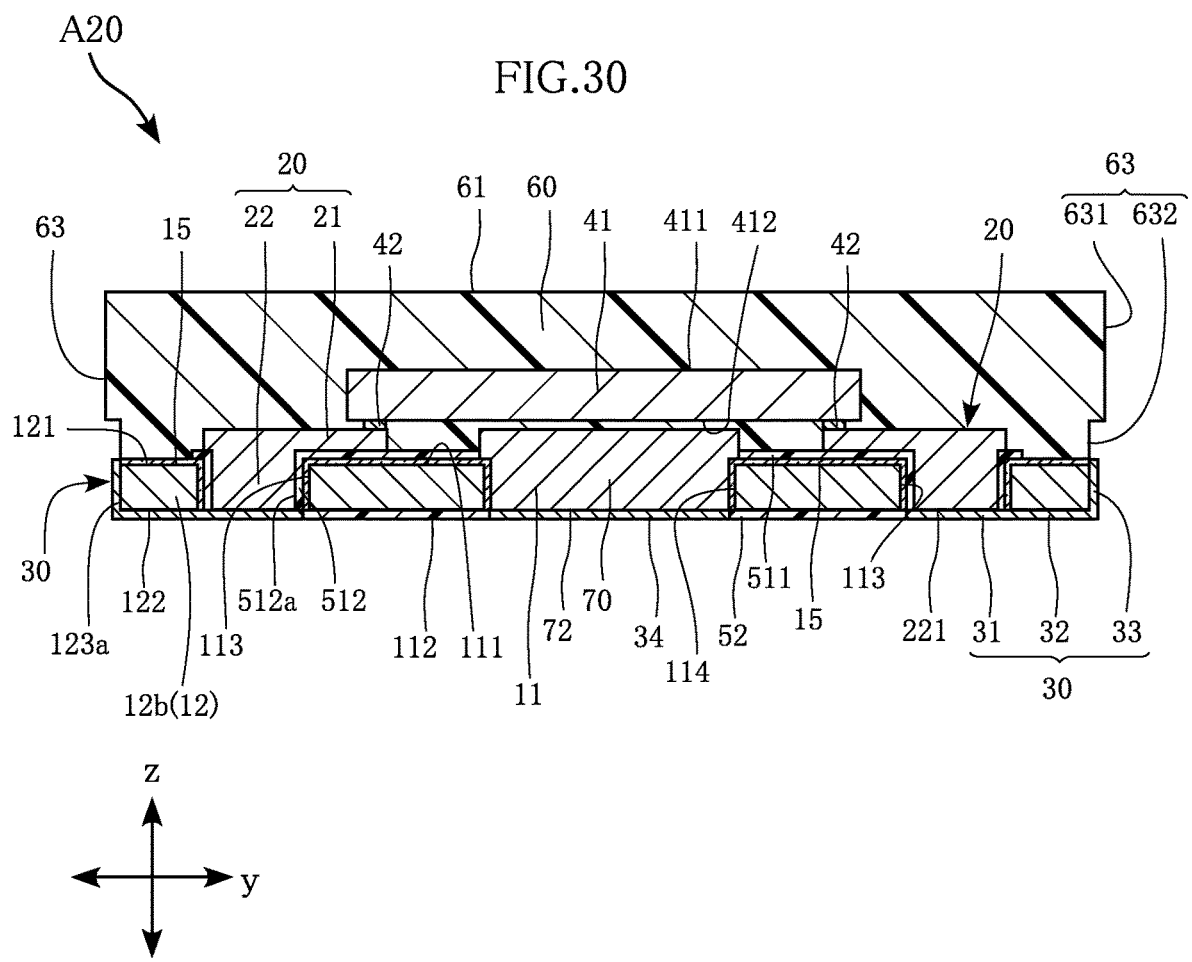
FIG. 30 is a sectional view of the semiconductor device according to the second embodiment.

FIGS. 29 to 30 show a semiconductor device according to a second embodiment. In the following description, the elements similar to or the same as those in the first embodiment are denoted by the same reference signs, and redundant description thereof is omitted. Unlike the semiconductor device A10 of the first embodiment, the semiconductor device A20 of the present embodiment includes a heat dissipating layer 70.

FIG. 29 is a bottom view of the semiconductor device A20. FIG. 30 is a sectional view of the semiconductor device A20, corresponding to the section shown in FIG. 6 of the first embodiment.

As shown in FIG. 30, the substrate 11 of the present embodiment includes a through hole 114 extending from the first front surface 111 to the first back surface 112 in the thickness direction z. As shown in FIG. 29, the through hole 114 is rectangular in plan view. The through hole 114 is filled with heat dissipating layer 70.

The heat dissipating layer 70 releases the heat from the semiconductor element 41. In the present embodiment, the heat dissipating layer 70 is made of the same material as the first electrode 20. That is, the heat dissipating layer 70 is made of metal containing Cu. As shown in FIG. 30, the heat dissipating layer 70 is disposed opposite to the element back surface 412 of the semiconductor element 41 in the thickness direction z. As shown in FIG. 29, the heat dissipating layer 70 is rectangular in plan view. The heat dissipating layer 70 overlaps with the semiconductor element 41 in plan view. Also, the heat dissipating layer 70 is located at the same position as the first electrode 20 (second conductive portion 22) in the thickness direction z. As shown in FIG. 30, the heat dissipating layer 70 of the present embodiment is spaced apart from the semiconductor element 41 in the thickness direction z, and the sealing resin 60 is present in the region between the heat dissipating layer 70 and the semiconductor element 41. The heat dissipating layer 70 may be in direct contact with the semiconductor element 41 or fixed to the semiconductor element 41 via a connector. The heat dissipating layer 70 has a heat-dissipating-layer back surface 72.

The heat-dissipating-layer back surface 72 faces in the same direction as the first back surface 112 faces. The heat-dissipating-layer back surface 72 is flush with the first back surface 112. The heat-dissipating-layer back surface 72 is exposed from the external resin layer 52.

As shown in FIGS. 29 and 30, the present embodiment includes a heat-dissipating-layer back-surface covering portion 34 as an additional second electrode 30. The heat-dissipating-layer back-surface covering portion 34 covers the heat-dissipating-layer back surface 72. The heat-dissipating-layer back-surface covering portion 34 is formed by electroless plating in the second electrode forming step, which is described in the first embodiment. The heat-dissipating-layer back-surface covering portion 34 is formed simultaneously with the first-electrode covering portion 31, the second-back-surface covering portion 32 and the exposed-side-surface covering portion 33. Instead of the heat-dissipating-layer back-surface covering portion 34, the external resin layer 52 may be used to cover the heat-dissipating-layer back surface 72. However, covering by the heat-dissipating-layer back-surface covering portion 34 is preferred for improving the heat dissipation efficiency of the heat dissipating layer 70.

Figure 31:
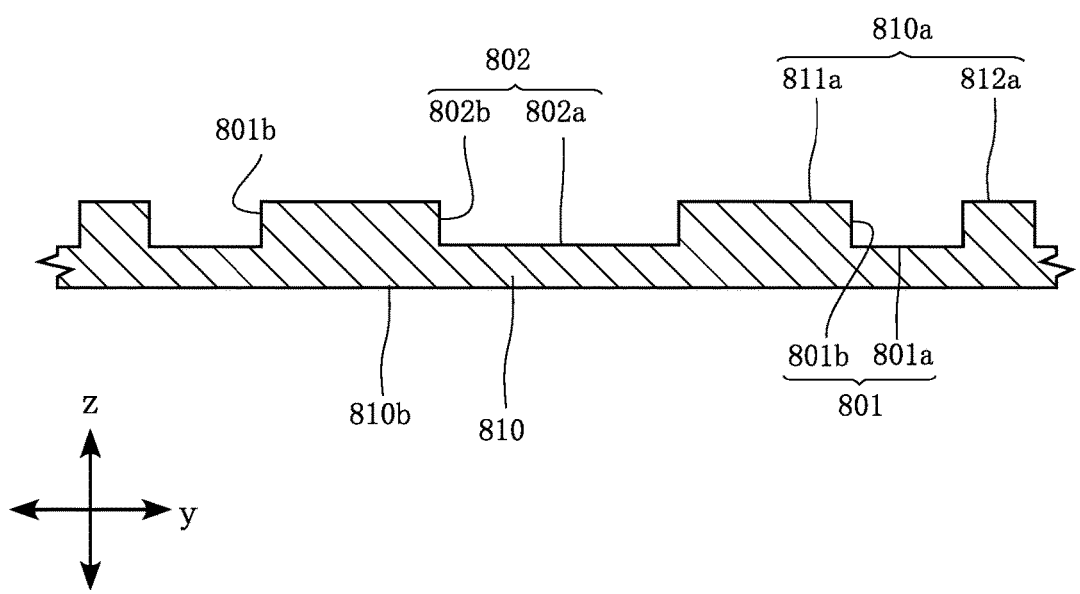
FIG. 31 is a sectional view showing a manufacturing step (recess forming step) of the semiconductor device shown in FIG. 29.
Figure 32:
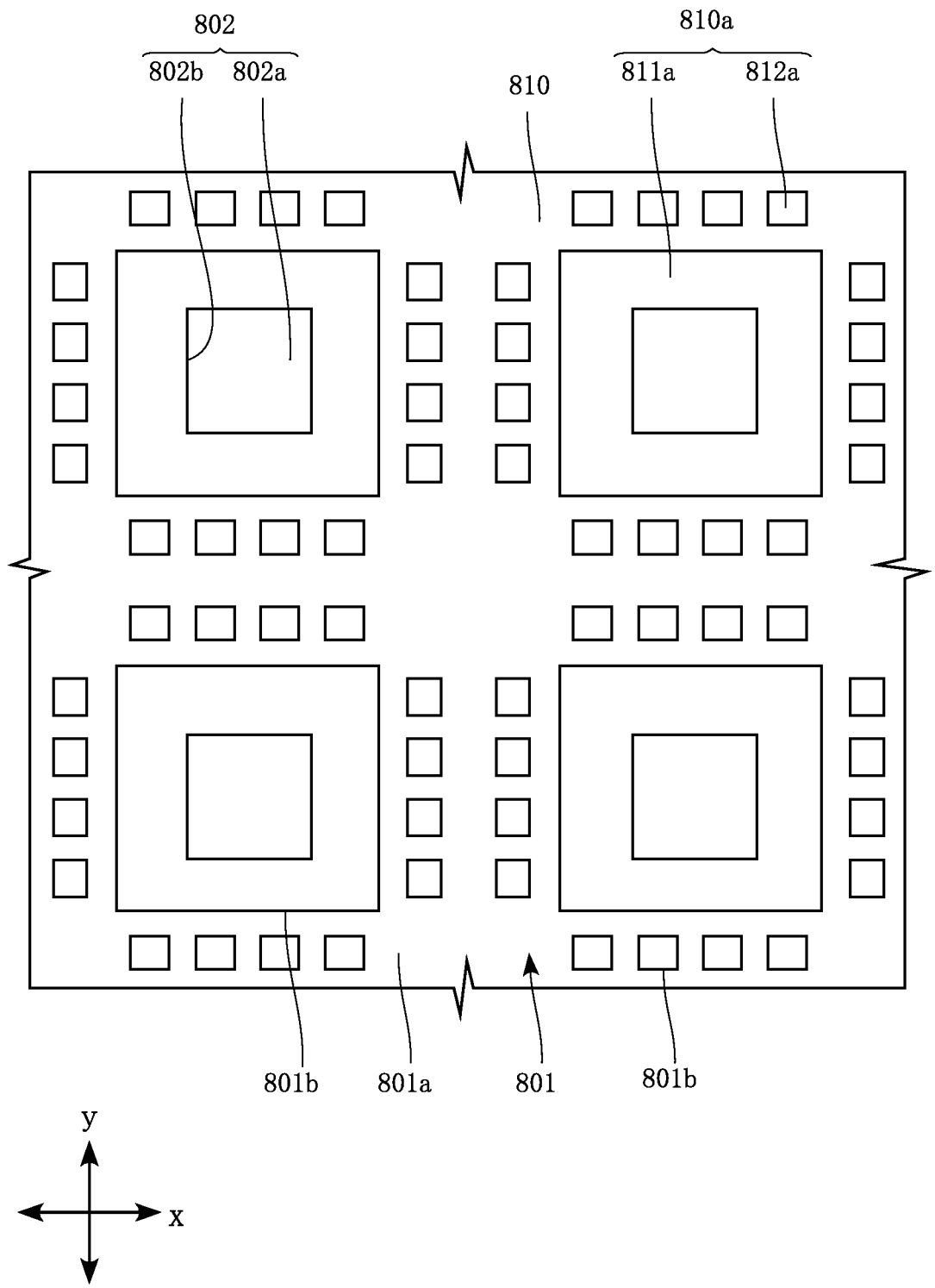
FIG. 32 is a plan view showing a manufacturing step (recess forming step) of the semiconductor device shown in FIG. 29.

With reference to FIGS. 31 to 35, the following describes an example of a method for forming a semiconductor device A20. Note that description is omitted for the steps common to the method for forming a semiconductor device A10 according to the first embodiment. FIGS. 31 and 33 to 35 are sectional views showing manufacturing steps of the semiconductor device A20, taken along the same plane as the section shown in FIG. 30. FIG. 32 is a plan view showing a manufacturing step of the semiconductor device A20.

Similarly to the manufacturing method according to the first embodiment, a base 810 having a front surface 810*a* and a back surface 810*b* facing in the thickness direction z is prepared. Then, the base 810 is processed to form a recessed portion 801 that is recessed from the front surface 810*a* in the thickness direction z. In the present embodiment, when the recessed portion 801 is formed, a recessed portion 802 that is recessed in the thickness direction z is also formed. The recessed portion 801 and the recessed portion 802 maybe formed simultaneously or separately. The recessed portion 802 is spaced apart from the recessed portion 801. The recessed portion 802 has a bottom surface 802*a* and standing surfaces 802*b*. The bottom surface 802*a* is rectangular in plan view. The bottom surface 802*a* is located at the same position as the bottom surface 801*a* of the recessed portion 801 in the thickness direction z. The bottom surface 802*a* is surrounded by the first front surface 811*a* in plan view. As shown in FIG. 31, each standing surface 802*b* has an upper edge on the first front surface 811*a* and a lower edge on the bottom surface 802*a*. The standing surface 802*b* stands on the bottom surface 802*a* and is perpendicular to the bottom surface 802*a*. Similarly to the recessed portion 801, the recessed portion 802 is formed by dry etching. Alternatively, the recessed portion 802 may be formed by wet etching as in the first embodiment.

Figure 33:
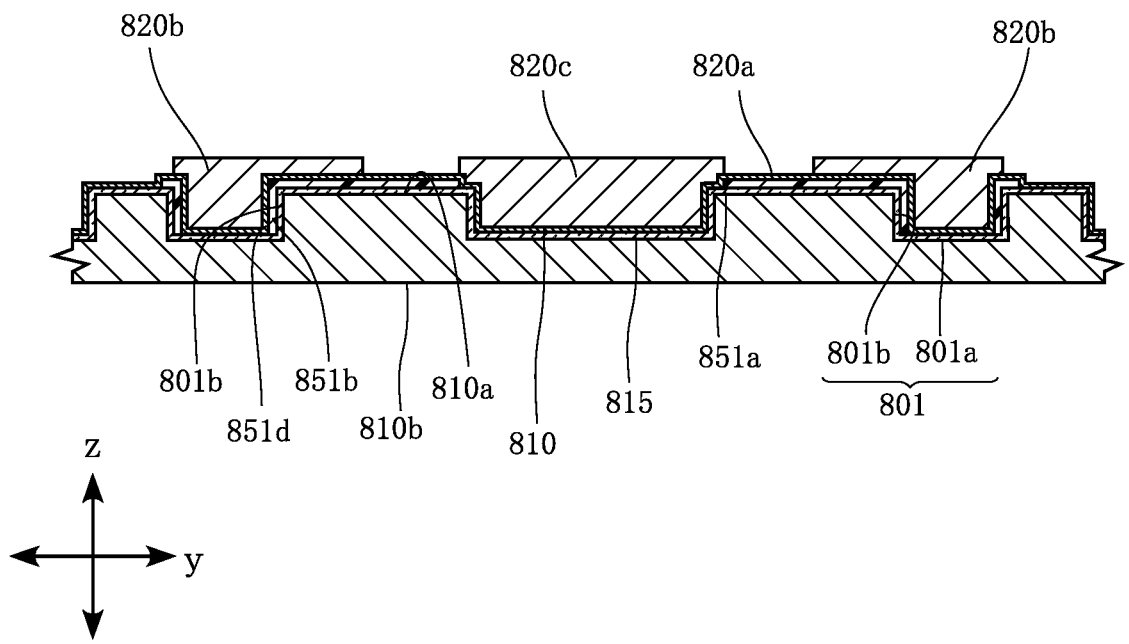
FIG. 33 is a sectional view showing a manufacturing step (plating layer forming step) of the semiconductor device shown in FIG. 29.

Then, similarly to the manufacturing method of the first embodiment, the insulating layer forming step, the internal resin layer forming step, the base layer forming step and the plating layer forming step are performed. Thus, different from the first embodiment, a plating layer 820*c* filling the recessed portion 802 is formed as shown in FIG. 33. The plating layer 820*c* has the same property (e.g., made of the same material) as the plating layer 820*b*.

Figure 34:
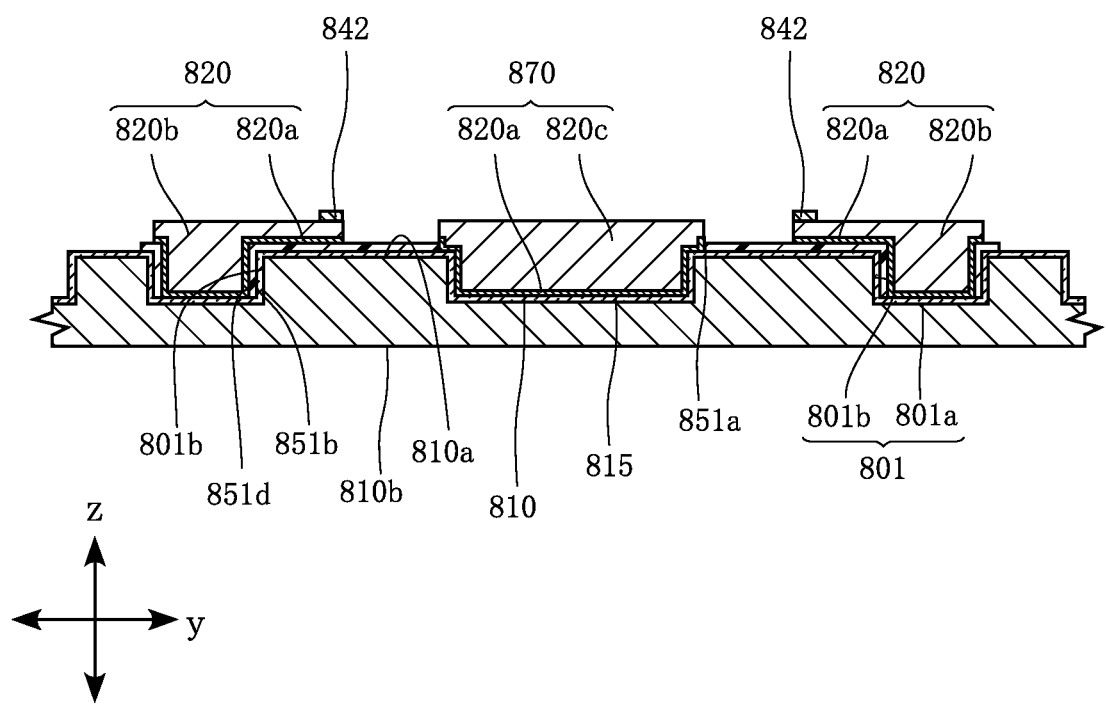
FIG. 34 is a sectional view showing a manufacturing step (base layer removal step) of the semiconductor device shown in FIG. 29.

Then, the bonding layer forming step and the base layer removal step are performed as in the manufacturing method according to the first embodiment. In the present embodiment, the base layer removal step forms a heat dissipating layer 870 as shown in FIG. 34, composed of the plating layer 820*c* and the base layer 820*a* that is covered by the plating layer 820*c*. The heat dissipating layer 870 corresponds to the heat dissipating layer 70 of the semiconductor device A20.

Figure 35:
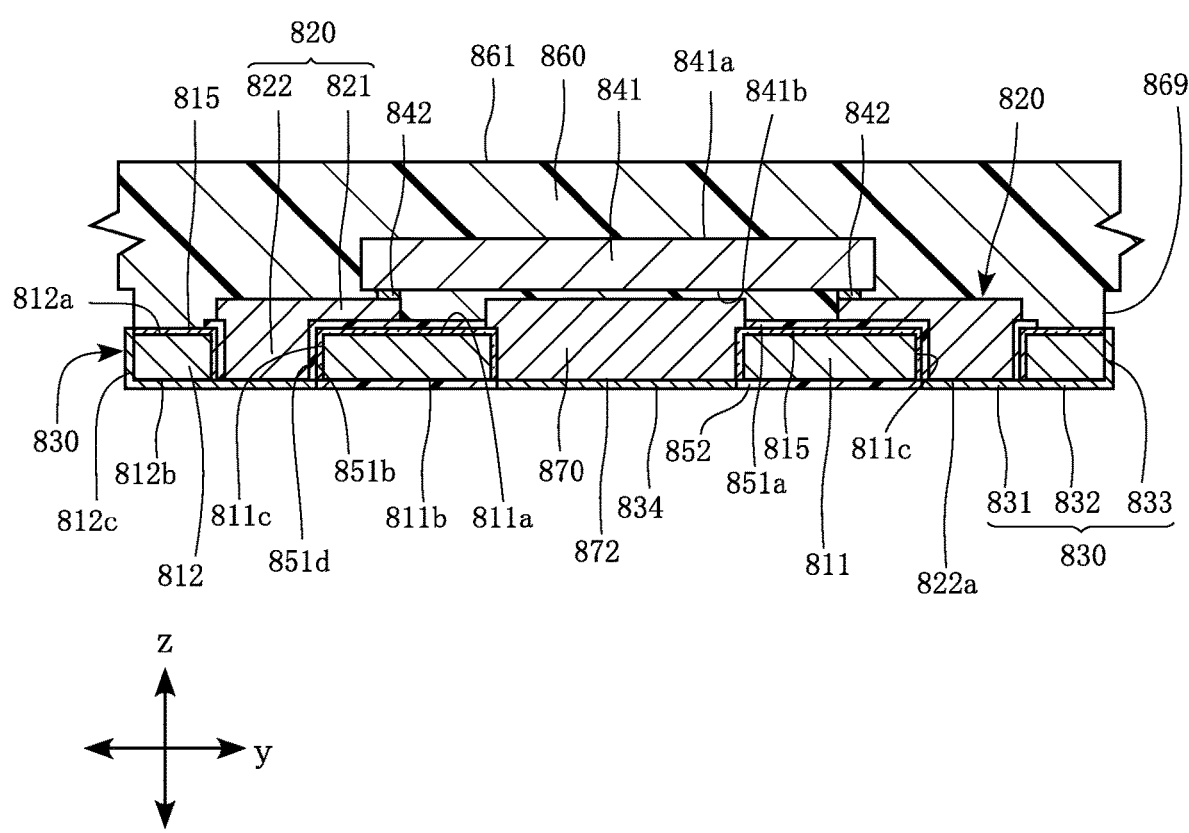
FIG. 35 is a sectional view showing a manufacturing step (second electrode forming step) of the semiconductor device shown in FIG. 29.

Then, similarly to the manufacturing method of the first embodiment, the semiconductor element mounting step, the sealing resin forming step, the grinding step, the external resin layer forming step, the side surface exposing step, the second electrode forming step and the cutting step are performed. In the present embodiment, the grinding step is performed to expose the heat dissipating layer 870 (heat-dissipating-layer back surface 872), in addition to the first electrodes 820 (second conductive portions 822). Also, the external resin layer forming step is performed such that the heat-dissipating-layer back surface 872 having been exposed is not covered by the resin layer 852 and left exposed. Consequently, in the second electrode forming step (electroless plating), a heat-dissipating-layer back-surface covering portion 834 is formed to cover the heat-dissipating-layer back surface 872 as shown in FIG. 35. The heat-dissipating-layer back-surface covering portion 834 corresponds to the heat-dissipating-layer back-surface covering portion 34 included in the second electrodes 30 of the semiconductor device A20. The semiconductor device A20 shown in FIGS. 29 and 30 is fabricated through the steps described above.

Similarly to the first embodiment, the semiconductor device A20 is configured to reduce or eliminate the generation metal burrs at the external connection terminals (second electrodes 30). The semiconductor device A20 is thus configured to prevent improper mounting and malfunction caused by metal burrs.

The semiconductor device A20 includes the heat dissipating layer 70. The heat dissipating layer 70 releases the heat from the semiconductor element 41, and therefore the semiconductor device A20 can achieve better heat dissipation than the semiconductor device A10.

Figure 36:
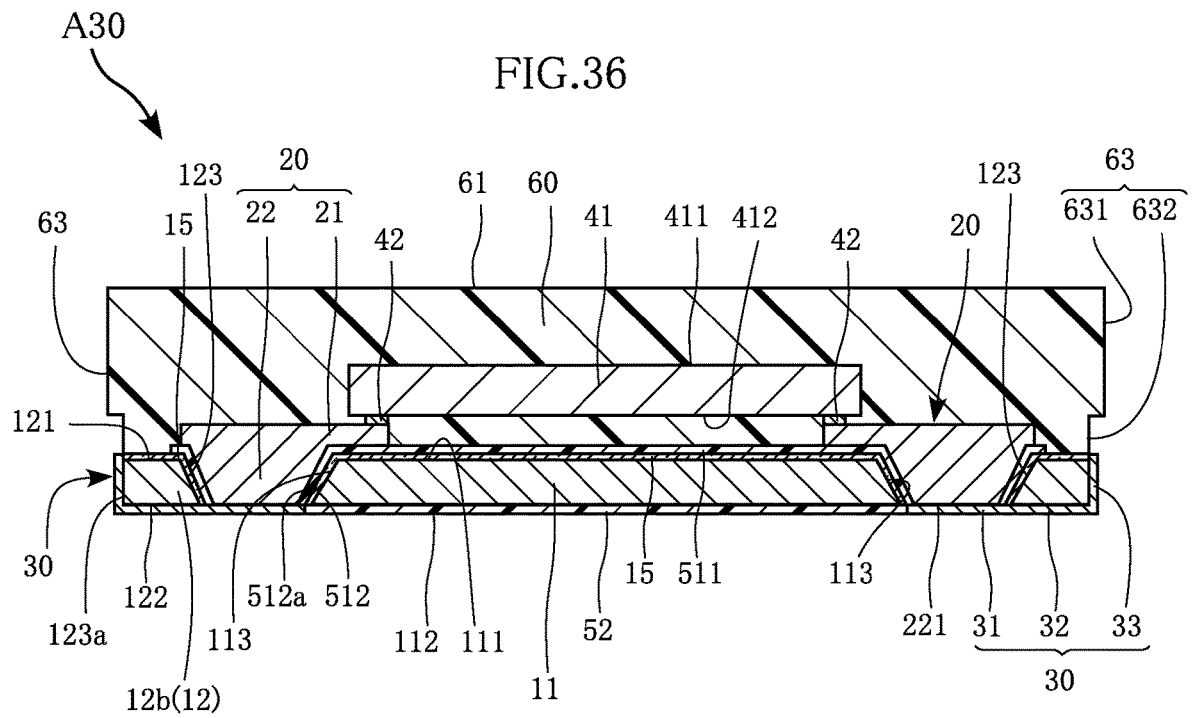
FIG. 36 is a sectional view of a semiconductor device according to a third embodiment.

FIG. 36 shows a semiconductor device according to a third embodiment. In the following description, the elements similar to or the same as those in the first and second embodiments are denoted by the same reference signs, and redundant description thereof is omitted. The semiconductor device A30 according to the present embodiment differs from the semiconductor device A10 of the first embodiment in that the first side surfaces 113 of the substrate 11 are inclined, and the second side surfaces 123 (except the exposed side surface 123*a*) of each substrate 12 are inclined.

FIG. 36 is a sectional view of the semiconductor device A30, corresponding to the section shown in FIG. 6 of the first embodiment.

The substrate 11 according to the present embodiment has the first side surfaces 113 each of which is inclined relative to the first back surface 112 as shown in FIG. 36. The first side surface 113 forms an angle of about 55° with the first back surface 112. Consequently, the first front surface 111 is smaller in size (area) than the first back surface 112. In addition, in a section taken parallel to the first back surface 112, the size of the substrate 11 is larger from the first front surface 111 toward the first back surface 112.

Each substrate 12 according to the present embodiment has the second side surfaces 123 each of which, except the exposed side surface 123a, is inclined relative to the second back surface 122. Each second side surface 123, except the exposed side surface 123a, forms an angle of about 55° with the second back surface 122. The exposed side surface 123a is perpendicular to the second front surface 121 and the second back surface 122, as in the first embodiment.

Figure 37:
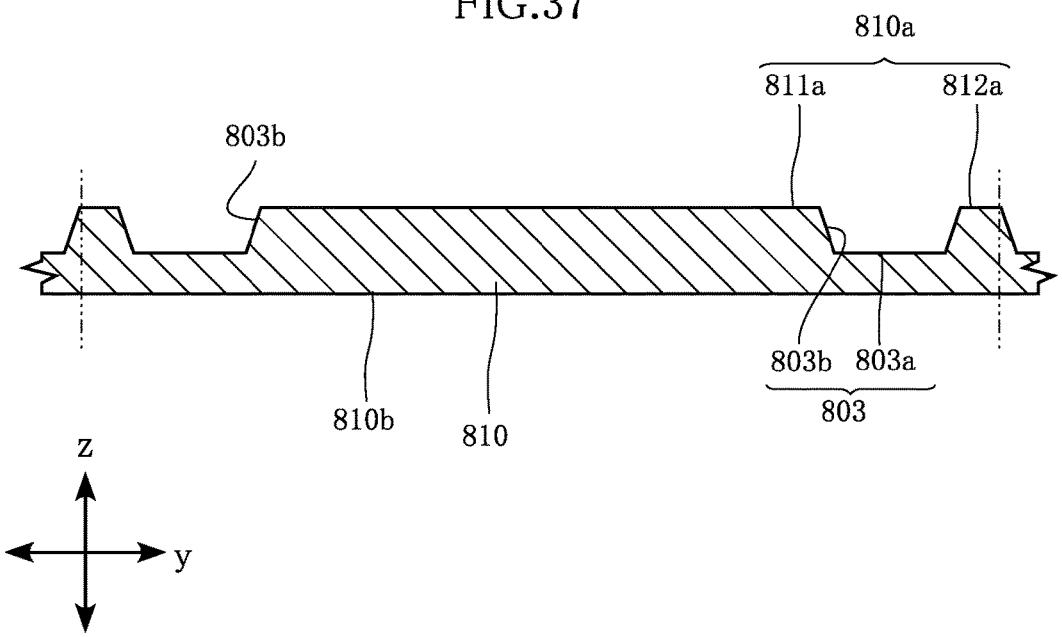
FIG. 37 is a sectional view showing a manufacturing step (recess forming step) of the semiconductor device shown in FIG. 36.
Figure 38:
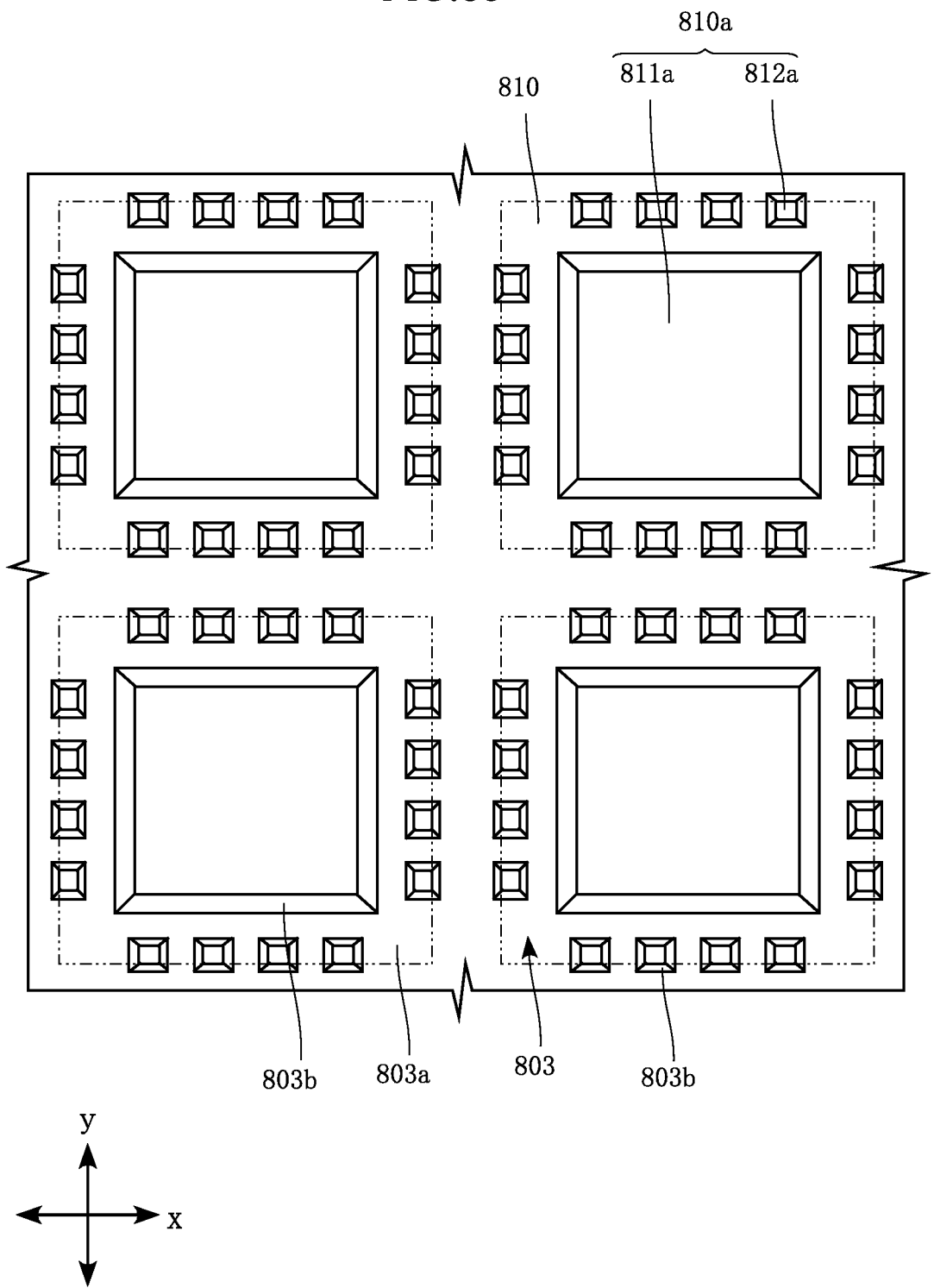
FIG. 38 is a plan view showing a manufacturing step (recess forming step) of the semiconductor device shown in FIG. 36.

With reference to FIGS. 37 to 38, the following describes an example of a method for forming a semiconductor device A30. Note that description is omitted for the steps common to the method for forming a semiconductor device A10 according to the first embodiment. The manufacturing method of the semiconductor device A30 differs in the recessed portion forming step from the manufacturing method of the semiconductor device A10.

FIG. 37 is a plan view showing a manufacturing step of the semiconductor device A30, showing the same section as FIG. 36. FIG. 38 is a plan view showing a manufacturing step of the semiconductor device A30.

The recessed portion forming step according to the present embodiment is performed by wet etching, instead of dry etching. Specifically, in the base preparing step, a (100) plane having a crystal orientation of (100) is prepared as the front surface 810a. Then, the recessed portion 803 is formed by anisotropic etching using, for example, KOH (potassium hydroxide). KOH is one example of an alkaline etching solution suitable for anisotropic etching of single-crystal Si. The recessed portion 803 has a bottom surface 803a and standing surfaces 803b. Each standing surface 803a forms an angle of about 55° with the bottom surface 803a. The etching solution is not limited to KOH and may be an alkaline solution, such as TMAH (tetramethyl ammonium hydroxide) or EDP (ethylene diamine pyrocatechol).

The subsequent steps are similar to the steps of the first embodiment. Specifically, the insulating layer forming step, the internal resin layer forming step, the base layer forming step, the plating layer forming step, the bonding layer forming step, the base layer removal step, the semiconductor element mounting step, the sealing resin forming step, the grinding step, the external resin layer grinding step, the side surface exposing step, the second electrode forming step, and the cutting step are performed. In the present embodiment, the side surface exposing step forms grooves 869 along the dash-double dot lines in FIGS. 37 and 38. Consequently, the substrate 812 is cut to have the second side surfaces 812c that are exposed to the outside and perpendicular the second back surface 812b. The semiconductor device A30 shown in FIG. 36 is fabricated through the steps described above.

Similarly to the first embodiment, the semiconductor device A30 is configured to reduce or eliminate the generation metal burrs at the external connection terminals (second electrodes 30). The semiconductor device A30 is thus configured to prevent improper mounting and malfunction caused by metal burrs.

In the semiconductor device A30, each of the first side surfaces 113 and the second side surfaces 123 (except the exposed side surfaces 123a) is inclined. The standing surfaces 803b are flared upward, as compared to the first and second embodiments (in which the standing surfaces 801b and 802b stand vertical). This configuration facilitates forming the insulating layer 815, the resin layer 851 and the base layer 820a covering a standing surface 803b each having a uniform thickness.

The present embodiment, which is without a heat dissipating layer 70, may be altered to include a heat dissipating layer 70 similar to the second embodiment.

In the first to third embodiments, each second electrode includes an exposed-side-surface covering portion 33. However, an exposed-side-surface covering portion 33 may be omitted. For example, in a variation of the first embodiment, the side surface exposing step is omitted, and thus no grooves 869 are formed. Subsequently, electroless plating is performed in the second electrode forming step to form second electrodes 30 not having exposed-side-surface covering portions 33. In this variation, preferably, the resin layer 852 formed in the external resin layer forming step may also cover regions on the cut lines CL, so that the second electrodes 830 are not to be cut when the sealing resin 860 is cut along the cut lines CL (in the cutting step). In other words, it is preferable to cause the resin layer 852 to form onto the cut lines CL, thereby hindering the formation of the second electrode 830 in the second electrode forming step. This variation does not involve cutting the second electrodes 30 (second electrodes 830), which is advantageous to reducing or eliminating the generation of metal burrs at the external connection terminals (second electrodes 30).

Figure 39:
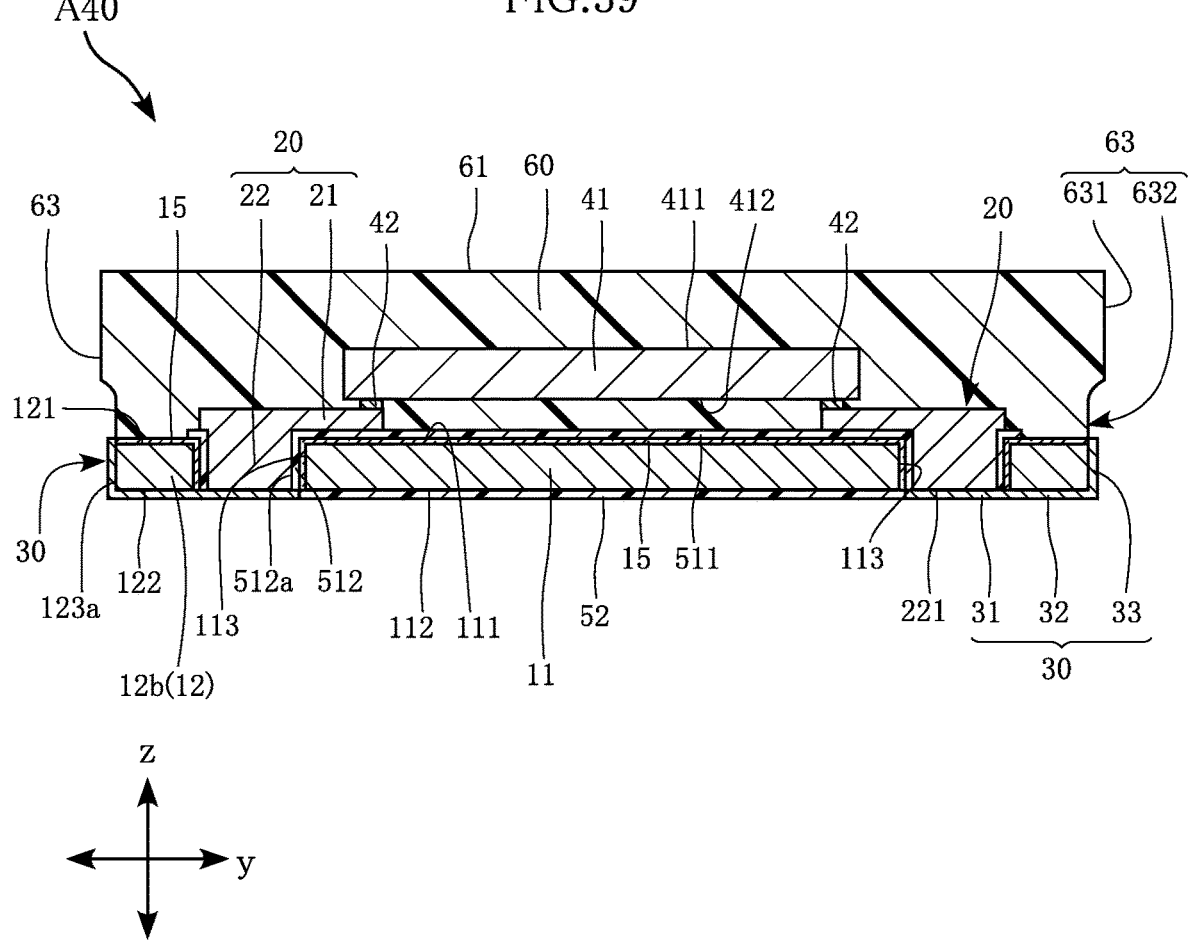
FIG. 39 is a sectional view of a semiconductor device according to a fourth embodiment.
Figure 40:
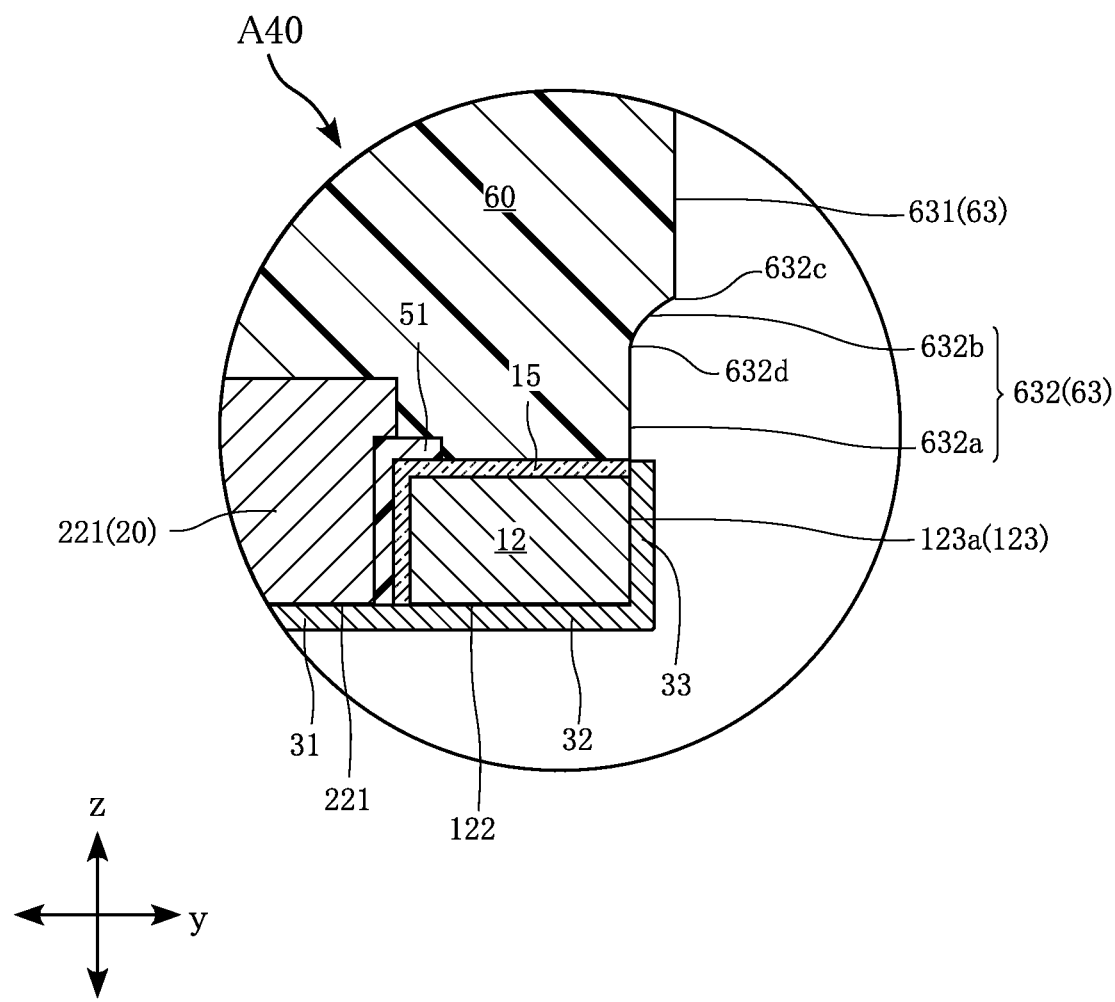
FIG. 40 is an enlarged fragmentary view of FIG. 39.

FIGS. 39 and 40 show a semiconductor device according to a fourth embodiment. The semiconductor device A40 of the fourth embodiment differs from the semiconductor device A10 in the shape of the recessed portion 632 formed in each resin side surface 63 of the sealing resin 60. FIG. 39 is a sectional view of the semiconductor device A40, corresponding to the section shown in FIG. 6. FIG. 40 is an enlarged sectional view showing a fragment of FIG. 39.

As shown in FIG. 40, each recessed portion 632 of the semiconductor device A40 has a first surface 632a and a second surface 632b. Each recessed portion 632 is connected to a flat portion 631, and the first surface 632a of the recessed portion 632 faces in the same direction as the flat portion 631 faces. The first surface 632a is substantially parallel to the thickness direction z. The first surface 632a is flush with the exposed side surface 123a of each relevant substrate 12. The second surface 632b of each recessed portion 632 is connected to the first surface 632a of the recessed portion 632 and also to the flat portion 631 of the resin side surface 63 in which the recessed portion 632 is included. The second surface 632b is curved. As shown in FIG. 40, the boundary edge 632c between the second surface 632b and the flat portion 631 is located above the boundary edge 632d between the second surface 632b and the first surface 632a in the thickness direction z. The boundary edges 632c and 632d extend in a corresponding one of the first direction x and the second direction y. In the semiconductor devices A10, A20 and A30, each recessed portion 632 also has a first surface 632a and a second surface 632b. In the semiconductor devices A10, A20 and A30, however, the second surface 632b is flat, and the two boundary edges 632c and 632d are substantially at the same position in the thickness direction z.

Figure 41:
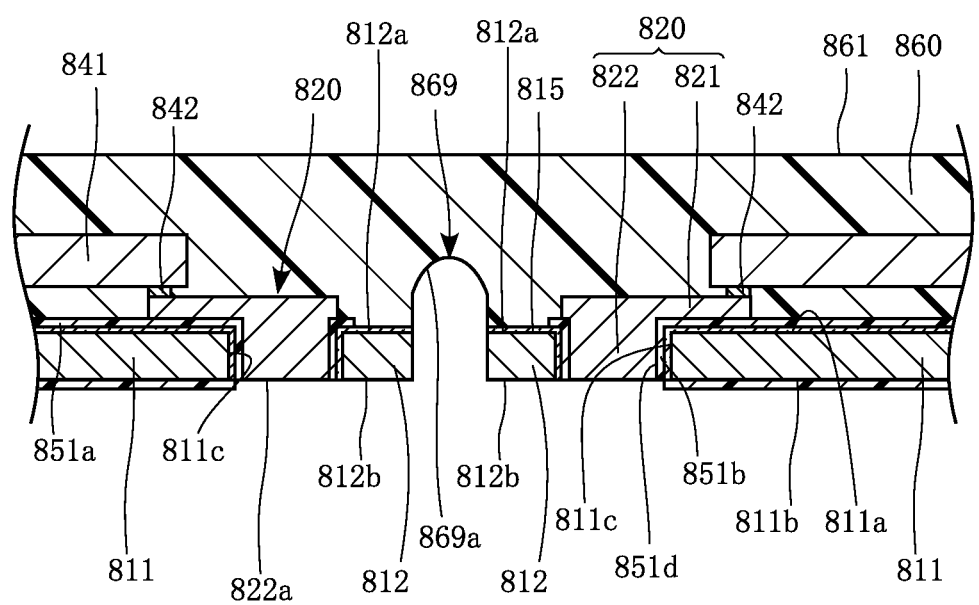
FIG. 41 is a sectional view showing a manufacturing step (recess forming step) of the semiconductor device shown in FIG. 39.

In the side surface exposing step of the semiconductor device A40, grooves 869 may be formed by half-cut dicing to have a curved bottom 869a as shown in FIG. 41. The groove 869 shown in FIG. 41 has a u-shaped profile. After the step of forming such a groove 869 having a curved bottom 869a, subsequent steps (especially the cutting step) are preformed. Then, the curved second surfaces 632b are formed. FIG. 41 is a sectional view showing a manufacturing step (recess forming step) of the semiconductor device A40 and corresponding to the section shown in FIG. 15.

The semiconductor device A40 can achieve similar advantages to those achieved by the semiconductor device A10.

FIGS. 42 to 48 show a semiconductor device according to a fifth embodiment. The semiconductor device A50 of the fifth embodiment includes a substrate 13, an insulating layer 15, first electrodes 20, second electrodes 30, a semiconductor element 41, bonding layers 42, an internal resin layer 51, an external resin layer 52 and a sealing resin 60.

Figure 42:
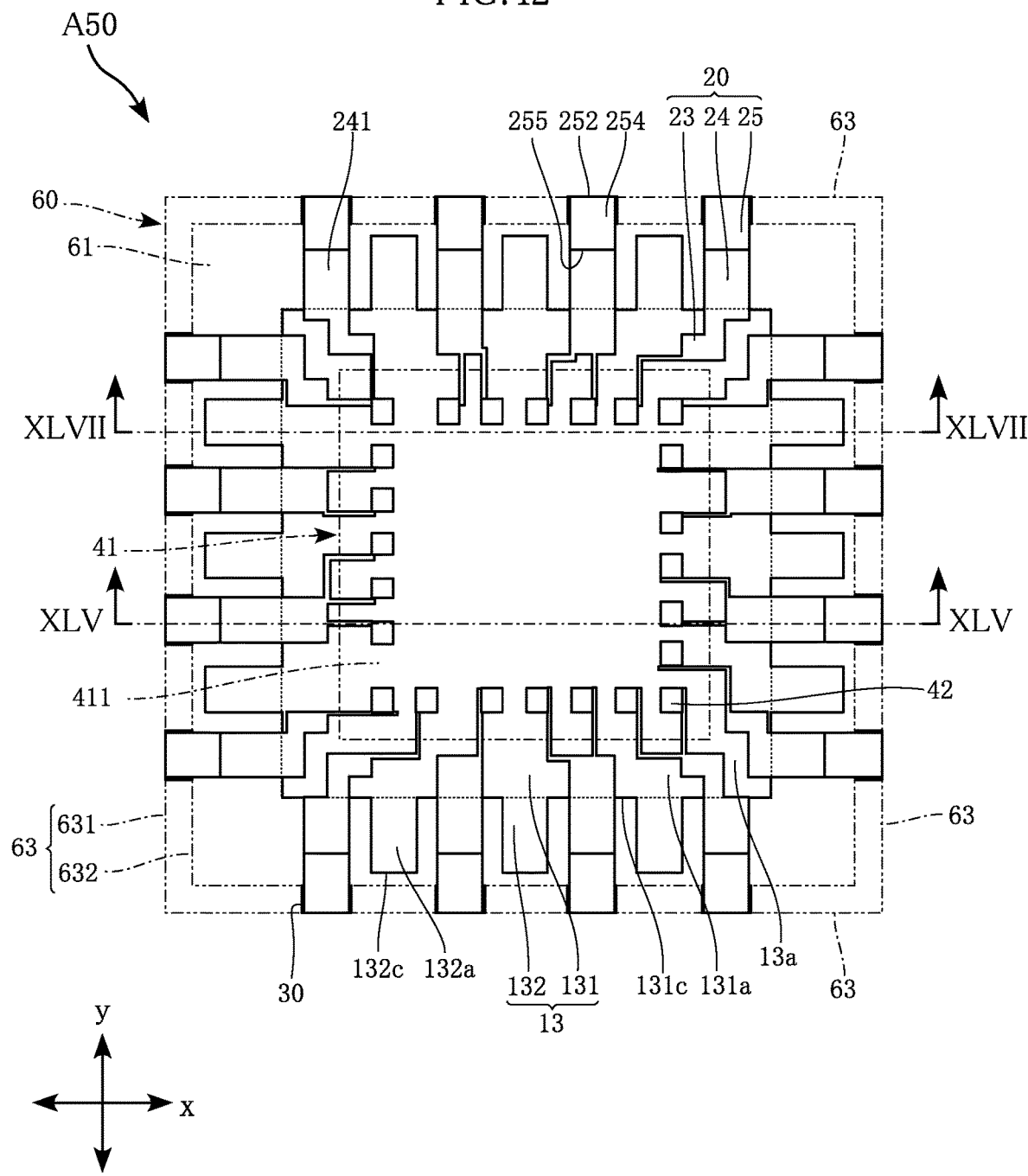
FIG. 42 is a plan view of a semiconductor device according to a fifth embodiment.
Figure 43:
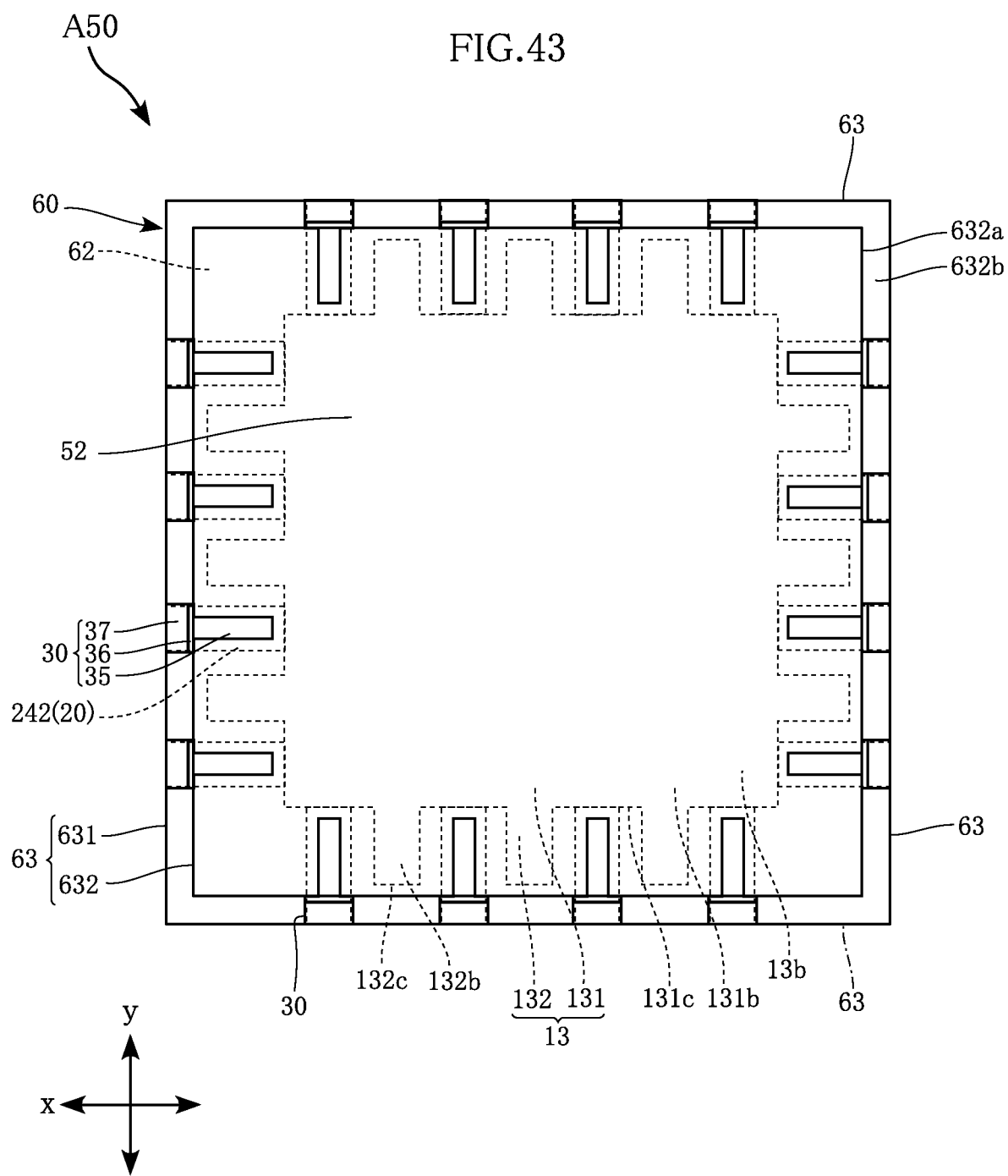
FIG. 43 is a bottom view of the semiconductor device according to the fifth embodiment.
Figure 44:
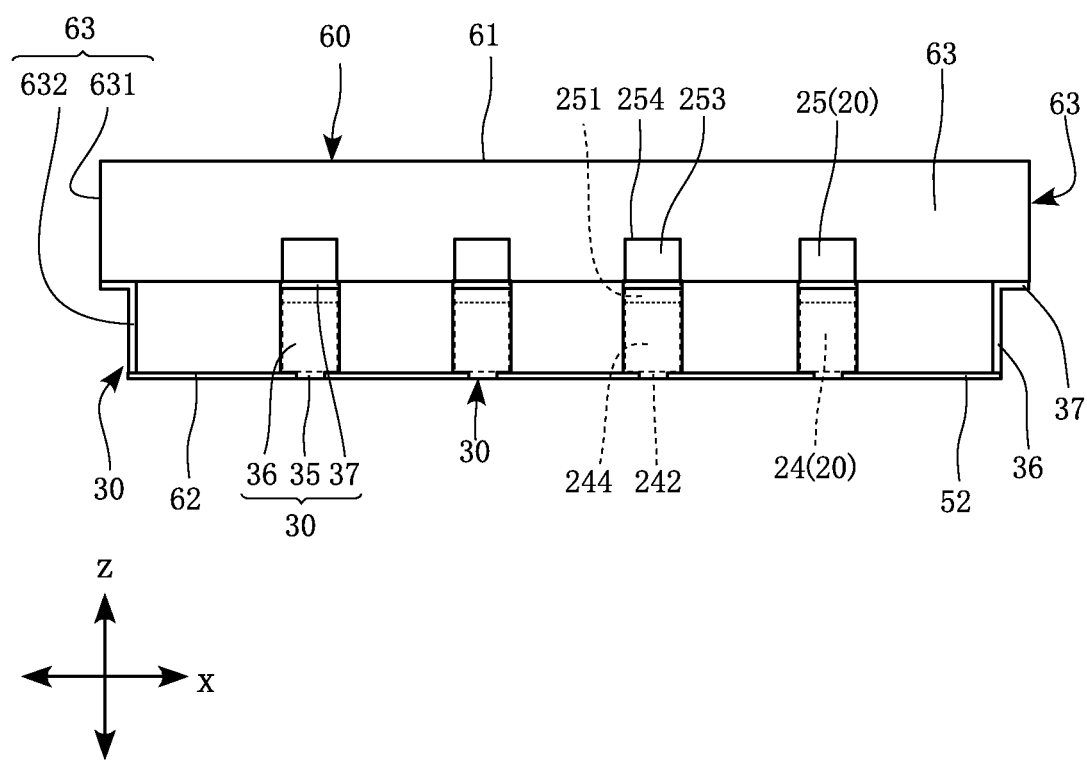
FIG. 44 is a side view of the semiconductor device according to the fifth embodiment.
Figure 45:
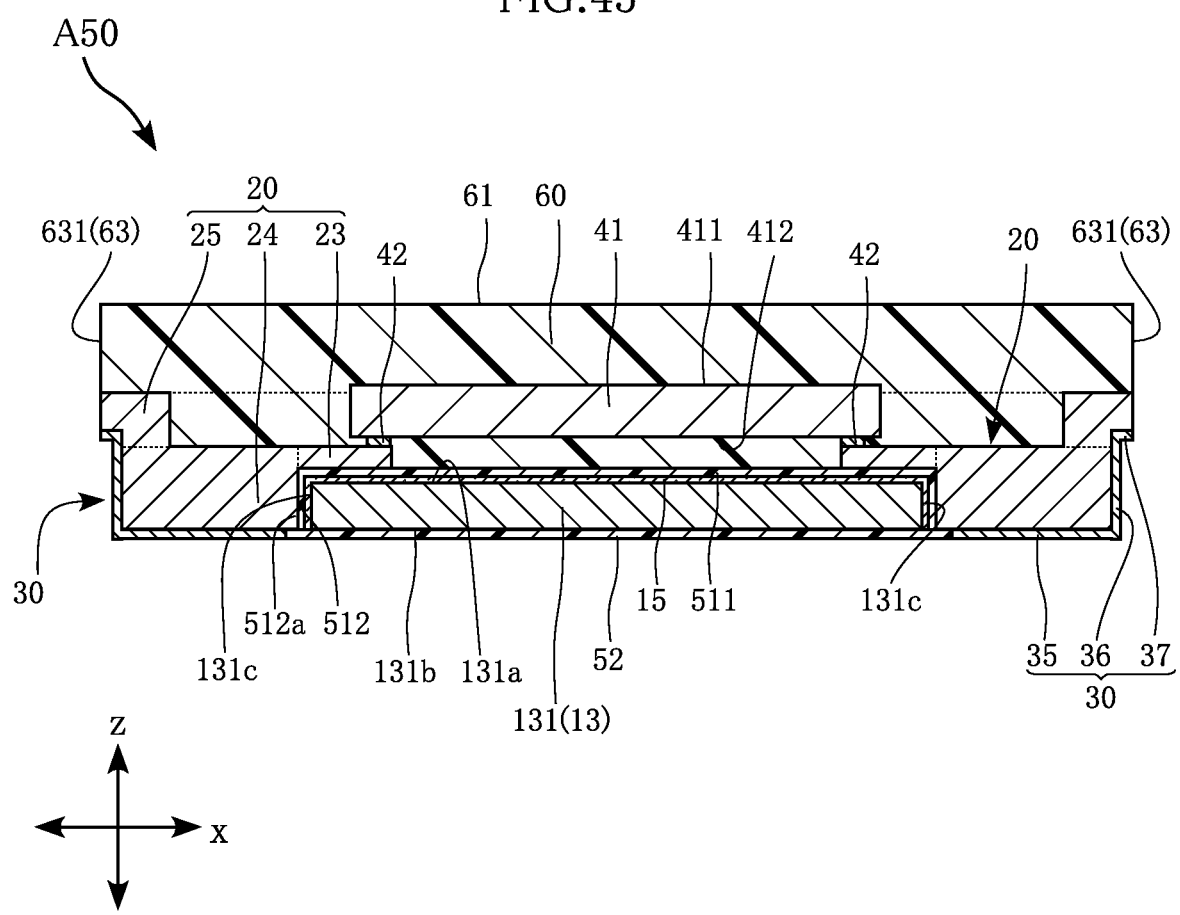
FIG. 45 is a sectional view taken along line XLV-XLV of FIG. 42.
Figure 46:
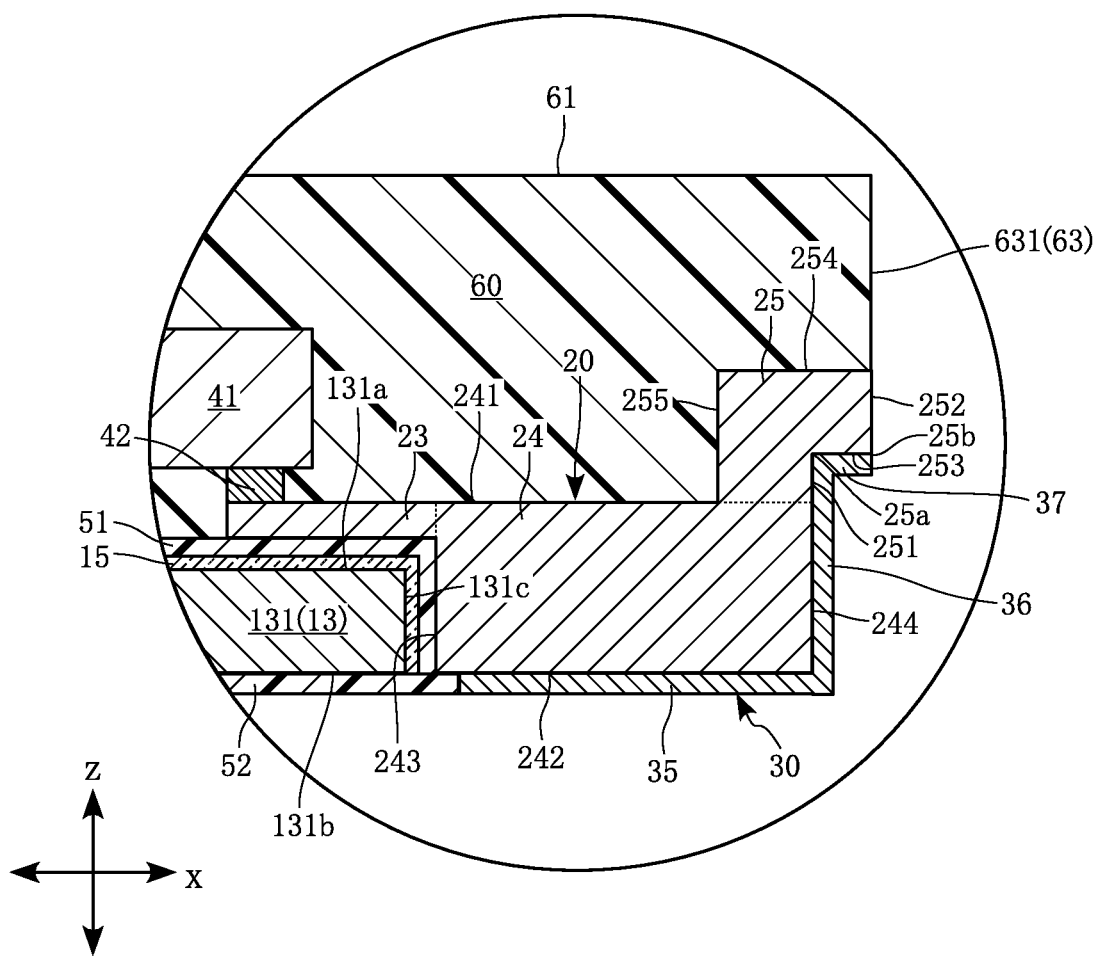
FIG. 46 is an enlarged fragmentary view of FIG. 45.
Figure 48:
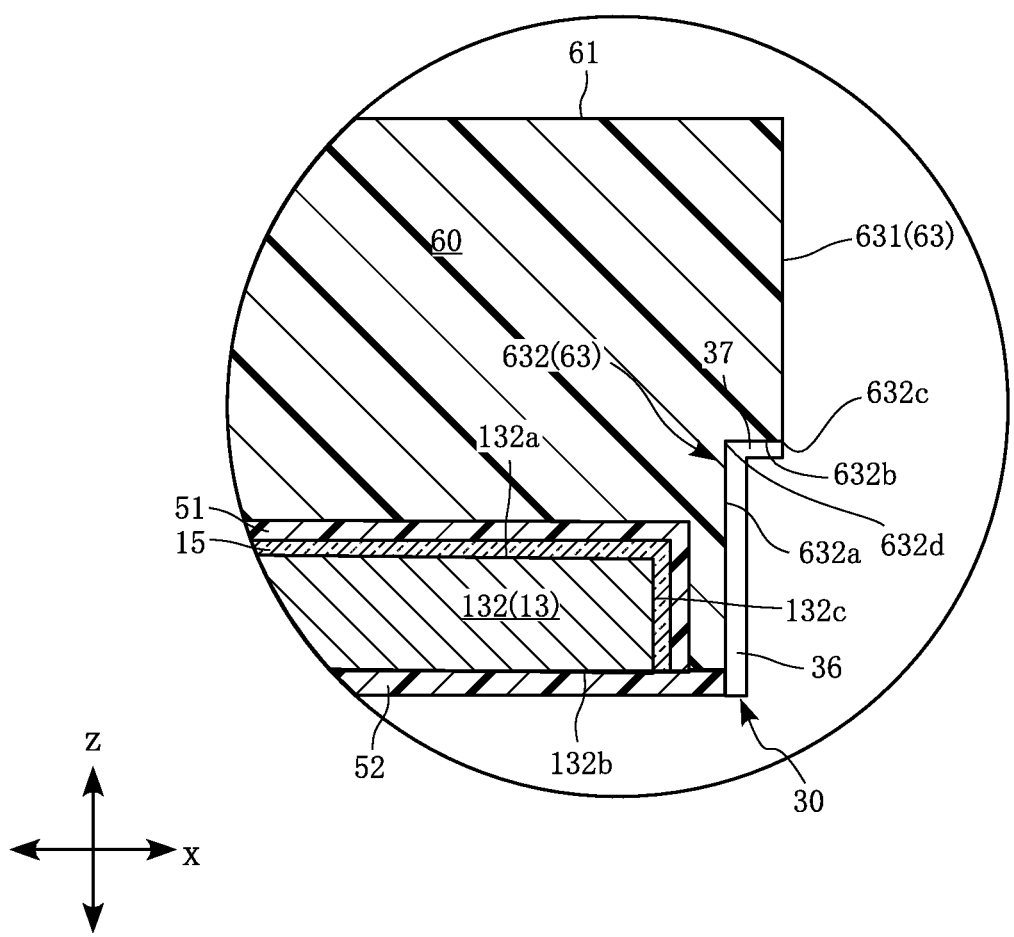
FIG. 48 is an enlarged fragmentary view of FIG. 47.

FIG. 42 is a plan view of the semiconductor device A50. In FIG. 42, the semiconductor element 41 and the sealing resin 60 are shown in phantom lines (dash-double dot lines), and the insulating layer 15 and the internal resin layer 51 are omitted. FIG. 43 is a bottom view of the semiconductor device A50. FIG. 44 is a side view of the semiconductor device A50. FIG. 45 is a sectional view taken along line XLV-XLV in FIG. 42. FIG. 46 is an enlarged sectional view showing a fragment of FIG. 45. FIG. 47 is a sectional view taken along line XLVII-XLVII in FIG. 42. FIG. 48 is an enlarged sectional view showing a fragment of FIG. 47.

The substrate 13 is made of the same material as the substrate 11. That is, the substrate 13 is made of an intrinsic Si semiconductor material. As shown in FIG. 47, the substrate 13 has a front surface 13a and a back surface 13b.

As shown in FIG. 47, the front surface 13a and the back surface 13b are opposite surfaces spaced apart from each other in the thickness direction z. The front surface 13a is the upper surface of the substrate 13 and faces upward in the thickness direction z. The back surface 13b is the lower surface of the substrate 13 and faces downward in the thickness direction z.

As shown in FIGS. 42, 43 and 47, the substrate 13 includes a supporting portion 131 and a plurality of protruding portions 132. Alternatively, the substrate 13 may only include the supporting portion 131 without protruding portions 132.

The supporting portion 131 supports the semiconductor element 41. The supporting portion 131 is rectangular in plan view. As shown in FIG. 45, the supporting portion 131 has a front surface 131a, a back surface 131b and a plurality of side surfaces 131c.

As shown in FIG. 45, the front surface 131a and the back surface 131b are opposite surfaces spaced apart from each other in the thickness direction z. The front surface 131a is the upper surface of the supporting portion 131 and faces upward in the thickness direction z. The front surface 131a is a part of the front surface 13a. The back surface 131b is the lower surface of the supporting portion 131 and faces downward in the thickness direction z. The back surface 131b is a part of the back surface 13b.

As shown in FIG. 45, each side surface 131c extends between the front surface 131a and the back surface 131b in the thickness direction z. The side surface 131c is flat and perpendicular to each of the front surface 131a and the back surface 131b. The side surface 131c is in contact with the sealing resin 60. The supporting portion 131 has four side surface 131c, including a pair of opposite side surface 131c spaced apart from each other in the first direction x and a pair of opposite side surface 131c spaced apart from each other in the second direction y.

As shown in FIGS. 42 and 43, each protruding portion 132 protrudes from a corresponding side surface 131c in plan view. In the example shown in FIG. 42, the substrate 13 has three protruding portions 132 on each side surface 131c of the supporting portion 131, and the three protruding portions 132 are arranged next to each other in a corresponding one of the first direction x and the second direction y in plan view. Also, the three protruding portions 132 are spaced apart from each other in plan view. Between adjacent protruding portions, a portion of a first electrode 20 and a portion of the sealing resin 60 are present. The protruding portions 132 are rectangular in plan view. As shown in FIG. 47, each protruding portion 132 has a front surface 132a, a back surface 132b and a side surface 132c.

As shown in FIG. 47, the front surface 132a and the back surface 132b are opposite surfaces spaced apart from each other in the thickness direction z. The front surface 132a is the upper surface of the protruding portion 132 and faces upward in the thickness direction z. The front surface 132a is flush with the front surface 131a. The front surface 132a is a part of the front surface 13a. The back surface 132b is the lower surface of the protruding portion 132 and faces downward in the thickness direction z. The back surface 132b is flush with the back surface 131b. The back surface 132b is a part of the back surface 13b.

As shown in FIG. 47, the side surface 132c of each protruding portion 132 is located at an end opposite to the end connected to the supporting portion 131. As shown in FIG. 47, the side surface 132c extends between the front surface 132a and the back surface 132b in the thickness direction z. The side surface 132c is flat and perpendicular to each of the front surface 132a and the back surface 132b. The side surface 132c is covered by the insulating layer 15, the internal resin layer 51 and the sealing resin 60. Alternatively, the side surface 132c may be covered only by the insulating layer 15 or by the insulating layer 15 and the internal resin layer 51, or may be exposed to the outside of the semiconductor device A50.

As shown in FIGS. 45 and 47, the insulating layer 15 covers the surfaces of the substrate 13, excluding the back surface 13b.

As shown in FIGS. 42, 45 and 46, each first electrode 20 of the semiconductor device A50 has a first conductive portion 23, a second conductive portion 24 and a third conductive portion 25.

As shown in FIG. 46, the first conductive portion 23 is formed on a portion of the front surface 131a of each supporting portion 131 of the substrate 13. A bonding layer 42 is formed on the first conductive portion 23. The first conductive portion 23 is composed of a base layer and a plating layer laminated on each other. The base layer is composed of, for example, a Ti layer and a Cu layer laminated on each other. The Ti layer is in contact with the internal resin layer 51, and the Cu layer is in contact with the plating layer. The plating layer may be made of Cu, for example. The plating layer is thicker than the base layer. The base layer and the base layer are integral.

As shown in FIG. 46, the second conductive portion 24 is connected to the first conductive portion 23 and the third conductive portion 25. The second conductive portion 24 partly overlaps with the substrate 13 as viewed in a corresponding one of the first direction x and the second direction y. The second conductive portion 24 is composed of a plating layer. The plating layer is made of Cu, for example. Alternatively, the second conductive portion 24 maybe composed of a base layer and a plating layer laminated on each other. The base layer is composed of, for example, a Ti layer and a Cu layer laminated on each other. The Cu layer is in contact with the plating layer.

As shown in FIG. 46, the second conductive portion 24 has a front surface 241, a back surface 242, a first side surface 243 and a second side surface 244. The front surface 241 and the back surface 242 are opposite surfaces spaced apart from each other in the thickness direction z. The front surface 241 is the upper surface of the second conductive portion 24 and faces upward in the thickness direction z. The front surface 241 is in contact with the sealing resin 60. The back surface 242 is the lower surface of the second conductive portion 24 and faces downward in the thickness direction z. As shown in FIG. 44, the back surface 242 is flush with the resin back surface 62 of the sealing resin 60. The first side surface 243 and the second side surface 244 are connected to the back surface 242 and parallel to the thickness direction z. The first side surface 243 and the second side surface 244 are connected to the back surface 242 at their lower edges in the thickness direction z. The first side surface 243 and the second side surface 244 face away from each other in a corresponding one of the first direction x and the second direction y. The first side surface 243 is located opposite to a side surface 131c of the supporting portion 131 (substrate 13), across a portion of the insulating layer 15 and a portion of the internal resin layer 51. The second side surface 244 is exposed from the sealing resin 60.

As shown in FIG. 46, the third conductive portion 25 is connected to the second conductive portion 24. The third conductive portion 25 protrudes from the front surface 241 of the second conductive portion 24 in the thickness direction z. The boundary between the third conductive portion 25 and the second conductive portion 24 is flush with the front surface 241. The third conductive portion 25 is composed of a plating layer. The plating layer is made of Cu, for example.

As shown in FIG. 46, the third conductive portion 25 has a first surface 251, a second surface 252, a third surface 253, a fourth surface 254 and a fifth surface 255.

The first surface 251 is flush with the second side surface 244. In plan view, the first surface 251 is located between the second surface 252 and the fifth surface 255. The second surface 252 is located outside of the first surface 251 in the semiconductor device A50 in plan view. The second surface 252 is flush with a flat portion 631 of the sealing resin 60. The third surface 253 connects the first surface 251 and the second surface 252. In the present embodiment, the third surface 253 is flat. The third surface 253 faces downward in the thickness direction z. The fourth surface 254 faces upward in the thickness direction z. The fourth surface 254 is connected to the second surface 252. The fourth surface 254 is in contact with the sealing resin 60. The fifth surface 255 is substantially parallel to the thickness direction z. The fifth surface 255 is connected to the fourth surface 254. The fifth surface 255 is in contact with the sealing resin 60. The fifth surface 255 meets the front surface 241.

In plan view, the fifth surface 255 of each third conductive portion 25 is located between the first side surface 243 and the second side surface 244, and the second surface 252 is located outside of the second side surface 244 in the semiconductor device A50. Thus, the fifth surface 255 overlaps with the second conductive portion 24 in plan view, whereas the second surface 252 does not overlap with the second conductive portion 24 in plan view.

The third conductive portion 25 has a first boundary edge 25a and a second boundary edge 25b, both extending in the first direction x or in the second direction y. The first boundary edge 25a lies between the first surface 251 and the third surface 253. The second boundary edge 25b lies between the second surface 252 and the third surface 253. In the thickness direction z, the first boundary edge 25a and the second boundary edge 25b are located substantially at the same position.

Each first electrode 20 has a separation distance of, for example, about 100 μm between the back surface 242 of the second conductive portion 24 and the fourth surface 254 of the third conductive portion 25. In other words, each first electrode 20 has a thickness of, for example, about 100 μm, where the second conductive portion 24 and the third conductive portion 25 are stacked. This dimension is an example and not a limitation.

As shown in FIGS. 45 and 46, each second electrode 30 is electrically connected to a first electrode 20 and exposed to the outside of the semiconductor device A50. The second electrodes 30 are made of an electrically conductive material. The second electrodes 30 are similar to the second electrodes 30 of the semiconductor device A10 in that they are composed of a Ni layer, a Pd layer and a Au layer laminated on each other. The second electrodes 30 are used as terminals when the semiconductor device A50 is mounted to a circuit board. The entire second electrodes 30 overlap with the sealing resin 60 in plan view. Each second electrode 30 of the semiconductor device A50 includes a first covering portion 35, a second covering portion 36 and a third covering portion 37.

As shown in FIG. 46, the first covering portion 35 covers a portion of the back surface 242 of the second conductive portion 24. As shown in FIG. 46, the second covering portion 36 covers the second side surface 244 of the second conductive portion 24 and the first surface 251 of the third conductive portion 25. The second covering portion 36 is connected to the first covering portion 35. As shown in FIG. 46, the third covering portion 37 covers the third surface 253 of the third conductive portion 25. The third covering portion 37 is connected to the second covering portion 36.

In the semiconductor device A50 shown in FIG. 45, the semiconductor element 41 is mounted on the supporting portion 131 of the substrate 13 and overlaps with the supporting portion 131 of the substrate 13 in plan view.

In the semiconductor device A50 shown in FIG. 45, each bonding layer 42 is located between the first conductive portion 23 of a first electrode 20 and the semiconductor element 41 (electrode pad). The electrode pad and the first conductive portion 23 are electrically connected via the bonding layer 42.

As shown in FIGS. 45 and 47, the internal resin layer 51 covers the insulating layer 15. In an alternative configuration, the semiconductor device A50 may be without the internal resin layer 51.

As shown in FIGS. 43, 45 and 46, the external resin layer 52 covers the entire back surface 13b of the substrate 13, the entire resin back surface 62 of the sealing resin 60, and a part of the back surface 242 of each second conductive portion 24 (first electrode 20). The part of the back surface 242 of each second conductive portion 24 that is not covered by the external resin layer 52 is covered by a second electrode 30 (first covering portion 35).

The sealing resin 60 of the semiconductor device A50 has a recessed portion 632 in each resin side surface 63. As shown in FIG. 48, the recessed portion has a first surface 632a and a second surface 632b.

In the semiconductor device A50 shown in FIG. 48, the first surface 632a and the second surface 632b of the recessed portion 632 are flat and connected to each other. The first surface 632a is flush with the second side surface 244 of each relevant second conductive portion 24 (first electrode 20) and the first surface 251 of each relevant third conductive portion 25 (first electrode 20). The second surface 632b is flush with the third surface 253 of each relevant third conductive portion 25 (first electrode 20). The second surface 632b faces downward in the thickness direction z. The first surface 632a and the second surface 632b are not covered by the second electrode 30. In other words, the first surface 632a and the second surface 632b are exposed from the second electrode 30.

Next, with reference to FIGS. 49 to 64, a method for manufacturing a semiconductor device A50 is described. Among FIGS. 49 to 64, FIGS. 50, 53 and 55 are plan views showing steps of the method for manufacturing the semiconductor device A50, and FIGS. 59, 61 and 63 are bottom views showing steps of the method for manufacturing the semiconductor device A50. The other figures are sectional views showing steps of the method for manufacturing the semiconductor device A50. The sections in the figures correspond to the section shown in FIG. 45.

Figure 49:
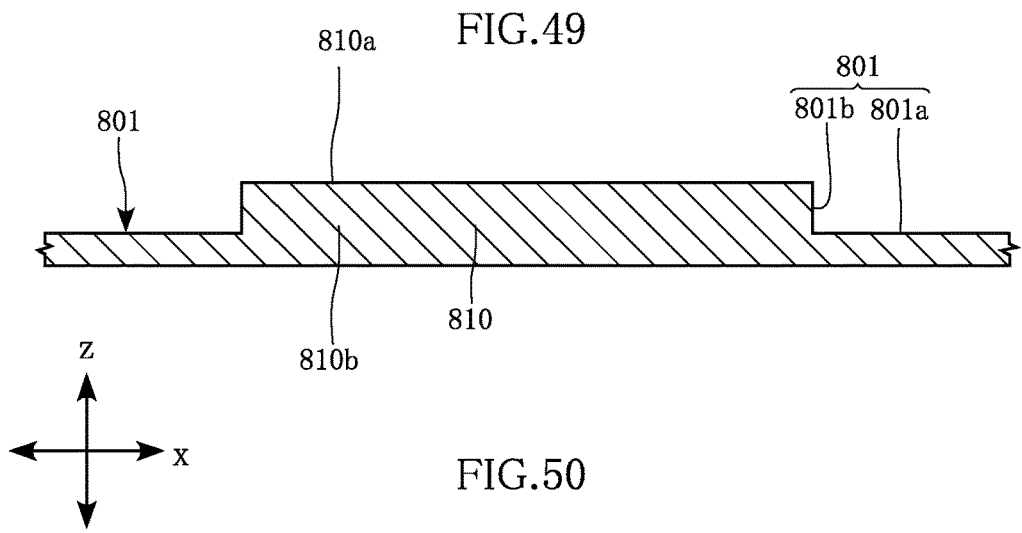
FIG. 49 is a sectional view showing a manufacturing step of the semiconductor device shown in FIG. 42.
Figure 50:
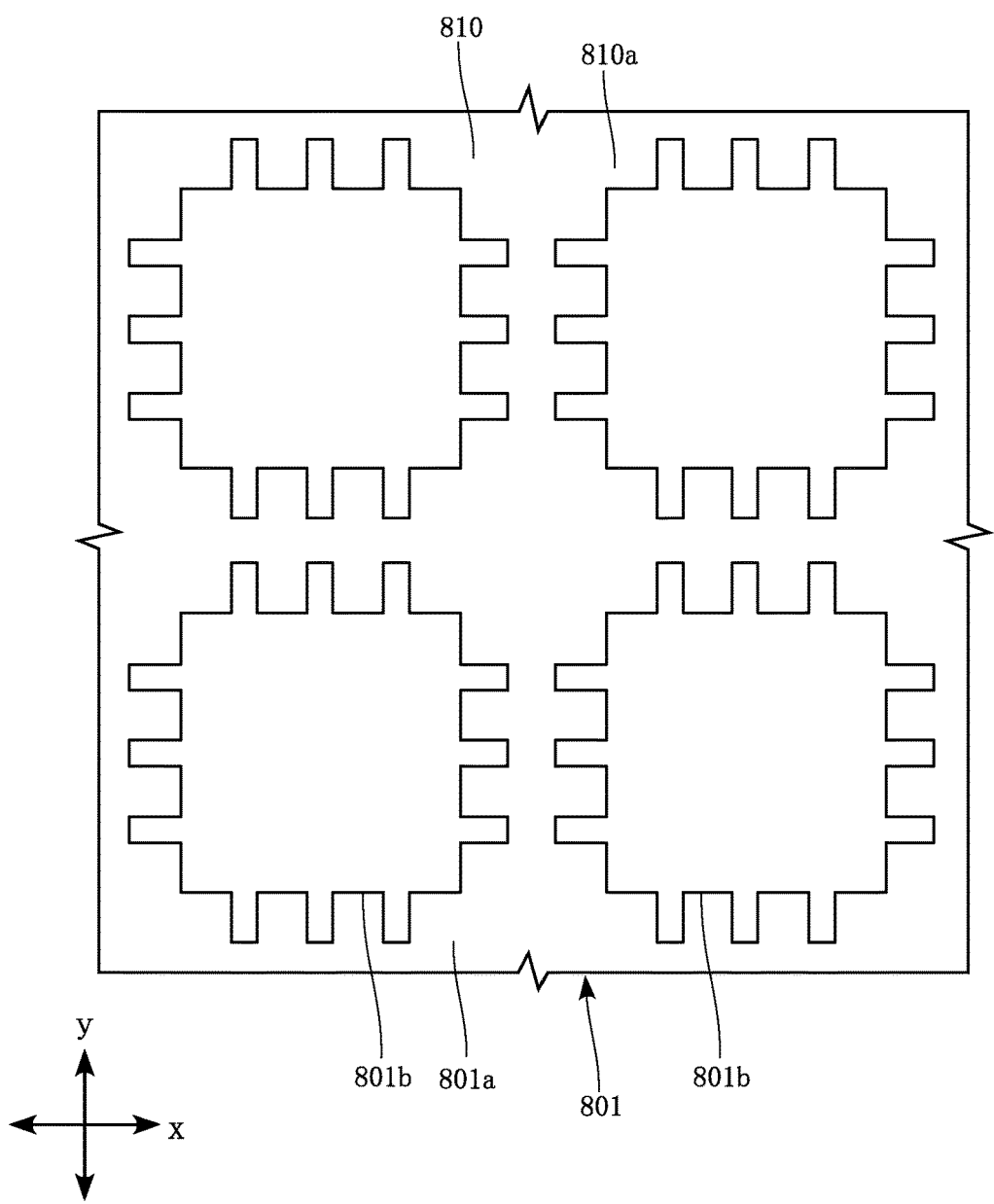
FIG. 50 is a plan view showing a manufacturing step of the semiconductor device shown in FIG. 42.

First, as shown in FIGS. 49 and 50, a base 810 having a front surface 810*a* and a back surface 810*b* facing in the thickness direction z is prepared, and the base 810 is processed to form a recessed portion 801 that is recessed from the front surface 810*a* in the thickness direction z. The manufacturing method of the present embodiment differs from the manufacturing method of the first embodiment with respect to the range in which the recessed portion 801 is formed. The base 810 will later form a substrate 13 of the semiconductor device A50. The material of the base 810 and how the recessed portion 801 is formed are the same as those of the substrate preparing step according to the first embodiment.

Then, an insulating layer 815 and a resin layer 851 are sequentially formed as shown in FIG. 51. The insulating layer 815 is formed in the same way as in the insulating layer forming step according to the first embodiment. The resin layer 851 is formed in the same way as in the resin layer forming step according to the first embodiment.

Figure 53:
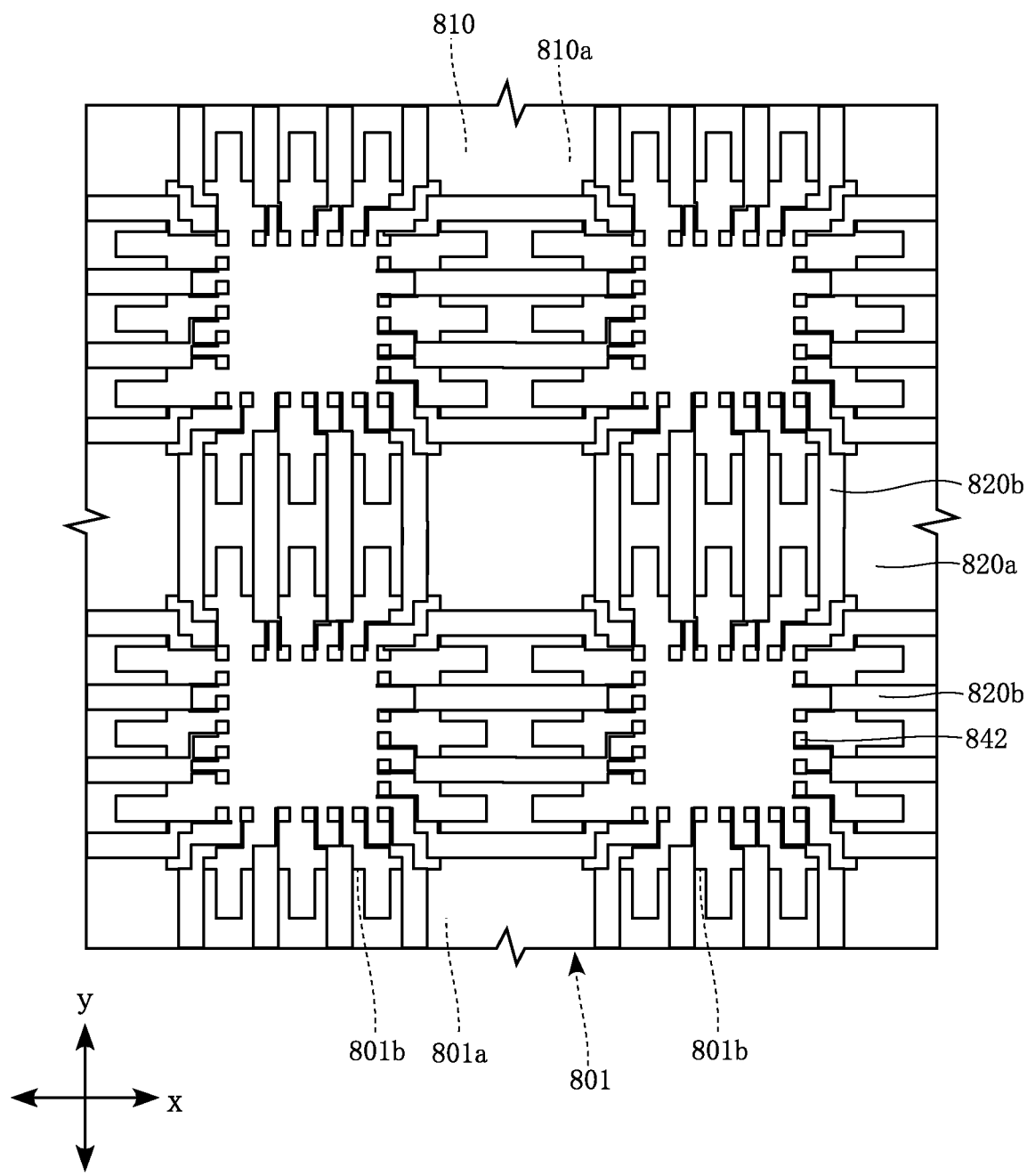
FIG. 53 is a plan view showing a manufacturing step of the semiconductor device shown in FIG. 42.

Then, a base layer 820*a*, a plating layer 820*b* and bonding layers 842 are sequentially formed as shown in FIGS. 52 and 53. The base layer 820*a* is formed in the same way as in the base layer forming method according to the first embodiment. The plating layer 820*b* is formed in the same way as in the plating layer forming step according to the first embodiment. The bonding layers 842 are formed in the same way as in the bonding layer forming step according to the first embodiment.

Figure 54:
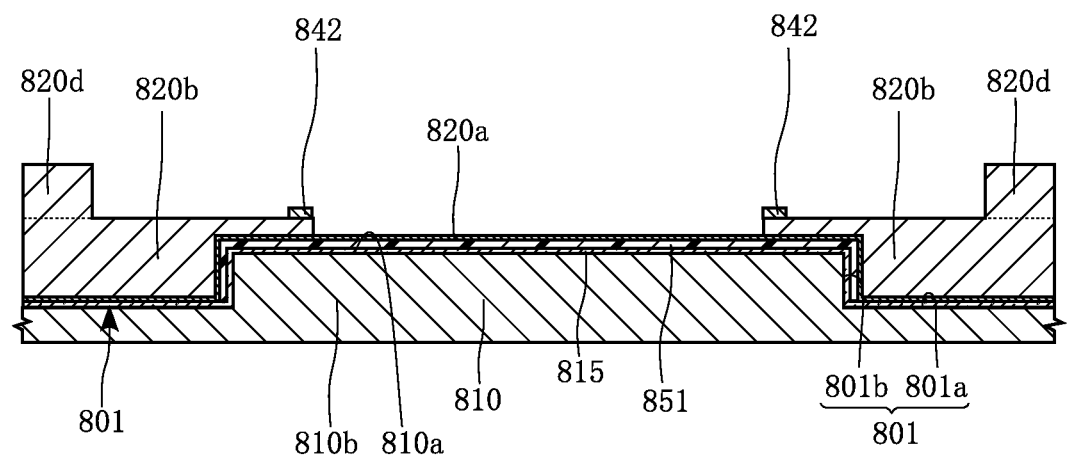
FIG. 54 is a sectional view showing a manufacturing step of the semiconductor device shown in FIG. 42.
Figure 55:
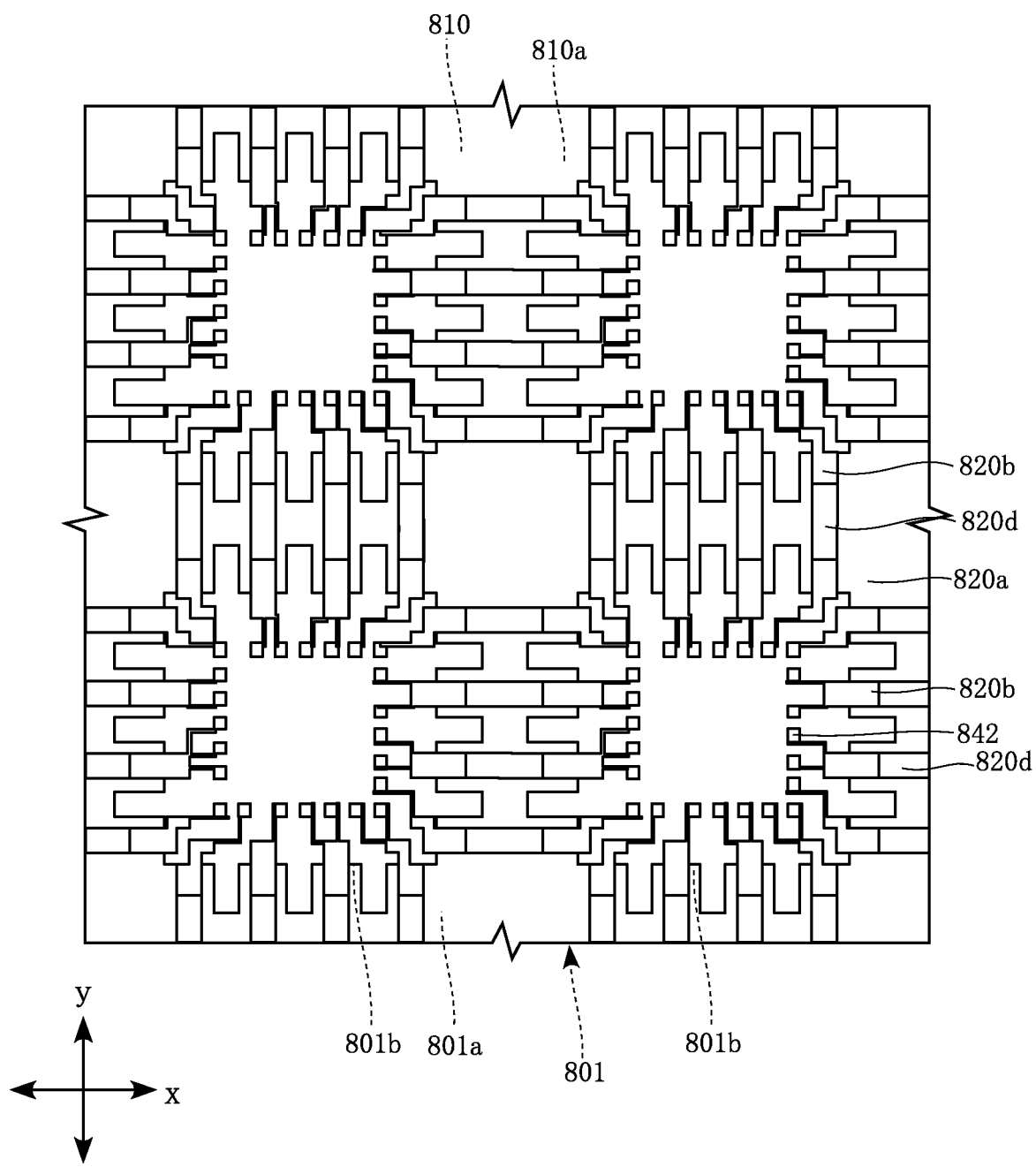
FIG. 55 is a plan view showing a manufacturing step of the semiconductor device shown in FIG. 42.

Then, plating layers 820*d* are formed as shown in FIGS. 54 and 55. Each plating layer 820*d* will be formed into a portion of a first electrode 20 (third conductive portion 25) of the semiconductor device A50. Similarly to the plating layers 820*b*, the plating layers 820*d* are formed by patterning through photolithography and electroplating. Each plating layer 820*d* is formed on a plating layer 820*b* to protrude from the plating layer 820*b*. The manufacturing method of the semiconductor device A50 differs from the manufacturing method of the semiconductor device A10 mainly in an additional step of forming the plating layers 820*d*.

Figure 56:
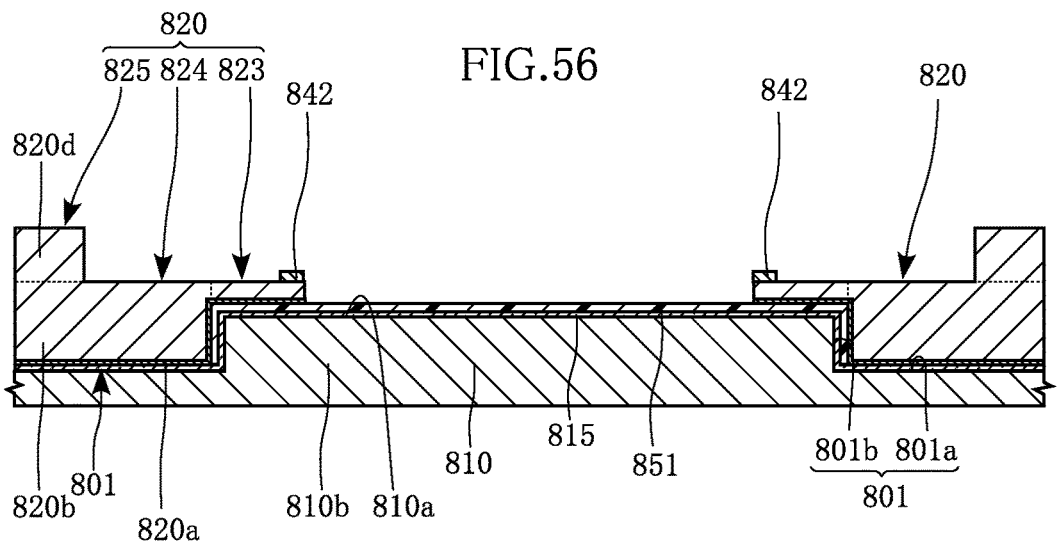
FIG. 56 is a sectional view showing a manufacturing step of the semiconductor device shown in FIG. 42.

Then, unnecessary portions of the base layer 820*a* are removed as shown in FIG. 56. In the present embodiment, portions of the base layer 820*a* not covered by the plating layers 820*b* and the plating layers 820*d* are unnecessary. Such portions of the base layer 820*a* are removed in the same way as the base layer removal step according to the first embodiment. As a result of the base layer removal step, the resin layer 851 is exposed where the base layer 820*a* has been removed as shown in FIG. 56. Also, removing the base layer 820*a* forms the first electrodes 820. Each first electrode 820 includes a first conductive portion 823, a second conductive portion 824 and a third conductive portion 825. The first conductive portion 823 is formed on the first front surface 811*a*. The first conductive portion 823 is composed of a base layer 820*a* and a plating layer 820*b*. The second conductive portion 824 is connected to the first conductive portion 823 and filling the recessed portion 801. The second conductive portion 824 is composed of a base layer 820*a* and a plating layer 820*b*. The third conductive portion 825 is formed on the second conductive portion 824 to protrude from the second conductive portion 824 in the thickness direction z. The third conductive portion 825 includes a plating layer 820*d*.

Figure 57:
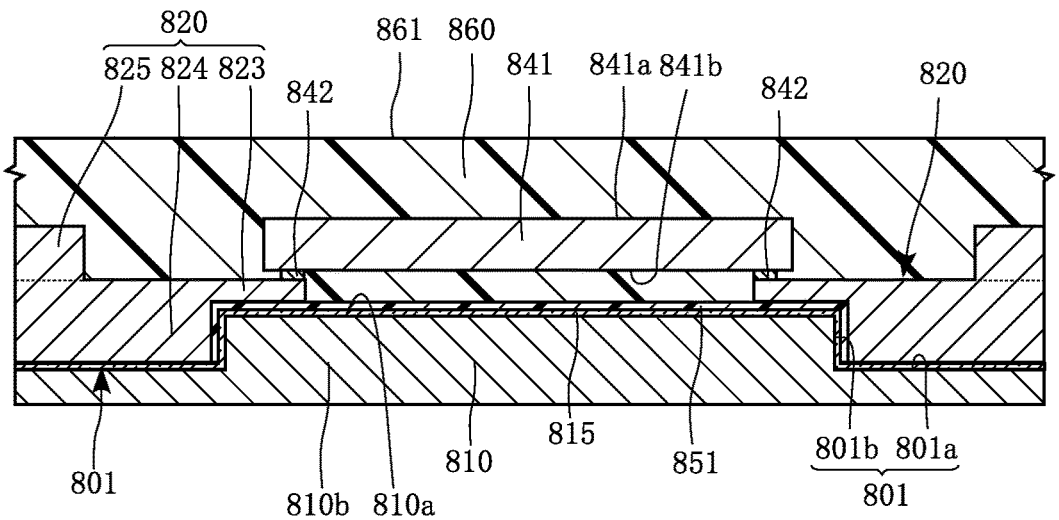
FIG. 57 is a sectional view showing a manufacturing step of the semiconductor device shown in FIG. 42.

Next, as shown in FIG. 57, a semiconductor element 841 is mounted on the base 810 and a sealing resin 860 is formed to cover the semiconductor element 841. The semiconductor element 841 is mounted in the same way as in the semiconductor element mounting step according to the first embodiment. The sealing resin 860 is formed in the same way as in the sealing resin forming step according to the first embodiment.

Figure 58:
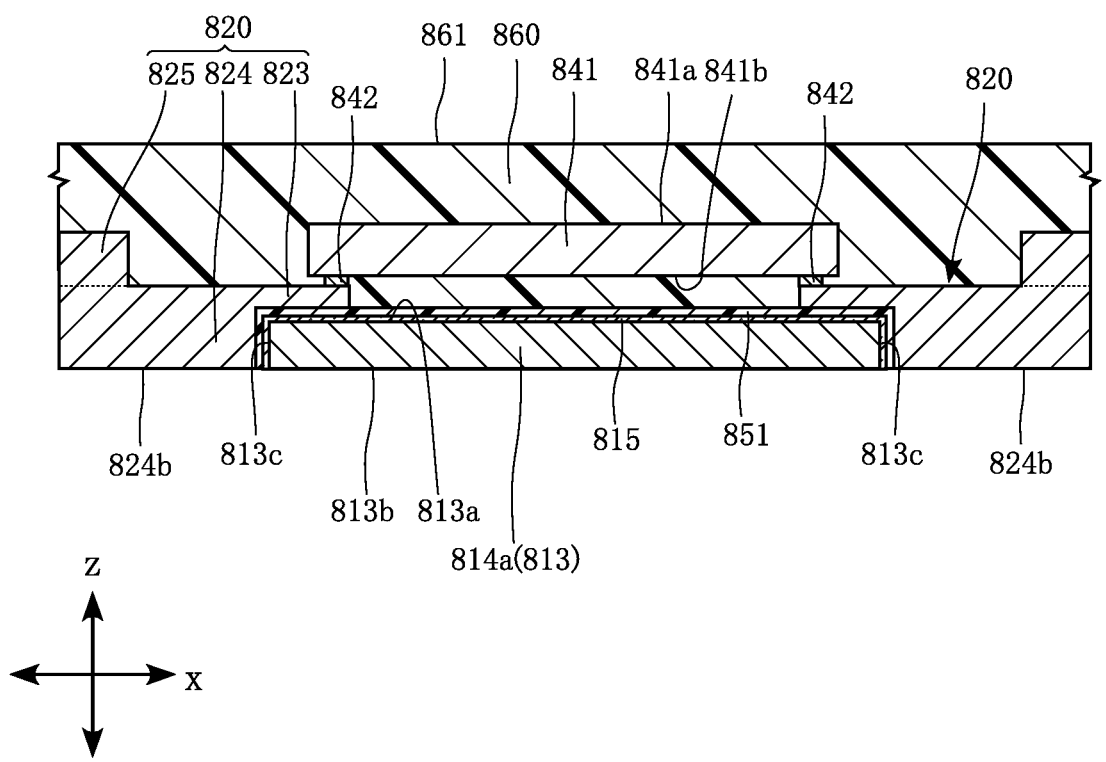
FIG. 58 is a sectional view showing a manufacturing step of the semiconductor device shown in FIG. 42.
Figure 59:
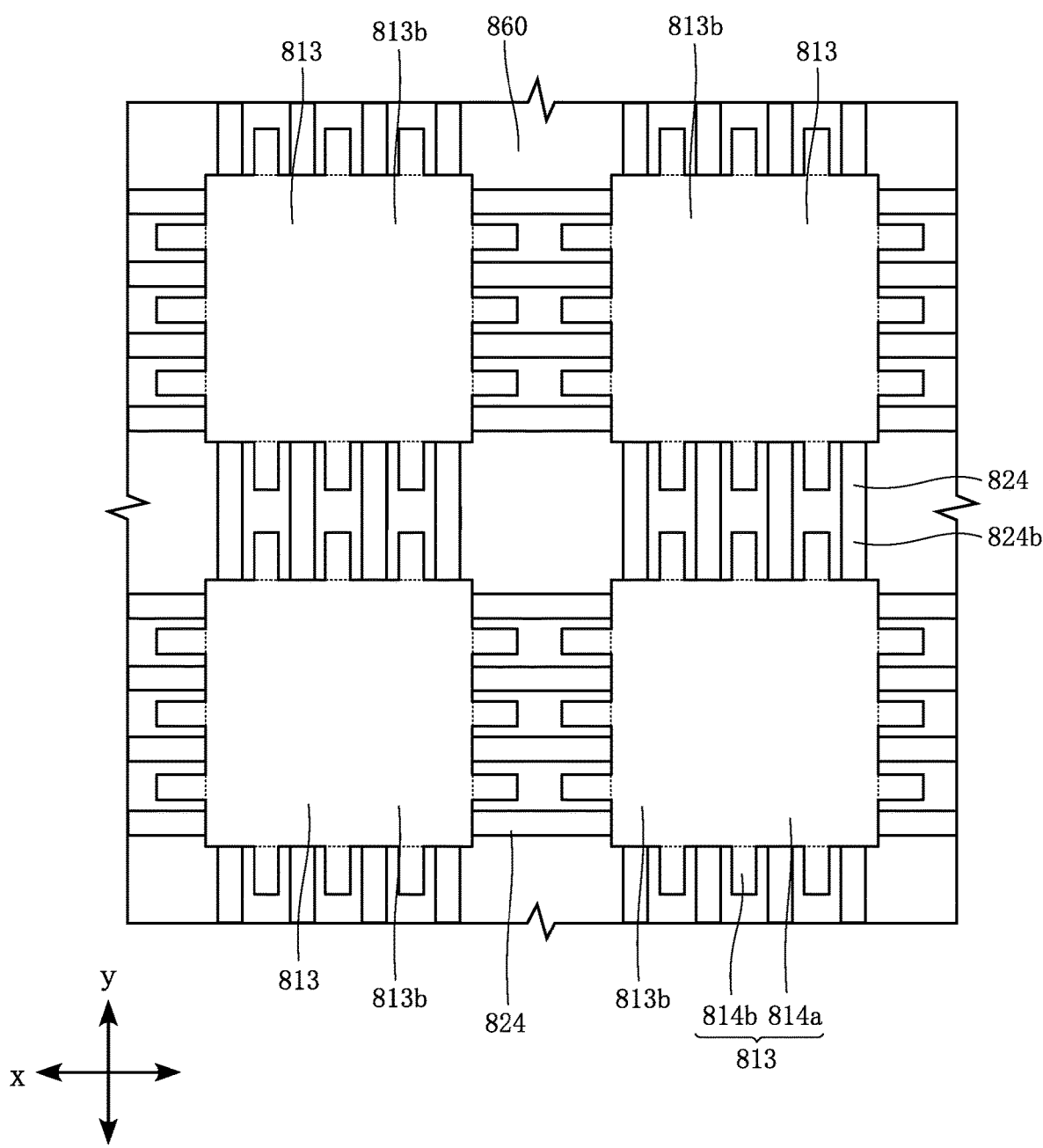
FIG. 59 is a bottom view showing a manufacturing step of the semiconductor device shown in FIG. 42.

Next, the base 810 is ground from the back surface 810*b* as shown in FIGS. 58 and 59. The base 810 is ground in the same way as in the grinding step according to the first embodiment. By the grinding step, the back surface 824*b* of the second conductive portion 824 is exposed to the outside as shown in FIG. 58. In this step, the base layer 820*a* is completely removed from the second conductive portion 824 by grinding, so that the plating layer 820*b* will be the outermost layer on the back surface 824*b*. Alternatively, a portion of the base layer 820*a* may be left unground, so that the base layer 820*a* will be the outermost layer on the back surface 824*b*. The back surface 824*b* corresponds to the back surface 242 of a second conductive portion 24 of the semiconductor device A50. By the grinding step, the base 810 is divided into a plurality of substrates 813 as shown in FIG. 59. As shown in FIG. 58, the back surface (back surface 813*b*) of a substrate 813 is exposed to the outside. As shown in FIG. 59, each substrate 813 includes a supporting portion 814*a* and a plurality of protruding portions 814*b*. The supporting portion 814*a* supports a semiconductor element 841. The supporting portion 814*a* is rectangular in plan view. Each protruding portion 814*b* protrudes from the supporting portion 814*a* in plan view. The substrate 813 corresponds to the substrate 13 of a semiconductor device A50.

Figure 60:
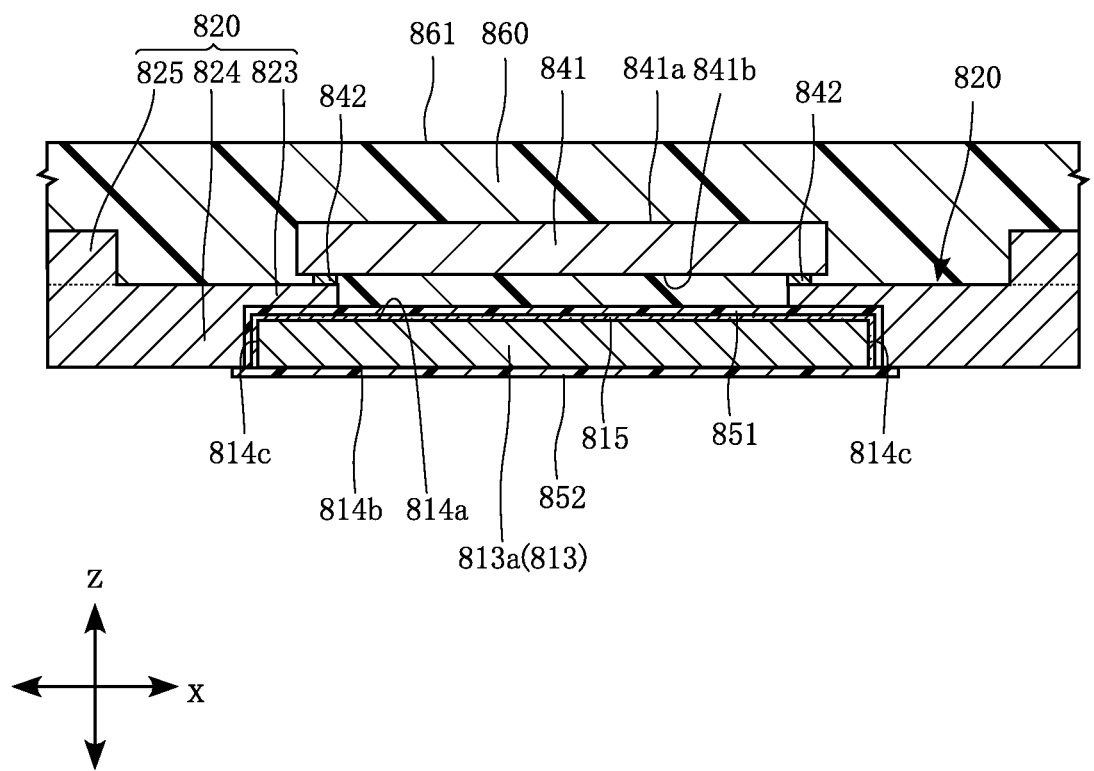
FIG. 60 is a sectional view showing a manufacturing step of the semiconductor device shown in FIG. 42.
Figure 61:
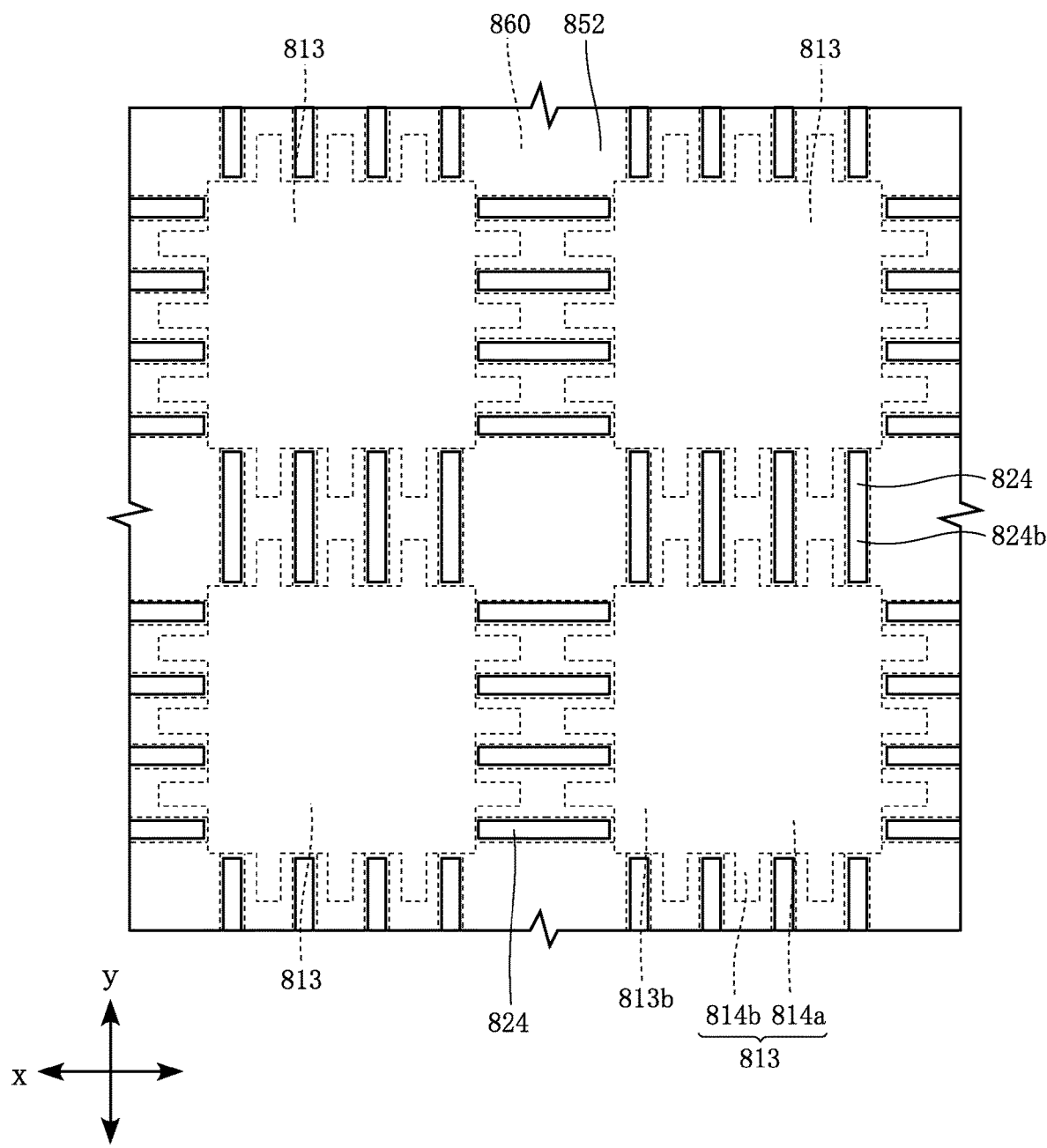
FIG. 61 is a bottom view showing a manufacturing step of the semiconductor device shown in FIG. 42.

Then, a resin layer 852 is formed as shown in FIGS. 60 and 61. The resin layer 852 is formed in the same way as in the external resin layer forming step according to the first embodiment. As shown in FIG. 61, the resin layer 852 is formed to expose a portion of a back surface 824*b* of each second conductive portion 824 (first electrode 820). Alternatively, the resin layer 852 may be formed to expose the entire back surface 824*b*.

Figure 62:
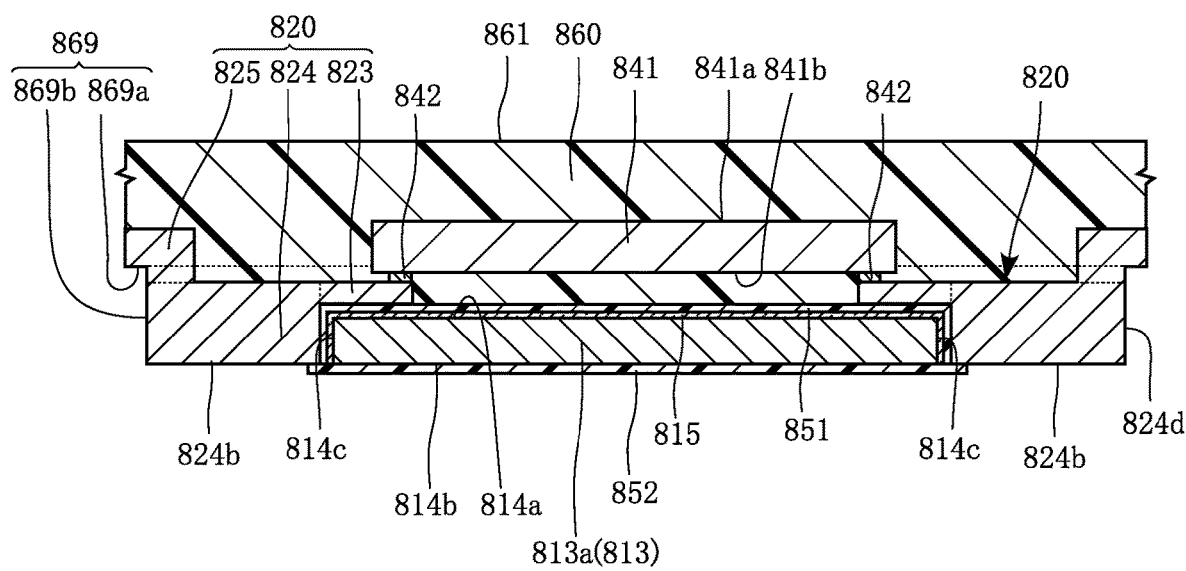
FIG. 62 is a sectional view showing a manufacturing step of the semiconductor device shown in FIG. 42.
Figure 63:
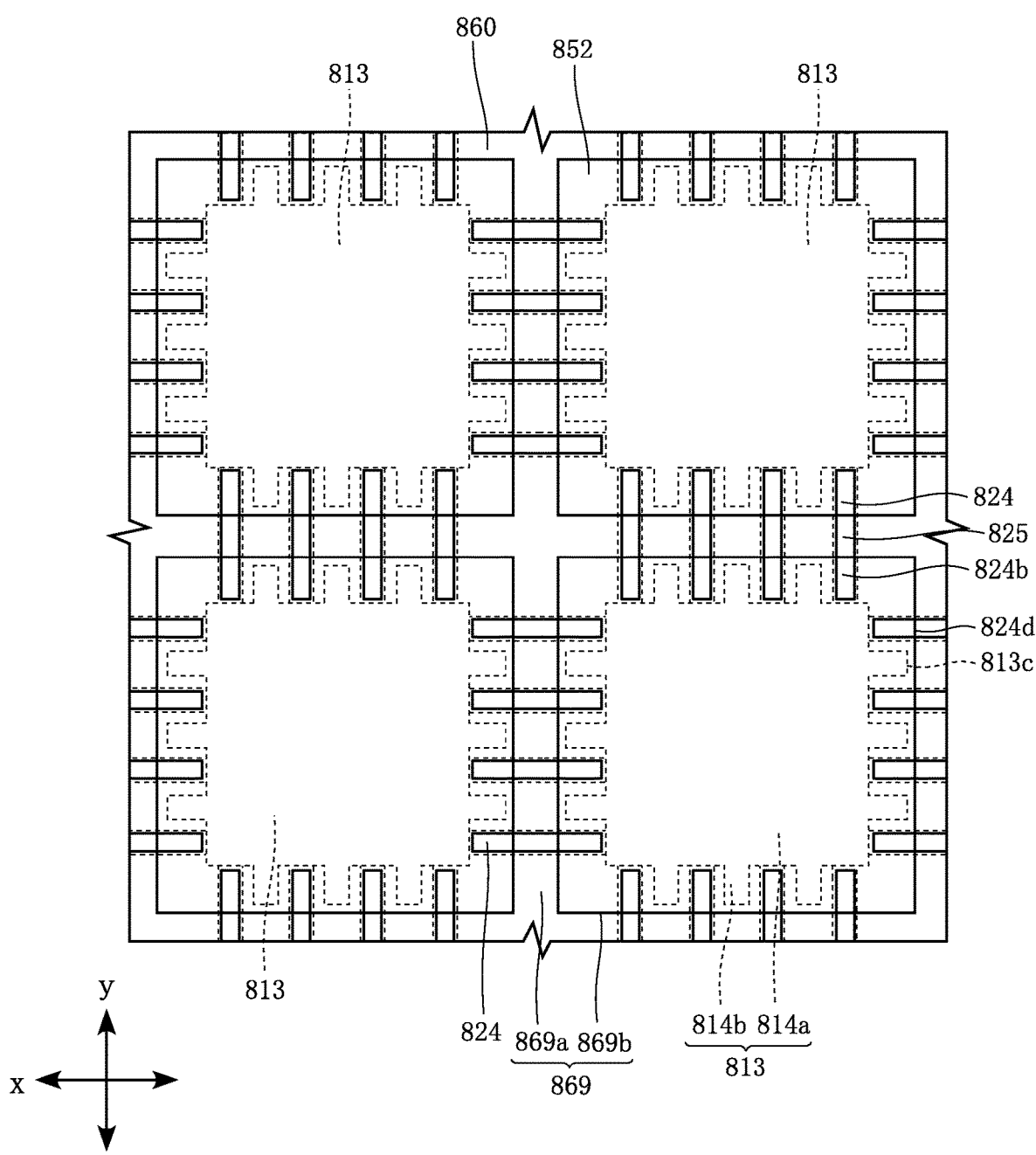
FIG. 63 is a bottom view showing a manufacturing step of the semiconductor device shown in FIG. 42.

Then, grooves 869 are formed as shown in FIGS. 62 and 63. The grooves 869 are formed in the same way as in the side surface exposing step according to the first embodiment. That is, the grooves 869 are formed by half-cut dicing with blade dicing. As shown in FIG. 63, each groove 869 has a bottom 869*a* and walls 869*b*. The bottom 869*a* is flat. As shown in FIG. 62, the bottom 869*a* reaches a third conductive portion 825 in the thickness direction z. Each wall 869*b* is substantially parallel to the thickness direction z and connected to the bottom 869*a*. By the step of forming the grooves 869 (groove forming step), the second side surface 824*d* of each second conductive portion 824 is exposed to the outside. In the present embodiment, after the grooves 869 have been formed, the side surface (side surface 813*c*) of each protruding portion 814 of the substrate 813 is covered by the insulating layer 815, the resin layer 851 and the sealing resin 860. However, the width of the grooves 869 may be adjusted so that the side surface 813*c* is uncovered by the sealing resin 860, or additionally uncovered by the resin layer 851, or further additionally uncovered by or exposed from the insulating layer 815.

Figure 64:
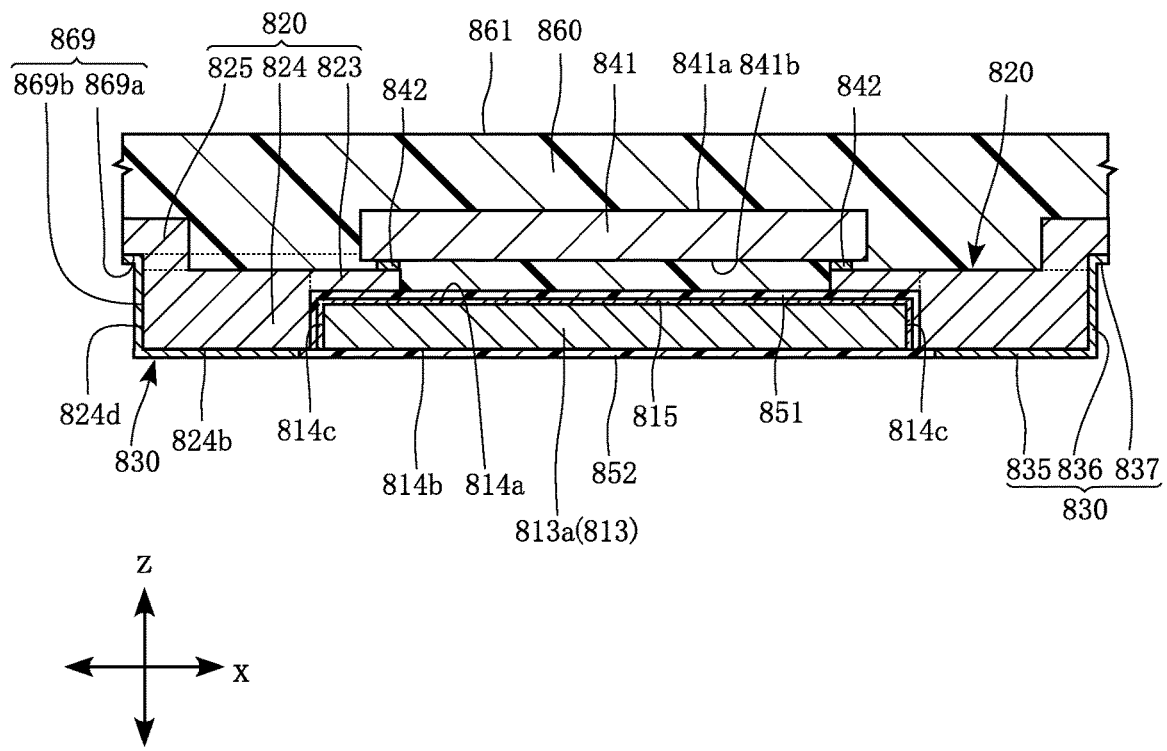
FIG. 64 is a sectional view showing a manufacturing step of the semiconductor device shown in FIG. 42.

Then, second electrodes 830 are formed as shown in FIG. 64. The second electrodes 830 are formed in the same way as in the second electrode step according to the first embodiment. That is, by electroless plating, a Ni layer, a Pd layer and a Au layer are sequentially deposited to form the second electrodes 830. As shown in FIG. 64, each second electrodes 830 includes a first covering portion 835, a second covering portion 836 and a third covering portion 837. The first covering portion 835 covers the back surface 824*b* of a second conductive portion 824. The second covering portion 836 covers the exposed surfaces of a second conductive portion 824 and a third conductive portion 825 on the wall 869*b* of a groove 869. The third covering portion 837 covers the exposed surface of a third conductive portion 825 on the bottom 869*a* of the groove 869. The first covering portion 835, the second covering portion 836 and the third covering portion 837 respectively correspond to the first covering portion 35, the second covering portion 36 and the third covering portion 37 of the semiconductor device A50.

Subsequently, the sealing resin 860 is cut (by the cutting step) as in the first embodiment, dividing it into a plurality of pieces each having one semiconductor element 841. Each piece thus divided comprises a semiconductor device A50. The sealing resin 860 is cut in the same way as in the cutting step according to the first embodiment. In the cutting step, the sealing resin is cut along the center of the width of each groove 869, ensuring that the sealing resin 860 and the third conductive portions 825 are cut. Consequently, the shapes of the sealing resin 860 and the third conductive portions 825 are retained as the shapes of the sealing resin 60 and the third conductive portions 25 shown in FIGS. 42 to 47. Since each groove 869 of the present embodiment has a flat bottom 869*a*, each recessed portion 632 is formed to have a flat second surface 632*b*, and each third conductive portion 25 is formed to have a flat third surface 253. The semiconductor device A50 is fabricated through the steps described above.

The following describes advantages of the semiconductor device A50 and its manufacturing method.

The semiconductor device A50 includes the first electrodes 20 formed by electroplating and the second electrodes 30 formed by electroless plating. It means that the wiring of the semiconductor device A50 is formed by plating and thus without using a lead frame formed from a metal plate. With the wiring provided by plating, the resulting device can be thinner than a device with a lead frame structure. The semiconductor device A50 can therefore be thinner.

The semiconductor device A50 has the second electrodes 30 each formed by electroless plating to cover a portion of the surface of a first electrode 20. Although electroless plating can deposit metal on a silicon surface as described in the first embodiment, deposition occurs more favorably on a metal (for example Cu) surface. The first electrodes 20 of the present embodiment is made primarily of Cu. Thus, the second electrodes 30 of the semiconductor device A50 can be formed more easily than those of the semiconductor device A10.

The semiconductor device A50 includes the second electrodes 30 each of which has a first covering portion 35, a second covering portion 36 and a third covering portion 37. As shown in FIGS. 42 and 43, all of these portions of the second electrodes overlap with the sealing resin 60 in plan view as shown. In other words, no portions of the second electrodes protrude from the sealing resin 60 to the outside in plan view. This configuration provides the semiconductor device A50 of a leadless package. In particular, the second electrodes 30 of the semiconductor device A50 are formed on the resin side surfaces 63. This enables the semiconductor device A50 to be configured as a QFN package.

The semiconductor device A50 includes the second electrodes 30 each having a second covering portion 36. The second covering portion 36 is exposed on the resin side surface 63 of the sealing resin 60. When the semiconductor device A50 is mounted onto a circuit board by soldering, solder fillets are formed to cover the second covering portions 36. Owing to the configuration described above, the solder connections can be visually inspected from the side of the semiconductor device A50.

The semiconductor device A50 includes the first electrodes 20 each of which has a third conductive portion 25 protruding upward in the thickness direction z from the second conductive portion 24. Each second electrode 30 has a second covering portion 36 covering the first surface 251 of a third conductive portion 25. With this configuration of the semiconductor device A50, the second electrodes 30 can be larger in the dimension in the thickness direction z than those in the semiconductor device A10. This further facilitates the inspection of the solder connections described above. In addition, the semiconductor device A50 can achieve stronger solder bonds than the semiconductor device A10, as solder can be applied to have a larger contact area with the second electrodes 30.

Figure 65:
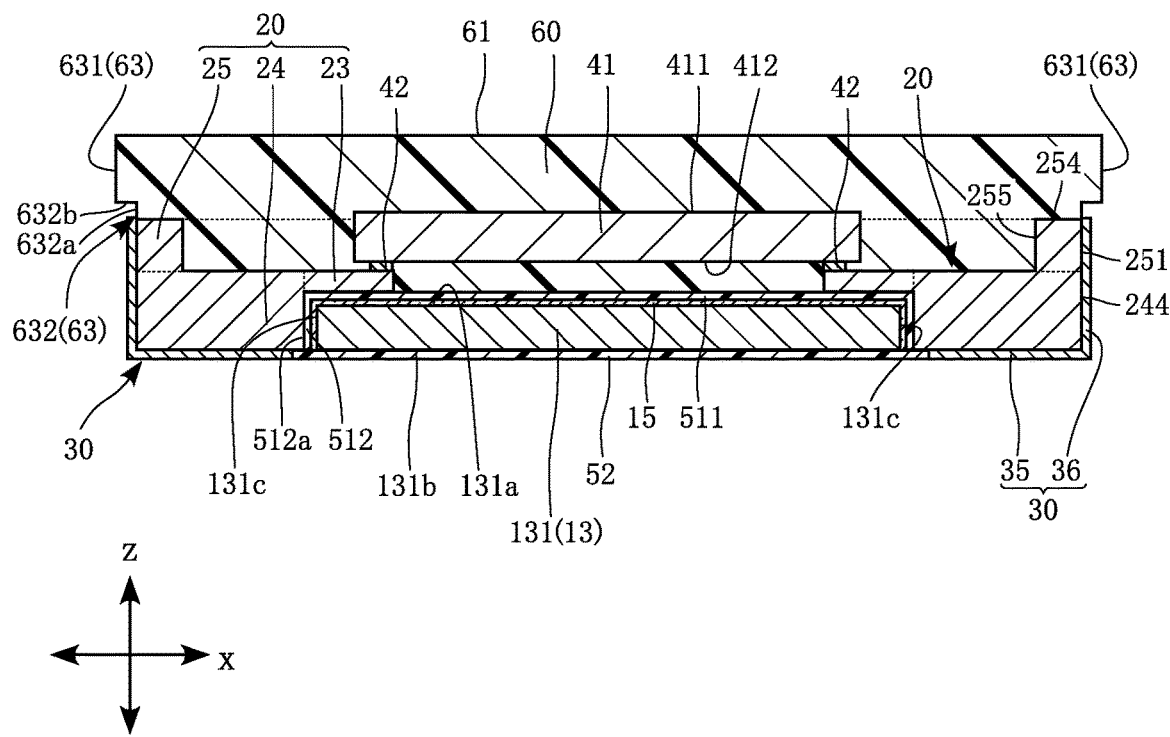
FIG. 65 is a sectional view of a semiconductor device according to a variation of the fifth embodiment.

According to the fifth embodiment, each groove 869 formed in the groove forming step has a bottom 869*a* reaching a third conductive portion 825 in the thickness direction z. Alternatively, the groove forming step maybe performed to form grooves 869 each extending through a third conductive portion 825, so that the bottom 869*a* reaches the sealing resin 860 above the third conductive portion 825 in the thickness direction z. FIG. 65 shows a semiconductor device formed according to this variation. In the configuration shown in FIG. 65, each third conductive portion 25 does not have either a second surface 252 or a third surface 253. Instead, the first surface 251 connects to the fourth surface 254.

Figure 66:
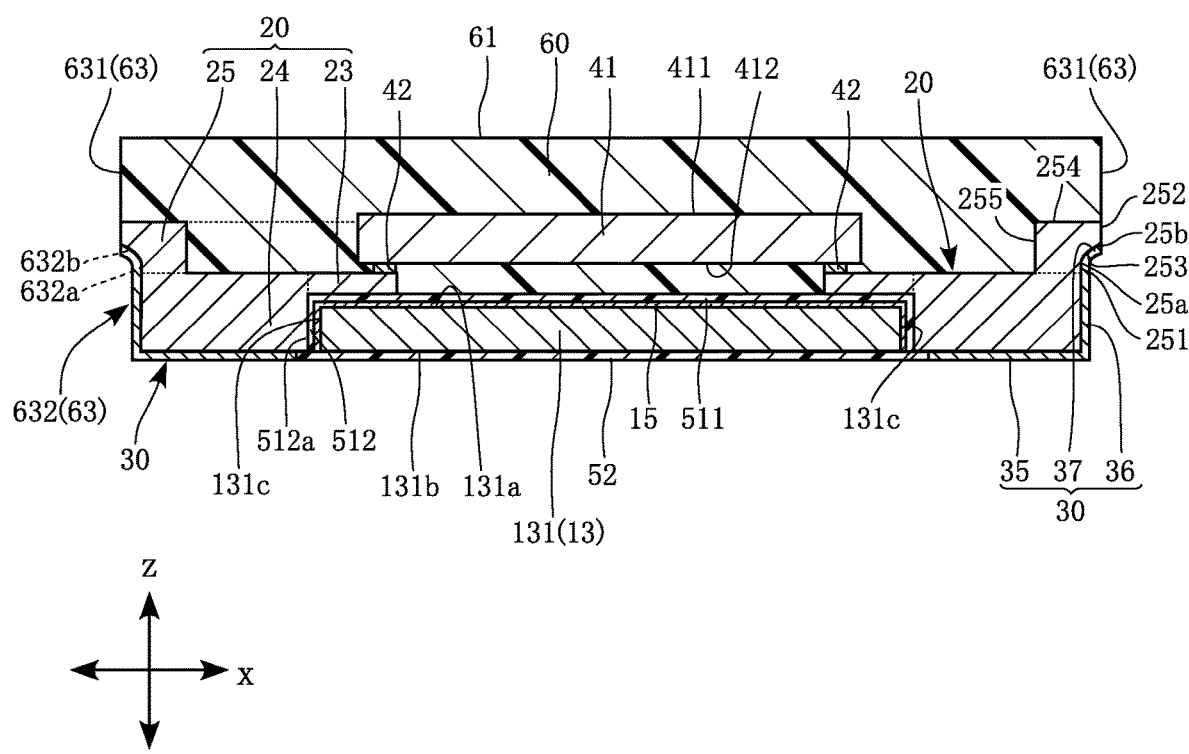
FIG. 66 is a sectional view of a semiconductor device according to a sixth embodiment.

FIG. 66 shows a semiconductor device according to a sixth embodiment. FIG. 66 is a sectional view of the semiconductor device A60 of the sixth embodiment, showing a section corresponding to the section shown in FIG. 45. The semiconductor device A60 differs from the semiconductor device A50 in the shape of the third conductive portion 25 of each first electrode 20, and the shape of a recessed portion 632 formed in each resin side surface 63 of the sealing resin 60.

The recessed portion 632 of the semiconductor device A60 is similar to the recessed portion 632 of the semiconductor device A40. That is, each recessed portion 632 of the semiconductor device A60 has a curved second surface 632*b* as shown in FIG. 66.

Each third conductive portion 25 of the semiconductor device A60 has a curved third surface 253. In addition, the second boundary edge 25*b* is located above the first boundary edge 25*a* in the thickness direction z. In other words, the second boundary edge 25*b* is closer to the resin front surface 61 in the thickness direction z than the first boundary edge 25*a* is. In conformity with the curved third surface 253, the third covering portion 37 that covers the third surface 253 is curved along the third surface 253 as shown in FIG. 66. The third surface 253 overlaps with the second surface 632*b* as viewed in a corresponding one of the first direction x and the second direction y.

The semiconductor device A60 can achieve similar advantages to those achieved by the semiconductor device A50.

Figure 67:
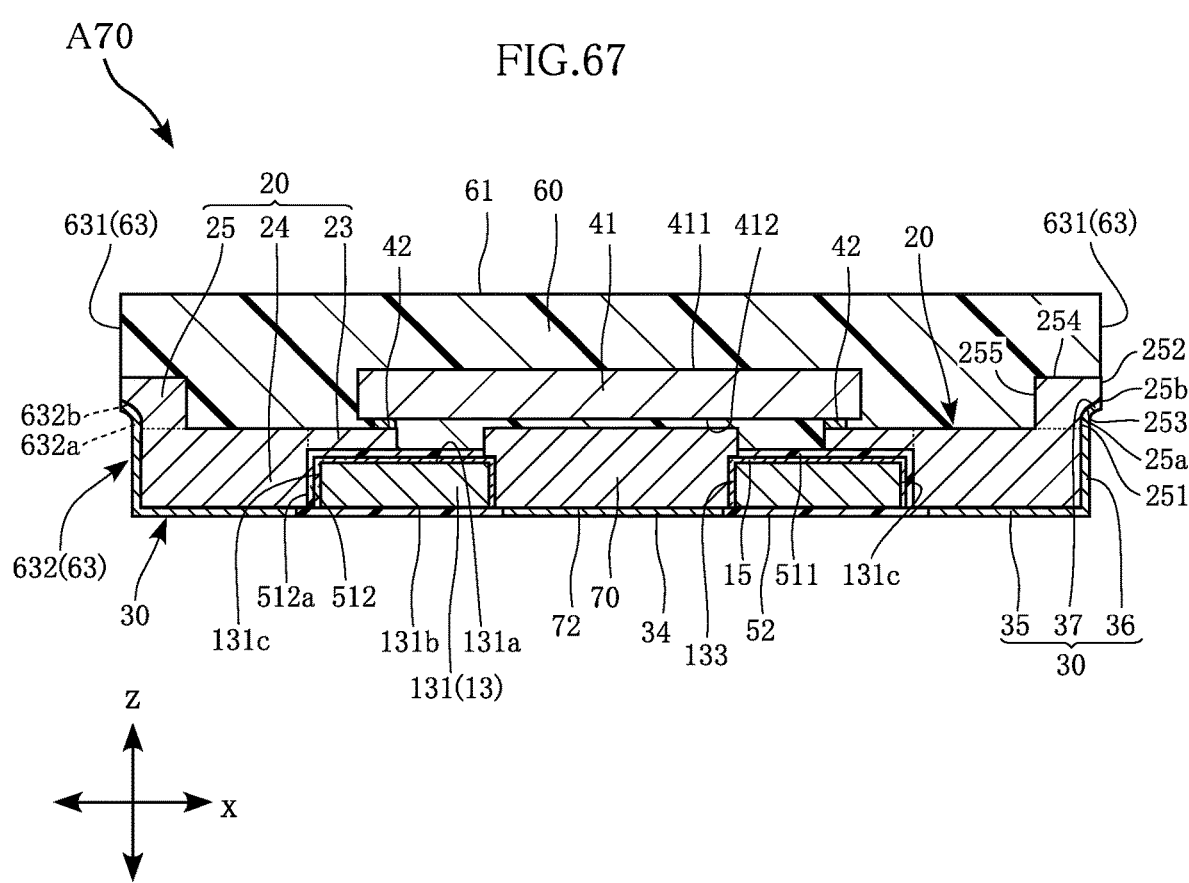
FIG. 67 is a sectional view of a semiconductor device according to a seventh embodiment.

FIG. 67 shows a semiconductor device according to a seventh embodiment. FIG. 67 is a sectional view of the semiconductor device A70 of the seventh embodiment and the section shown in this figure corresponds to the section shown in FIG. 66. The semiconductor device A70 differs from the semiconductor device A60 in that it includes a heat dissipating layer 70. The heat dissipating layer 70 of the semiconductor device A70 is similar to the heat dissipating layer 70 of the semiconductor device A20. In the example shown in FIG. 67, the third surface 253 of each third conductive portion 25 (first electrode 20) is curved, and the second surface 632b of each recessed portion 632 is curved. However, such curved surfaces may alternatively be flat surfaces as in the semiconductor device A50.

The substrate 13 of the semiconductor device A70 has a through hole 133 in the supporting portion 131, extending in the thickness direction z from the front surface 131a to the back surface 131b. In one example, the through hole 133 is rectangular in plan view. The through hole 133 is filled with the heat dissipating layer 70. The insulating layer 15 is formed on the surface of the through hole 133. That is, the substrate 13 and the heat dissipating layer 70 is separated by the insulating layer 15. An internal resin layer 51 may be additionally provided between the substrate 13 and the heat dissipating layer 70.

Since the heat dissipating layer 70 is provided, the semiconductor device A70 includes a heat-dissipating-layer back-surface covering portion 34 as an additional second electrode 30, as in the second embodiment. The heat-dissipating-layer back-surface covering portion 34 is spaced apart from the first covering portion 35, the second covering portion 36 and the third covering portion 37.

In the manufacture of the semiconductor device A70 shown in FIG. 67, the recessed portion forming step forms a recessed portion 802 as in the second embodiment.

The semiconductor device A70 can achieve similar advantages to those achieved by the semiconductor device A50. In addition, the semiconductor device A70 having the heat dissipating layer 70 can improve the heat dissipation efficiency as in the second embodiment.

According to the first to seventh embodiments, the semiconductor devices A10, A20, A30, A40, A50, A60 and A70 are configured as QFN package devices. However, the semiconductor devices of the present disclosure are not limited to such, and they may be SON package devices. For example, the semiconductor device A10 may be fabricated without the substrates 12b, so that the semiconductor device is provided in a SON package.

The semiconductor devices and their manufacturing methods according to the present disclosure are not limited to the embodiments described above. Various design changes can be made to the specific configuration of any component of a semiconductor device according to the present disclosure and to the specific manner of performing any step of a method for manufacturing a semiconductor device according to the present disclosure.

The semiconductor devices and their manufacturing methods of the present disclosure include implementations according to the following clauses.

[Clause 1]
A semiconductor device comprising:
a semiconductor element;
a first substrate having a first front surface and a first back surface facing away from each other in a thickness direction, the semiconductor element being disposed on the first front surface;
a first electrode that includes a first conductive portion and a second conductive portion, the first conductive portion being formed on a portion of the first front surface, the second conductive portion being connected to the first conductive portion and overlapping with the first substrate as viewed in a first direction that is perpendicular to the thickness direction;
a sealing resin covering the semiconductor element; and
a second electrode exposed from the sealing resin and electrically connected to the first electrode, wherein
the second electrode is in contact with the second conductive portion.

[Clause 2]
The semiconductor device according to Clause 1, further comprising a second substrate spaced apart from the first substrate and overlapping with the first substrate as viewed in the first direction, wherein
the second conductive portion is located between the first substrate and the second substrate, and
the second electrode is in contact with the second substrate.

[Clause 3]
The semiconductor device according to Clause 2, wherein
the second substrate has a second front surface and a second back surface, the second front surface facing in the same direction as the first front surface faces, and the second back surface facing in the same direction as the first back surface faces, and
the second electrode includes a second-back-surface covering portion that covers the second back surface.

[Clause 4]
The semiconductor device according to Clause 3, wherein
the second conductive portion has a second-conductive-portion back surface that is flush with the second back surface, and
the second electrode includes a first-electrode covering portion connected to the second-back-surface covering portion and covering the second-conductive-portion back surface.

[Clause 5]
The semiconductor device according to Clause 4, wherein
the second substrate has an exposed side surface located between the second front surface and the second back surface in the thickness direction, the exposed side surface being exposed from the sealing resin, and
the second electrode includes an exposed-side-surface covering portion connected to the second-back-surface covering portion and covering the exposed side surface.

[Clause 6]
The semiconductor device according to Clause 5, wherein the exposed-side-surface covering portion overlaps with the sealing resin as viewed in the thickness direction.

[Clause 7]
The semiconductor device according to any one of Clauses 2 to 6, wherein the first substrate and the second substrate are made of a same material.

[Clause 8]
The semiconductor device according to Clause 7, wherein the material is silicon.

[Clause 9]
The semiconductor device according to any one of Clauses 2 to 8, further comprising:
a third substrate spaced apart from the first substrate and the second substrate as viewed in the thickness direction;
a third electrode exposed from the sealing resin and being in contact with the third substrate; and a fourth electrode electrically connected to the third electrode and the semiconductor element, a portion of the fourth electrode being located between the first substrate and the third substrate.

[Clause 10]

The semiconductor device according to Clause 9, wherein the third substrate overlaps with the first substrate as viewed in the first direction and overlaps with the second substrate as viewed in a second direction that is perpendicular to each of the first direction and the thickness direction, and a portion of the sealing resin is located between the second substrate and the third substrate.

[Clause 11]

The semiconductor device according to Clause 10, wherein the third substrate overlaps with the first substrate and the second substrate as viewed in the first direction, and the second substrate and the third substrate are located opposite to each other as viewed in the thickness direction with the first substrate intervening therebetween.

[Clause 12]

The semiconductor device according to Clause 1, wherein the first electrode further includes a third conductive portion connected to the second conductive portion and protruding from the second conductive portion in a direction in which the first front surface faces, and the second electrode is in contact with the third conductive portion.

[Clause 13]

The semiconductor device according to Clause 12, wherein the second conductive portion has a second-conductive-portion back surface that is flush with the first back surface, and the second electrode includes a first covering portion that covers the second-conductive-portion back surface.

[Clause 14]

The semiconductor device according to Clause 13, wherein the second conductive portion has a first side surface and a second side surface, the first side surface being connected to the second-conductive-portion back surface and facing the first substrate, the second side surface being connected to the second-conductive-portion back surface and facing away from the first side surface in the first direction, and the second electrode includes a second covering portion connected to the first covering portion and covering the second side surface.

[Clause 15]

The semiconductor device according to Clause 14, wherein the third conductive portion has a first surface that is flush with the second side surface, and the second covering portion covers the first surface.

[Clause 16]

The semiconductor device according to Clause 15, wherein the third conductive portion has a second surface and a third surface, the second surface facing the same side as the first surface faces in the first direction and being located outside of the first surface as viewed in the thickness direction, the third surface being connected to the first surface and the second surface, and the second electrode includes a third covering portion connected to the second covering portion and covering the third surface.

[Clause 17]

The semiconductor device according to Clause 16, wherein the sealing resin has a resin side surface facing the same side as the first surface faces in the first direction, and the resin side surface has a flat portion that is flush with the second surface.

[Clause 18]

The semiconductor device according to Clause 16 or 17, wherein the third conductive portion has a first boundary edge between the first surface and the third surface, and a second boundary edge between the second surface and the third surface, the third surface is a curved surface, and the second boundary edge is located further than the first boundary edge in the thickness direction in which the first front surface faces.

[Clause 19]

The semiconductor device according to any one of Clauses 1 to 18, wherein the second electrode comprises a Ni layer, a Pd layer and a Au layer laminated on each other.

[Clause 20]

The semiconductor device according to any one of Clauses 1 to 19, wherein the first electrode is composed of a metal containing Cu.

[Clause 21]

The semiconductor device according to any one of Clauses 1 to 20, further comprising a bonding layer that bonds to and electrically connects to the first conductive portion and the semiconductor element.

[Clause 22]

The semiconductor device according to any one of Clauses 1 to 21, further comprising an external resin layer that is made of an insulating material and covers at least the first back surface.

[Clause 23]

The semiconductor device according to Clause 22, wherein the external resin layer is made of epoxy or polyimide.

[Clause 24]

The semiconductor device according to any one of Clauses 1 to 23, further comprising an internal resin layer that insulates the first substrate and the first electrode.

[Clause 25]

The semiconductor device according to Clause 24, wherein the internal resin layer is made of polyimide.

[Clause 26]

The semiconductor device according to any one of Clauses 1 to 25, further comprising a heat dissipating layer that overlaps with the semiconductor element as viewed in the thickness direction.

[Clause 27]

The semiconductor device according to Clause 26, wherein the first substrate has a through hole extending in the thickness direction from the first front surface to the first back surface, and the heat dissipating layer fills the through hole.

[Clause 28]

The semiconductor device according to Clause 27, wherein the heat dissipating layer has a heat-dissipating-layer back surface that is flush with the first back surface, and the second electrode includes a heat-dissipating-layer back-surface covering portion that covers the heat-dissipating-layer back surface.

[Clause 29]

A method for manufacturing a semiconductor device, the method comprising:

a base preparing step of preparing a base having a front surface and a back surface facing away from each other in a thickness direction;

a recessed portion forming step of forming in the base a recessed portion that is recessed from the front surface toward the back surface;

a first electrode forming step of forming a first electrode provided with a first conductive portion that covers a portion of the front surface and a second conductive portion contained in the recessed portion;

a semiconductor element mounting step of mounting a semiconductor element that electrically connects to the first electrode;

a sealing resin forming step of forming a sealing resin to cover the semiconductor element;

a grinding step of grinding the base from the back surface toward the front surface in the thickness direction to expose the second conductive portion; and a second electrode forming step of forming a second electrode in contact with the exposed second conductive portion.

[Clause 30]

The method according to Clause 29, wherein the grinding step divides the base into a first substrate on which the semiconductor element is mounted and a second substrate that is spaced apart from the first substrate, and the second electrode forming step forms the second electrode also in contact with the second substrate.

[Clause 31]

The method according to Clause 29, wherein the first electrode forming step also forms a third conductive portion that protrudes from the second conductive portion in the thickness direction, and the second electrode is also in contact with the third conductive portion.

The invention claimed is:

1. A semiconductor device comprising:
a semiconductor element;
a first substrate having a first front surface and a first back surface that are spaced apart from each other in a thickness direction, the semiconductor element being disposed on the first front surface;
a first electrode that includes a first conductive portion and a second conductive portion, the first conductive portion being formed on a portion of the first front surface, the second conductive portion being connected to the first conductive portion and overlapping with the first substrate as viewed in a first direction perpendicular to the thickness direction;
a sealing resin covering the semiconductor element; and
a second electrode exposed from the sealing resin and electrically connected to the first electrode, wherein
the second electrode is in contact with the second conductive portion,
the semiconductor device further comprising a second substrate spaced apart from the first substrate and overlapping with the first substrate as viewed in the first direction, wherein
the second conductive portion is located between the first substrate and the second substrate, and
the second electrode is in contact with the second substrate.

2. The semiconductor device according to claim 1, wherein
the second substrate has a second front surface and a second back surface, the second front surface facing in a same direction as the first front surface faces, and the second back surface facing in a same direction as the first back surface faces, and
the second electrode includes a second-back-surface covering portion that covers the second back surface.

3. The semiconductor device according to claim 2, wherein
the second conductive portion has a second-conductive-portion back surface that is flush with the second back surface, and
the second electrode includes a first-electrode covering portion connected to the second-back-surface covering portion and covering the second-conductive-portion back surface.

4. The semiconductor device according to claim 3, wherein
the second substrate has an exposed side surface located between the second front surface and the second back surface in the thickness direction, the exposed side surface being exposed from the sealing resin, and
the second electrode includes an exposed-side-surface covering portion connected to the second-back-surface covering portion and covering the exposed side surface.

5. The semiconductor device according to claim 4, wherein the exposed-side-surface covering portion overlaps with the sealing resin as viewed in the thickness direction.

6. The semiconductor device according to claim 1, wherein the first substrate and the second substrate are made of a same material.

7. The semiconductor device according to claim 6, wherein the material is silicon.

8. The semiconductor device according to claim 1, further comprising:
a third substrate spaced apart from the first substrate and the second substrate as viewed in the thickness direction;
a third electrode exposed from the sealing resin and being in contact with the third substrate; and
a fourth electrode electrically connected to the third electrode and the semiconductor element, a portion of the fourth electrode being located between the first substrate and the third substrate.

9. The semiconductor device according to claim 8, wherein
the third substrate overlaps with the first substrate as viewed in the first direction and overlaps with the second substrate as viewed in a second direction that is perpendicular to each of the first direction and the thickness direction, and
a portion of the sealing resin is located between the second substrate and the third substrate.

10. The semiconductor device according to claim 9, wherein
the third substrate overlaps with the first substrate and the second substrate as viewed in the first direction, and
the second substrate and the third substrate are located opposite to each other as viewed in the thickness direction with the first substrate intervening therebetween.

11. The semiconductor device according to claim 1, wherein the second electrode comprises a Ni layer, a Pd layer and a Au layer laminated on each other.

12. The semiconductor device according to claim 1, wherein the first electrode is composed of a metal containing Cu.

13. The semiconductor device according to claim 1, further comprising a bonding layer that bonds the first conductive portion and the semiconductor element to each other for electrical connection therebetween.

14. The semiconductor device according to claim 1, further comprising an external resin layer that is made of an insulating material and covers at least the first back surface.

15. The semiconductor device according to claim 14, wherein the external resin layer is made of epoxy or polyimide.

16. The semiconductor device according to claim 1, further comprising an internal resin layer that insulates the first substrate and the first electrode.

17. The semiconductor device according to claim 16, wherein the internal resin layer is made of polyimide.

18. The semiconductor device according to claim 1, further comprising a heat dissipating layer that overlaps with the semiconductor element as viewed in the thickness direction.

19. The semiconductor device according to claim 18, wherein
the first substrate has a through hole extending in the thickness direction from the first front surface to the first back surface, and
the heat dissipating layer fills the through hole.

20. The semiconductor device according to claim 19, wherein
the heat dissipating layer has a heat-dissipating-layer back surface that is flush with the first back surface, and
the second electrode includes a heat-dissipating-layer back-surface covering portion that covers the heat-dissipating-layer back surface.

21. A semiconductor device comprising:
a semiconductor element
a first substrate having a first front surface and a first back surface that are spaced apart from each other in a thickness direction, the semiconductor element being disposed on the first front surface;
a first electrode that includes a first conductive portion and a second conductive portion, the first conductive portion being formed on a portion of the first front surface, the second conductive portion being connected to the first conductive portion and overlapping with the first substrate as viewed in a first direction perpendicular to the thickness direction;
a sealing resin covering the semiconductor element and
a second electrode exposed from the sealing resin and electrically connected to the first electrode, wherein
the second electrode is in contact with the second conductive portion,
the first electrode further includes a third conductive portion connected to the second conductive portion and protruding from the second conductive portion in a direction in which the first front surface faces, and
the second electrode is in contact with the third conductive portion.

22. The semiconductor device according to claim 21, wherein
the second conductive portion has a second-conductive-portion back surface that is flush with the first back surface, and
the second electrode includes a first covering portion that covers the second-conductive-portion back surface.

23. The semiconductor device according to claim 22, wherein
the second conductive portion has a first side surface and a second side surface, the first side surface being connected to the second-conductive-portion back surface and facing the first substrate, the second side surface being connected to the second-conductive-portion back surface and facing away from the first side surface in the first direction, and
the second electrode includes a second covering portion connected to the first covering portion and covering the second side surface.

24. The semiconductor device according to claim 23, wherein
the third conductive portion has a first surface that is flush with the second side surface, and
the second covering portion covers the first surface.

25. The semiconductor device according to claim 24, wherein
the third conductive portion has a second surface and a third surface, the second surface facing a same side as the first surface faces in the first direction and being located outside of the first surface as viewed in the thickness direction, the third surface being connected to the first surface and the second surface, and
the second electrode includes a third covering portion connected to the second covering portion and covering the third surface.

26. The semiconductor device according to claim 25, wherein
the sealing resin has a resin side surface facing a same side as the first surface faces in the first direction, and
the resin side surface has a flat portion that is flush with the second surface.

27. The semiconductor device according to claim 25, wherein
the third conductive portion has a first boundary edge between the first surface and the third surface, and a second boundary edge between the second surface and the third surface,
the third surface is a curved surface, and
the second boundary edge is offset from the first boundary edge in which the first front surface faces in the thickness direction.

* * * * *